(12) United States Patent
Taguchi et al.

(10) Patent No.: US 8,927,195 B2
(45) Date of Patent: Jan. 6, 2015

(54) PHOTOSENSITIVE COMPOSITION, PLANOGRAPHIC PRINTING PLATE PRECURSOR, POLYURETHANE, AND METHOD FOR PRODUCING POLYURETHANE

(71) Applicant: FUJIFILM Corporation, Minato-ku, Tokyo (JP)

(72) Inventors: Yoshinori Taguchi, Shizuoka-ken (JP); Takashi Aridomi, Shizuoka-ken (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/160,579

(22) Filed: Jan. 22, 2014

(65) Prior Publication Data

US 2014/0134540 A1    May 15, 2014

Related U.S. Application Data

(63) Continuation of application No. PCT/JP2012/067741, filed on Jul. 11, 2012.

(30) Foreign Application Priority Data

Jul. 27, 2011 (JP) ................ 2011-164778

(51) Int. Cl.
| | | |
|---|---|---|
| *G03F 7/035* | (2006.01) | |
| *G03F 7/038* | (2006.01) | |
| *C08G 63/12* | (2006.01) | |
| *G03F 7/00* | (2006.01) | |
| *G03F 7/004* | (2006.01) | |
| *G03F 7/032* | (2006.01) | |
| *G03F 7/039* | (2006.01) | |
| *C08G 18/72* | (2006.01) | |
| *C08G 18/80* | (2006.01) | |
| *C08G 18/08* | (2006.01) | |
| *C08G 18/28* | (2006.01) | |
| *C08G 18/46* | (2006.01) | |
| *C08L 75/04* | (2006.01) | |
| *B41C 1/10* | (2006.01) | |
| *C08G 63/685* | (2006.01) | |

(52) U.S. Cl.
CPC ............... *G03F 7/038* (2013.01); *C08G 63/12* (2013.01); *G03F 7/00* (2013.01); *G03F 7/004* (2013.01); *G03F 7/032* (2013.01); *G03F 7/035* (2013.01); *G03F 7/039* (2013.01); *C08G 18/724* (2013.01); *C08G 18/8048* (2013.01); *C08G 18/0823* (2013.01); *C08G 18/282* (2013.01); *C08G 18/4615* (2013.01); *C08L 75/04* (2013.01); *G03F 7/0035* (2013.01); *B41C 1/1008* (2013.01); *C08G 63/6856* (2013.01); *B41C 2210/04* (2013.01); *B41C 2210/06* (2013.01); *B41C 2210/266* (2013.01); *Y10S 430/107* (2013.01)
USPC ........... 430/284.1; 430/285.1; 430/270.1; 430/302; 430/906; 528/67; 528/85; 528/48

(58) Field of Classification Search
None
See application file for complete search history.

(56) References Cited

U.S. PATENT DOCUMENTS

| | | | |
|---|---|---|---|
| 4,853,453 A | | 8/1989 | Schafer et al. |
| 5,112,743 A | * | 5/1992 | Kamiya et al. ............. 430/175 |
| 5,254,432 A | * | 10/1993 | Aoai ........................ 430/192 |
| 6,844,137 B2 | * | 1/2005 | Fujimaki et al. .......... 430/281.1 |
| 2002/0182539 A1 | * | 12/2002 | Fujimaki et al. .......... 430/281.1 |
| 2003/0198888 A1 | * | 10/2003 | Kawauchi et al. ......... 430/270.1 |

FOREIGN PATENT DOCUMENTS

| | | |
|---|---|---|
| JP | S62-11717 | 1/1987 |
| JP | 02-146042 A * | 6/1990 |
| JP | H02-146042 | 6/1990 |
| JP | H10-260530 A | 9/1998 |
| JP | H11-352691 A | 12/1999 |
| JP | 2003-177533 A | 6/2003 |
| JP | 2005-250158 A | 9/2005 |
| JP | 2007-187836 A | 7/2007 |
| JP | 2009-086321 A | 4/2009 |

OTHER PUBLICATIONS

International Search Report issued in International Application No. PCT/JP2012/067741 on Oct. 2, 2012.
Written Opinion of the ISA issued in International Application No. PCT/JP2012/067741 on Oct. 2, 2012.

(Continued)

*Primary Examiner* — Cynthia Hamilton
(74) *Attorney, Agent, or Firm* — SOLARIS Intellectual Property Group, PLLC

(57) ABSTRACT

A photosensitive composition includes (A) a polyurethane obtained by reacting a diol component including a compound represented by the following Formula (I) with a polyisocyanate component; and (B) a photosensitive component. In Formula (I), A represents a single bond, or a divalent linking group including an atom selected from the group consisting of a carbon atom, a hydrogen atom, and an oxygen atoms; B represents a monovalent organic group; each of $R^1$ to $R^5$ independently represents a hydrogen atom or an alkyl group; m represents an integer from 0 to 3; n represents an integer from 0 to 3; and m+n is not zero.

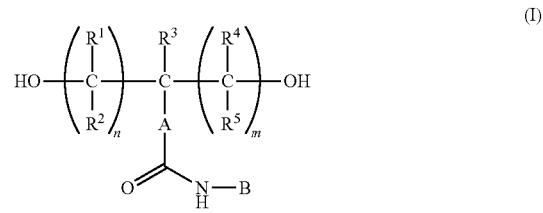

(I)

5 Claims, 1 Drawing Sheet

(56) References Cited

OTHER PUBLICATIONS

English language translation of the following: Office action dated Oct. 14, 2014 from the JPO in a Japanese patent application corresponding to the instant patent application. This office action translation is submitted now in order to supplement the understanding of the cited references which are being disclosed in the instant Information Disclosure Statement.

* cited by examiner

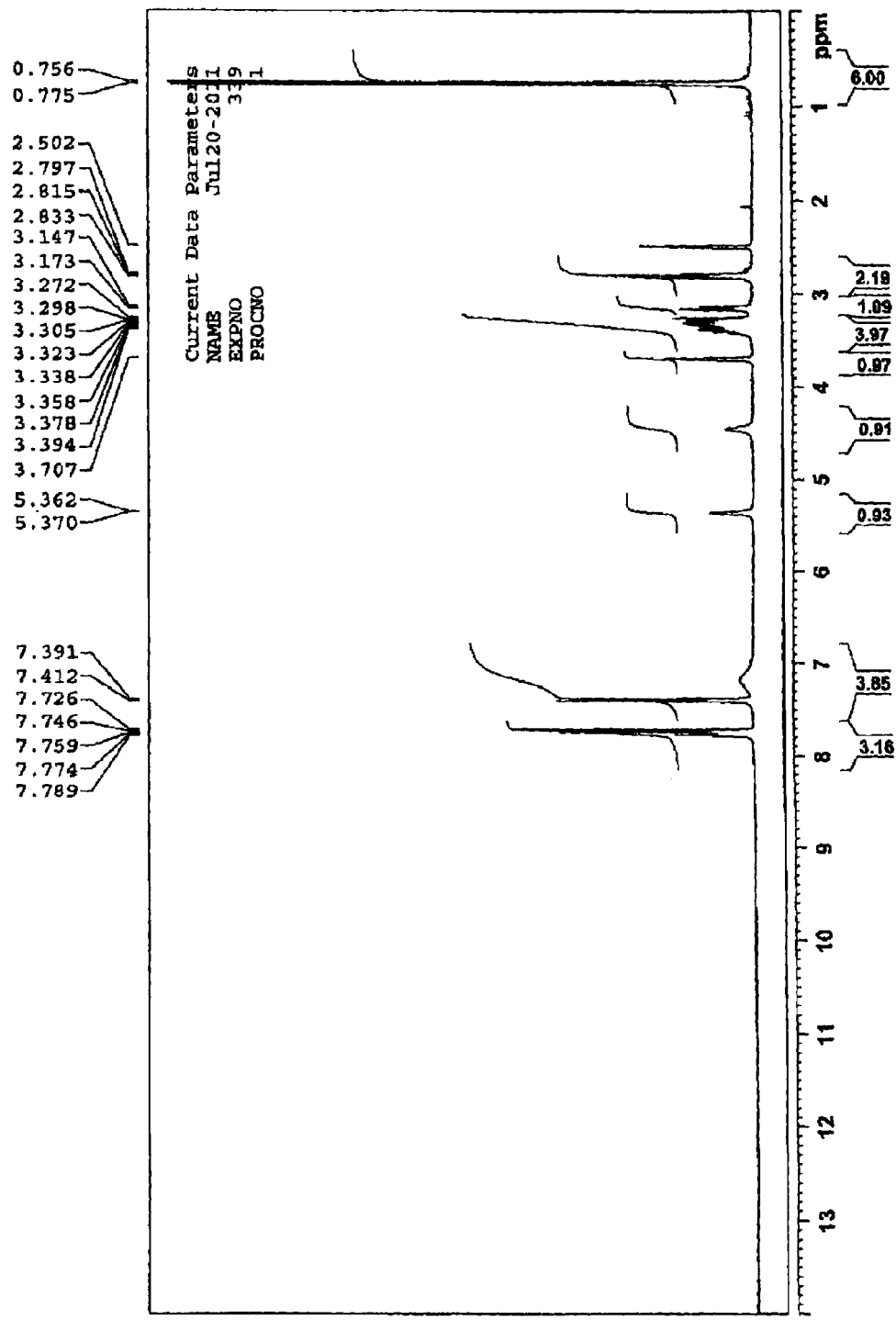

PHOTOSENSITIVE COMPOSITION, PLANOGRAPHIC PRINTING PLATE PRECURSOR, POLYURETHANE, AND METHOD FOR PRODUCING POLYURETHANE

CROSS-REFERENCE TO RELATED APPLICATIONS

This application is a continuation application of International Application No. PCT/JP2012/067741, filed Jul. 11, 2012, the disclosure of which is incorporated herein by reference in its entirety. Further, this application claims priority from Japanese Patent Application No. 2011-164778, filed Jul. 27, 2011, the disclosure of which is incorporated herein by reference in its entirety.

TECHNICAL FIELD

The present invention relates to a photosensitive composition suitable as a recording layer of a planographic printing plate precursor, a planographic printing plate precursor having a recording layer containing the photosensitive composition, a novel polyurethane, and a method for producing a polyurethane.

BACKGROUND ART

Photosensitive compositions containing, as a binder polymer, various functionalized polyurethanes or functionalized polyesters as binder polymers are conventionally used as visible image forming materials or planographic printing plate materials. In the art related to the image forming materials, positive type photosensitive compositions formed by using functionalized polyurethanes or polyesters (see, for example, Japanese Patent Application Laid-Open (JP-A) No. 2003-177533), and negative type photosensitive resin compositions (see, for example, JP-A No. H11-352691) have been suggested, and it has been disclosed that both high durability and high developability are achieved by using these photosensitive compositions in the formation of recording layers of planographic printing plate precursors.

In regard to visible image forming materials or planographic printing plate materials, chemical resistance and solvent resistance of recording layers are also desired properties, in addition to high durability and high developability.

However, a number of polyurethanes or polyesters are compounds having high solvent solubility that is attributable to the respective molecular structures, and there is room for an improvement in solvent resistance. A means for introducing a functional group having strong cohesive force into a polymer compound for the purpose of enhancing solvent resistance and the like can be contemplated. However, since there is a case in which developability is deteriorated as a result of an increase in cohesive force, it is a current situation that there is a demand for a binder polymer which is useful for a photosensitive composition and which forms a recording layer having improved durability or solvent resistance without deteriorating developability.

Attempts have been made to introduce various functional groups in order to impart functionality to polymer compounds such as polyurethanes and polyesters (see, for example, JP-A Nos. H10-260530, 2005-250258, and 2009-86321).

SUMMARY OF INVENTION

Technical Problems

In order to introduce a functional group to a polyurethane or a polyester, a diol compound having a functional group is needed. A specific diol compound that is needed for the synthesis of a functional polymer is usually synthesized from a polyol compound. However, when the reactivity or the like of the functional group is considered, the synthesis route for the diol compound having a functional group is complicated, and there is a demand for a synthesis route for obtaining a polyurethane or polyester that has been functionalized by a simple method.

One object of the invention is to provide a negative type or positive type photosensitive composition that is excellent in all of durability and solvent resistance of a cured film formed, and developability of an uncured part; and a planographic printing plate precursor which has a recording layer containing the photosensitive composition and which is excellent in print durability and solvent resistance of an image part and developability of a non-image part.

Another object of the invention is to provide a novel polyurethane having a functional group which is suitable for the photosensitive composition described above and is capable of forming a cured film having excellent durability and solvent resistance, and a simple method for producing the novel polyurethane having a functional group.

Solution to Problems

The inventors of the invention conducted an investigation, and as a result, the inventors have found that the problems described above can be solved by using a specific diol compound, thus completing the invention.

That is, the constitution of the invention is as follows.

<1> A photosensitive composition comprising at least one polymer compound selected from the group consisting of a polyurethane obtained by reacting a diol component including a compound represented by the following Formula (I) with a polyisocyanate component and a polyester obtained by reacting a diol component including a compound represented by the following Formula (I) with a polycarboxylic acid component:

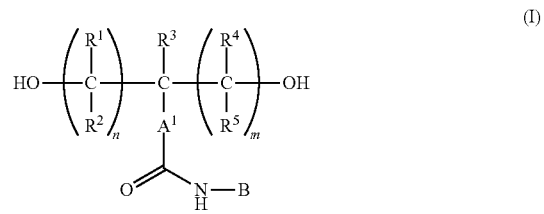

(I)

wherein, in Formula (I), $A^1$ represents a single bond, or a divalent linking group including an atom selected from the group consisting of a carbon atom, a hydrogen atom and an oxygen atom; B represents a monovalent organic group; each of $R^1$, $R^2$, $R^3$, $R^4$ and $R^5$ independently represents a hydrogen atom or an alkyl group; m represents an integer from 0 to 3; n represents an integer from 0 to 3; m+n is not 0; and when at least one of m or n represents an integer of 2 or greater, $R^1$'s, $R^2$'s, $R^3$'s and $R^4$'s that exist in plural numbers may be the same as or different from each other, and wherein an alkali solubility of the photosensitive composition is increased or decreased when exposed with light.

<2> The photosensitive composition according to <1>, wherein the compound represented by Formula (I) is a compound represented by the following Formula (II):

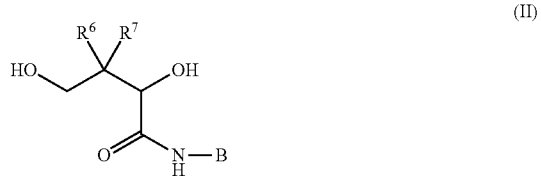

(II)

wherein, in Formula (II), B represents a monovalent organic group; and each of $R^6$ and $R^7$ independently represents a hydrogen atom or an alkyl group.

<3> The photosensitive composition according to <1> or <2>, wherein B in Formula (I) and Formula (II) is a monovalent organic group including at least one functional group selected from the group consisting of a halogen atom, an amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group and a phosphonate group.

<4> The photosensitive composition according to any one of <1> to <3>, further comprising at least one compound selected from the group consisting of a polymerizable compound and a crosslinkable compound, and at least one compound selected from the group consisting of a polymerization initiator and an acid generator, the photosensitive composition being a negative type photosensitive composition.

<5> The photosensitive composition according to any one of <1> to <3>, further comprising an alkali-soluble resin, and a compound which forms an interaction with the alkali-soluble resin so as to enable suppression of alkali solubility of the alkali-soluble resin, the photosensitive composition being a positive type photosensitive composition.

<6> A planographic printing plate precursor comprising a recording layer including the photosensitive composition according to any one of <1> to <5>, on a support.

<7> A method for producing a polyurethane, the method comprising:
a process of obtaining (a) a diol compound by reacting at least one compound represented by the following Formula (1) with a compound represented by the following Formula (2); and
a process of reacting the obtained (a) diol compound with at least one (c) isocyanate component:

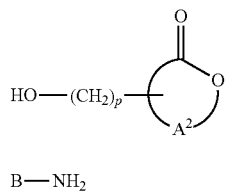

(1)

B—NH$_2$ (2)

wherein, in Formula (1), $A^2$ represents an atomic group that forms a 4-membered to 7-membered cyclic structure together with an oxygen atom and adjacent carbon atoms; and p represents an integer of 0 or 1; and wherein, in Formula (2), B represents a monovalent organic group.

<8> The method for producing a polyurethane according to <7>, wherein B in Formula (2) is a monovalent organic group including at least one functional group selected from the group consisting of a halogen atom, an amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group and a phosphonate group.

<9> The method for producing a polyurethane according to <7> or <8>, wherein the compound represented by Formula (1) is a compound represented by the following Formula (3):

(3)

wherein, in Formula (3), each of $R^{31}$ and $R^{32}$ independently represents a hydrogen atom or a monovalent organic group; q represents an integer from 1 to 4; and when q is 2 or greater, $R^{31}$'s and $R^{32}$'s that exist in plural numbers may be the same as or different from each other.

<10> A polyurethane comprising a partial structure represented by the following Formula (I-1):

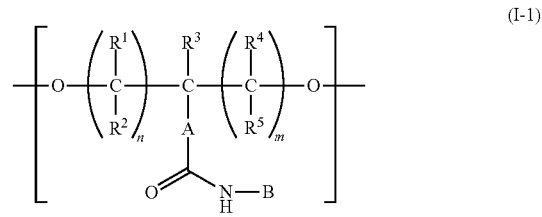

(I-1)

wherein, in Formula (I-1), $A^1$ represents a single bond, or a divalent linking group including an atom selected from the group consisting of a carbon atom, a hydrogen atom and an oxygen atom; B represents a monovalent organic group; each of $R^1$, $R^2$, $R^3$, $R^4$ and $R^5$ independently represents a hydrogen atom or an alkyl group; m represents an integer from 0 to 3; n represents an integer from 0 to 3; m+n is not 0; and when m and n represent an integer of 2 or greater, $R^1$'s, $R^2$'s, $R^3$'s and $R^4$'s that exist in plural numbers may be the same as or different from each other.

<11> The polyurethane according to claim 10, wherein the partial structure represented by Formula (I-1) is a partial structure represented by the following Formula (I-2):

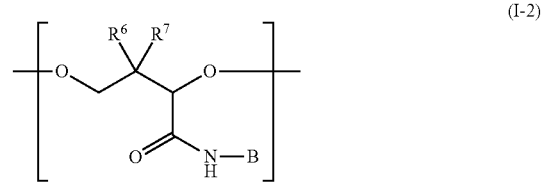

(I-2)

wherein, in Formula (I-2), B represents a monovalent organic group; and each of $R^6$ and $R^7$ independently represents a hydrogen atom or an alkyl group.

Advantageous Effects of Invention

According to the invention, there are provided a negative type or positive type photosensitive composition that is excellent in all of durability and solvent resistance of a cured film formed and developability of an uncured part, and a planographic printing plate precursor which includes a recording layer containing the photosensitive composition and which has excellent print durability and solvent resistance of an image part and excellent developability of a non-image part.

Furthermore, according to the invention, there are provided a novel polymer compound having a functional group, which is suitable for the photosensitive composition, and is capable of forming a cured film having excellent durability and solvent resistance, and a simple method for producing the novel polymer compound having a functional group.

BRIEF DESCRIPTION OF DRAWINGS

FIG. 1 is an NMR chart of (a) a specific diol compound [(a)-28] that is used in the production method of the invention.

DESCRIPTION OF EMBODIMENTS

Hereinafter, the photosensitive composition, planographic printing plate precursor, polyurethane, and method for producing polyurethane according to the invention are described in detail.

In the present specification, regarding the expression of substituents (atomic groups), unless particularly stated otherwise, an expression that does not describe that it is substituted or unsubstituted is used to mean that an unsubstituted substituent as well as a substituent further having a substituent are included. For example, when it is described as an "alkyl group", the term is used to mean that an unsubstituted alkyl group and an alkyl group further having a substituent are included. The same also applies to other substituents (atomic groups).

A numerical value range expressed using "-" or "to" in the present specification means a range including the numerical values described before and after "-" or "to" as the lower limit and the upper limit, respectively.

In the present specification, the total solid content refers to the total mass of components excluding solvents from the overall composition of a colored curable composition.

Furthermore, in the present specification, "(meth)acrylate" represents both or either of acrylate and methacrylate, "(meth)acryl" represents both or either of acryl and methacryl, and "(meth)acryloyl" means both or either of acryloyl and methacryloyl.

In the present specification, the "tanryotai" in Japanese and "monomer" have the same meaning. The monomer in the present specification is distinguished from an oligomer and a polymer, and refers to a compound having a weight average molecular weight of 2,000 or less. In the present specification, a polymerizable compound refers to a compound having a polymerizable functional group, and may be a monomer or may be a polymer. The polymerizable functional group means a group which participates in a polymerization reaction.

The term "process" in the present specification means not only including an independently process, but also including a case in which a process cannot be clearly distinguished from other processes, as long as an intended effect of the process is achieved.

<Photosensitive Composition>

The photosensitive composition according to the invention contains (A) at least one polymer compound selected from the group consisting of a polyurethane obtained by reacting a diol component including a compound represented by Formula (I) with a polyisocyanate component and a polyester obtained by reacting a diol component including a compound represented by Formula (I) with a polycarboxylic acid component, and a component capable of exhibiting photosensitivity that are described below.

First, the (A) polyurethane obtained by reacting a diol component including a compound represented by Formula (I) with a polyisocyanate component (hereinafter, appropriately referred to as a "specific polyurethane"), which is an important component of the photosensitive composition according to the invention, is described.

[(A) Polyurethane Obtained by Reacting Diol Component Including Compound Represented by Formula (I) with Polyisocyanate Component]

The (A) specific polyurethane used in the invention is obtained by reacting a diol component including a compound represented by the following Formula (I) with a polyisocyanate component:

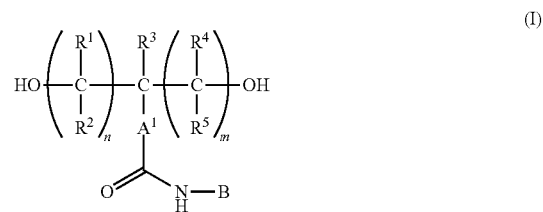

In Formula (I), $A^1$ represents a single bond, or a divalent linking group configured to include at least one selected from the group consisting of a carbon atom, a hydrogen atom and an oxygen atom.

B represents a monovalent organic group, and it is preferably that the organic group is an organic group having at least one functional group, or the organic group itself is a functional group. Furthermore, the organic group may further have a substituent other than the functional group.

Each of $R^1$, $R^2$, $R^3$, $R^4$ and $R^5$ independently represents a hydrogen atom or an alkyl group. The alkyl group is preferably an alkyl group having 1 to 4 carbon atoms.

m represents an integer from 0 to 3, and n represents an integer from 0 to 3, and m+n is not zero. It is preferable that m is 2, and n is 0. When m and n each represent 2 or 3, $R^1$'s, $R^2$'s, $R^3$'s and $R^4$'s that exist in plural numbers may be the same as or different from each other.

There are no particular limitations on the method for producing a diol compound represented by Formula (I), and it is preferable to obtain the diol compound by reacting at least one compound represented by Formula (1) with a compound represented by Formula (2).

The specific polyurethane according to the invention is obtained by using the diol compound obtained in this manner as a starting raw material.

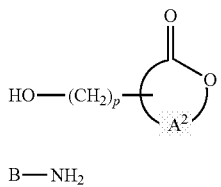
(1)

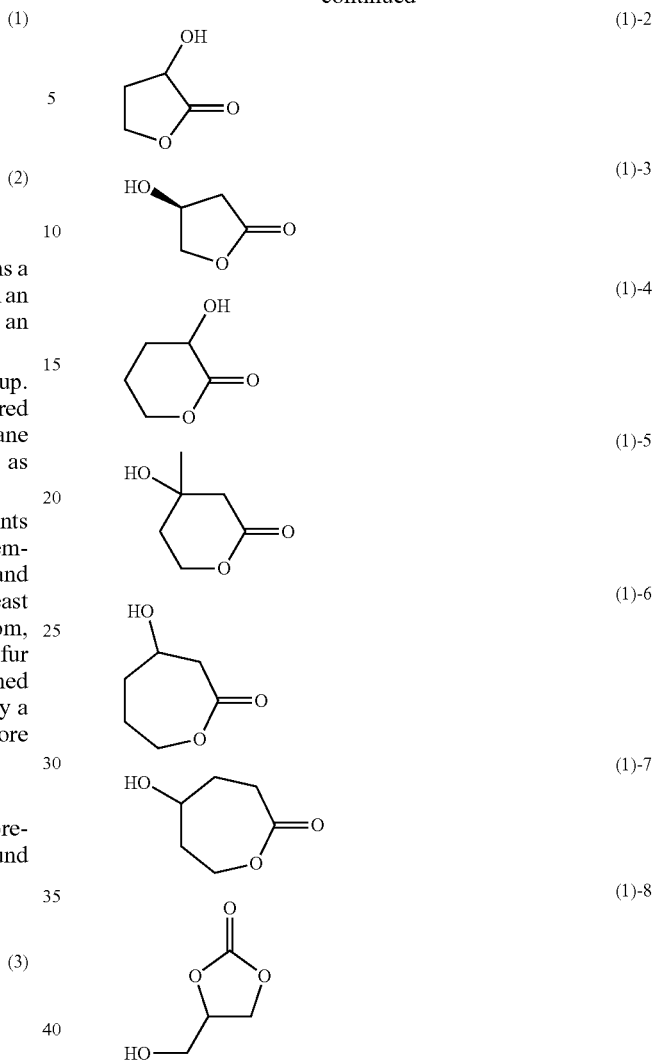

B—NH$_2$  (2)

In Formula (1), A$^2$ represents an atomic group that forms a 4-membered to 7-membered cyclic structure together with an oxygen atom and adjacent carbon atoms. p represents an integer of 0 or 1.

In Formula (2), B represents a monovalent organic group. Here, it is one of the features of the invention that desired functionality is easily imparted to the specific polyurethane by using an organic group containing a functional group as the monovalent organic group represented by B.

In the compound represented by Formula (1), A$^2$ represents an atomic group needed to form a 4-membered to 7-membered cyclic structure together with an oxygen atom and adjacent carbon atoms, and is configured to contain at least one atom selected from the group consisting of a carbon atom, an oxygen atom, a hydrogen atom, a nitrogen atom, a sulfur atom, and a phosphorus atom. The cyclic structure contained in the compound represented by Formula (1) is preferably a 4-membered to 6-membered cyclic structure, and is more preferably a 5-membered cyclic structure.

p represents an integer of 0 or 1.

A further preferred embodiment of the compound represented by Formula (1) may be, for example, a compound represented by the following Formula (3):

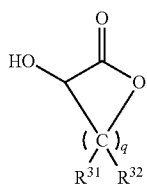
(3)

In Formula (3), each of R$^{31}$ and R$^{32}$ independently represents a hydrogen atom or a monovalent organic group, and is preferably a hydrogen atom or an alkyl group having 1 to 3 carbon atoms.

q represents an integer from 1 to 4, and q is preferably 1 to 3, and is most preferably 2, that is, a compound having a 5-membered ring is the most preferable. Furthermore, when q represents an integer of 2 or greater, R$^{31}$'s and R$^{32}$'s may be the same as or different from each other.

Suitable specific examples of compounds represented by Formula (1) and Formula (3) [Exemplary Compound (1)-1 to Exemplary Compound (1)-8] are shown below.

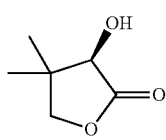
(1)-1

Among the exemplary compounds described above, from the viewpoints of raw material availability and reactivity, Exemplary Compound (1)-1 and Exemplary Compound (1)-2 are particularly preferred, and Exemplary Compound (1)-1 may be the most preferred embodiment.

In the compound represented by Formula (2), B represents a monovalent organic group, and B may be a functional group, or may be an organic group further having a functional group and a substituent. When the organic group represented by B is a functional group or contains a functional group, various kinds of functionality which the functional group has are easily imparted to the specific polyurethane.

The functional group or the substituent that can be introduced (hereinafter, the functional group with functionality and the substituent that can be introduced may be simply referred to as "substituents") may be, for example, at least one functional group selected from the group consisting of a halogen atom, an amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group, and a phosphonate group. Preferred examples thereof include a halogen atom, an amino group, a substituted carbonyl group, a hydroxyl group, a substituted oxy group, a thiol group, a silyl group, a cyano group, an alkenyl group, an aryl group, a heterocyclic group, a sulfo group, a substituted sulfonyl group, a sulfonate group, a substituted sulfinyl group, a phosphono group, and a phosphonate group. The functional group may further have a substituent, if the substituent can be introduced.

These substituents may be monovalent organic groups represented by B, or may be introduced into the monovalent organic group such as an alkyl group of an alkoxy group.

Examples of the alkyl group as the monovalent organic group or a substituent that is introduced into a monovalent organic group include a linear, branched or cyclic alkyl group each having 1 to 20 carbon atoms. Among these, a linear alkyl group having 1 to 12 carbon atoms, a branched alkyl group having 3 to 12 carbon atoms, and a cyclic alkyl group having 5 to 10 carbon atoms are more preferred. Specific examples thereof include a methyl group, an ethyl group, a propyl group, a butyl group, an isopropyl group, an isobutyl group, a t-butyl group, and a cyclohexyl group.

When the alkyl group has a substituent (that is, when the alkyl group is a substituted alkyl group), the alkyl moiety of the substituted alkyl group may be a divalent organic residue obtained by removing any one of the hydrogen atoms in the alkyl group having 1 to 20 carbon atoms mentioned above, and the preferred range of the number of carbon atoms is also the same as that of the alkyl groups described above.

Examples of the alkenyl group include an alkenyl group having 2 to 20 carbon atoms. Among these, an alkenyl group having 2 to 10 carbon atoms is preferred, and an alkenyl group having 2 to 8 carbon atoms is more preferred. The alkenyl group may further have a substituent. Specific examples of the alkenyl group include a vinyl group, a 1-propenyl group, a 1-butenyl group, a cinnamyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, and a 2-chloro-1-ethenyl group.

Examples of the alkynyl group include an alkynyl group having 2 to 20 carbon atoms. Among these, an alkynyl group having 2 to 10 carbon atoms is preferred, and an alkynyl group having 2 to 8 carbon atoms is more preferred. Specific examples thereof include an ethynyl group, a phenylethynyl group, and a trimethylsilylethynyl group.

Examples of the aryl group include a benzene ring, a condensed-ring formed from two to three benzene rings, and a condensed-ring formed from a benzene ring and a 5-membered unsaturated ring. Specific examples include a phenyl group, a naphthyl group, an anthryl group, and a fluorenyl group, and among these, a phenyl group and a naphthyl group are more preferred.

The heterocyclic group is preferably a heterocyclic group having a 3-membered ring to a 8-membered ring; more preferably a heterocyclic group having a 3-membered to 6-membered ring containing a nitrogen atom, an oxygen atom or a sulfur atom; and even more preferably a heterocyclic group having a 5-membered or 6-membered ring containing a nitrogen atom, an oxygen atom or a sulfur atom. Specific examples thereof include a pyrrole ring group, a furan ring group, a thiophene ring group, a benzopyrrole ring group, a benzofuran ring group, a benzothiophene ring group, a pyrazole ring group, an isoxazole ring group, an isothiazole ring group, an indazole ring group, a benzisoxazole ring group, a benzisothiazole ring group, an imidazole ring group, an oxazole ring group, a thiazole ring group, a benzimidazole ring group, a benzoxazole ring group, a benzothiazole ring group, a pyridine ring group, a quinoline ring group, an isoquinoline ring group, a pyridazine ring group, a pyrimidine ring group, a pyrazine ring group, a phthalazine ring group, a quinazoline ring group, a quinoxaline ring group, an aziridine ring group, a phenanthridine ring group, a carbazole ring group, a purine ring group, a pyran ring group, a piperidine ring group, a piperazine ring group, a morpholine ring group, an indole ring group, an indolizine ring group, a chromene ring group, a cinnoline ring group, an acridine ring group, a phenothiazine ring group, a tetrazole ring group, and a triazine ring group.

The silyl group may have a substituent, and the silyl group is preferably a silyl group having 0 to 30 carbon atoms, more preferably a silyl group having 3 to 20 carbon atoms, and even more preferably a silyl group having 3 to 10 carbon atoms. Specific examples thereof include a trimethylsilyl group and a triethylsilyl group.

The thiol group is preferably a thiol group having 0 to 30 carbon atoms, more preferably a thiol group having 3 to 20 carbon atoms, and even more preferably a thiol group having 1 to 10 carbon atoms. Specific examples thereof include a mercaptomethyl group, a mercaptoethyl group, a 4-mercaptocyclohexyl group, and a 4-mercaptophenyl group.

The thioether group may have a substituent, and the thioether group is preferably a thioether group having 0 to 30 carbon atoms, more preferably a thioether group having 3 to 20 carbon atoms, and even more preferably a thioether group having 1 to 10 carbon atoms.

Specific examples thereof include an alkylthio group such as a methylthio group, an ethylthio group or a cyclohexylthio group; and an arylthio group such as a phenylthio group.

Examples of the halogen atom include a fluorine atom, a bromine atom, a chlorine atom, and an iodine atom, and among these, a chlorine atom and a bromine atom are preferred. The halogen atom may be introduced in the form of a haloalkyl group in which a portion of carbon atoms of an alkyl group or an alkoxy group is substituted with a halogen atom, for example, a fluoroalkyl group.

Regarding the substituted oxy group ($R^{06}O$—), a group in which $R^{06}$ is formed from a monovalent non-metal atomic group except for a hydrogen atom can be used. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonooxy group, and a phosphonatooxy group. Examples of the alkyl group and aryl group therein include such as those described as the alkyl group, substituted alkyl group, aryl group, and substituted aryl group described above. Furthermore, examples of the acyl group ($R^{07}CO$—) in the acyloxy group include an acyl group in which $R^{07}$ represents the alkyl group, substituted alkyl group, aryl group and substituted aryl group described above as examples. Among these substituents, an alkoxy group, an aryloxy group, an acyloxy group, and an arylsulfoxy group are more preferred. Specific examples of the preferred substituted oxy group include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group, and a phosphonatooxy group.

The amino group may be a substituted amino group, and for example, when two substituents in the amino group are both —C(O)CH$_3$, the substituted amino group may also take a form of an amide group. Regarding substituted amino groups (R$^{O8}$NH— and (R$^{O9}$)(R$^{O10}$)N—) including an amide group, an amino group in which each of R$^{O8}$, R$^{O9}$ and R$^{O10}$ is formed from a monovalent non-metal atomic group except for a hydrogen atom can be used. Furthermore, R$^{O9}$ and R$^{O10}$ may be bonded to form a ring. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N'-alkyl-N'-arylureido group, an N',N'-dialkyl-N-alkylureido group, an N',N'-dialkyl-N'-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, and an N-aryl-N-aryloxycarbonylamino group. Examples of the alkyl group and aryl group therein include such as those exemplified as the alkyl group, substituted alkyl group, aryl group and substituted aryl group described above, and R$^{O7}$ of the acyl group (R$^{O7}$CO—) in the acylamino group, N-alkylacylamino group and N-arylacylamino group is the same as described above. Among these, more preferred examples thereof include an N-alkylamino group, an N,N-dialkylamino group, an N-arylamino group, and an acylamino group. Specific examples of the preferred substituted amino group include a methylamino group, an ethylamino group, a diethylamino group, a morpholino group, a piperidino group, a pyrrolidino group, a phenylamino group, a benzoylamino group, and an acetylamino group.

Regarding the substituted sulfonyl group (R$^{O11}$—SO$_2$—), a sulfonyl group in which R$^{O11}$ is formed from a monovalent non-metal atomic group can be used. More preferred examples thereof include an alkylsulfonyl group, an arylsulfonyl group, and a substituted or unsubstituted sulfamoyl group. Examples of the alkyl group and aryl group therein include such as those exemplified as the alkyl group, substituted alkyl group, aryl group and substituted aryl group described above. Specific examples of such a substituted sulfonyl group include a butylsulfonyl group, a phenylsulfonyl group, a chlorophenylsulfonyl group, a sulfamoyl group, an N-alkylsulfamoyl group, an N,N-dialkylsulfamoyl group, an N-arylsulfamoyl group, and an N-alkyl-N-arylsulfamoyl group.

The sulfonate group (—SO$_3$—) indicates a conjugated base anion group of a sulfo group (—SO$_3$H) as described above, and generally, it is preferable to use with a counter cation. Examples of such a counter cation include such as those generally known, that is, various oniums (ammoniums, sulfoniums, phosphoniums, iodoniums, aziniums, and the like), and metal ions (Na$^+$, K$^+$, Ca$^{2+}$, Zn$^{2+}$, and the like).

Regarding the substituted carbonyl group (R$^{O13}$—CO—), a carbonyl group in which R$^{O13}$ is formed from a monovalent non-metal atomic group can be used. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, and an N-alkyl-N'-arylcarbamoyl group. Examples of the alkyl group and aryl group therein include such as those exemplified as the alkyl group, substituted alkyl group, aryl group, and substituted aryl group described above. Among these, more preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, and an N-arylcarbamoyl group, and even more preferred examples include a formyl group, an acyl group, an alkoxycarbonyl group, and an aryloxycarbonyl group. Specific examples of the preferred substituted carbonyl group include a formyl group, an acetyl group, a benzoyl group, a carboxyl group, a methoxycarbonyl group, an ethoxycarbonyl group, an allyloxycarbonyl group, a dimethylaminophenylethenylcarbonyl group, a methoxycarbonylmethoxycarbonyl group, an N-methylcarbamoyl group, an N-phenylcarbamoyl group, an N,N-diethylcarbamoyl group, and a morpholinocarbonyl group.

Regarding the substituted sulfinyl group (R$^{O14}$—SO—), a sulfinyl group in which R$^{O14}$ is formed from a monovalent non-metal atomic group can be used. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group, and an N-alkyl-N-arylsulfinamoyl group. Examples of the alkyl group and aryl group therein include such as those exemplified as the alkyl group, substituted alkyl group, aryl group, and substituted aryl group described above. Among these, more preferred examples include an alkylsulfinyl group and an arylsulfinyl group. Specific examples of such a substituted sulfinyl group include a hexylsulfinyl group, a benzylsulfinyl group, and a tolylsulfinyl group.

A substituted phosphono group indicates a phosphono group in which one or two hydroxyl groups in the phosphono group are substituted with other organic oxo groups, and preferred examples thereof include a dialkylphosphono group, a diarylphosphono group, an alkylarylphosphono group, a monoalkylphosphono group, and a monoarylphosphono group described above. Among these, a dialkylphosphono group and a diarylphosphono group are more preferred. Specific examples of such a substituted phosphono group include a diethylphosphono group, a dibutylphosphono group, and a diphenylphosphono group.

A phosphonate group (—PO$_3$H$_2$— and —PO$_3$H—) indicates a conjugated base anion group derived from first acid dissociation or second acid dissociation of a phosphono group (—PO$_3$H$_2$). Generally, the phosphonate group is preferably used together with a counter cation. Examples of such a counter cation include such as those generally known, that is, various oniums (ammoniums, sulfoniums, phosphoniums, iodoniums, aziniums and the like), and metal ions (Na$^+$, K$^+$, Ca$^{2+}$, Zn$^{2+}$, and the like).

A substituted phosphonate group is a conjugated base anion group in which one hydroxyl group in the substituted phosphono group described above is substituted with an organic oxo group, and specific examples thereof include conjugated bases of the monoalkylphosphono group (—$PO_3H$(alkyl)) and monoarylphosphono group (—$PO_3H$(aryl)) described above.

B is preferably a monovalent organic group having, among these substituents, an alkyl group, a substituted alkyl group, a silyl group, an N,N-dialkylamino group, a substituted or unsubstituted sulfamoyl group, a sulfo group, a substituted sulfonyloxy group, a carboxyl group, an alkoxycarbonyl group, a carbamoyl group, an N-alkylcarbamoyl group, an N,N-dialkylcarbamoyl group, an N-arylcarbamoyl group, a phosphono group, a substituted phosphono group, a phosphonate group, or a substituted phosphonate group; more preferably a monovalent organic group having an alkyl group, an N,N-dialkylamino group, a substituted or unsubstituted sulfamoyl group, a sulfo group, a carboxyl group, a carbamoyl group, a phosphono group, or a phosphonate group; and even more preferably a monovalent organic group having a substituted or unsubstituted sulfamoyl group, a sulfo group, or a carboxyl group.

In the following, preferable examples of the compound represented by Formula (2) [Exemplary Compound (2)-1 to Exemplary Compound (2)-22] are described.

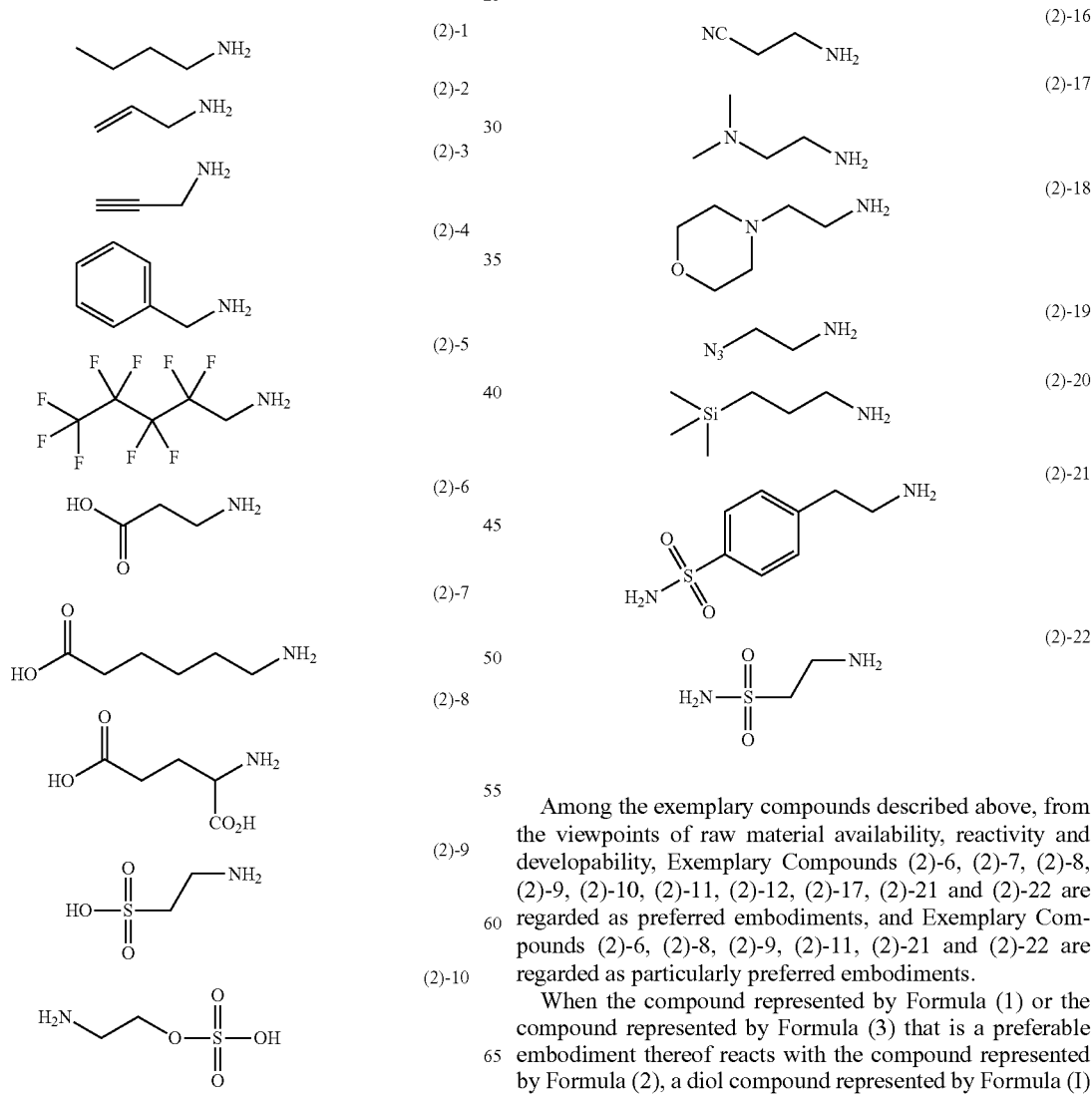

Among the exemplary compounds described above, from the viewpoints of raw material availability, reactivity and developability, Exemplary Compounds (2)-6, (2)-7, (2)-8, (2)-9, (2)-10, (2)-11, (2)-12, (2)-17, (2)-21 and (2)-22 are regarded as preferred embodiments, and Exemplary Compounds (2)-6, (2)-8, (2)-9, (2)-11, (2)-21 and (2)-22 are regarded as particularly preferred embodiments.

When the compound represented by Formula (1) or the compound represented by Formula (3) that is a preferable embodiment thereof reacts with the compound represented by Formula (2), a diol compound represented by Formula (I) [hereinafter, appropriately referred to as "(a) specific diol compound"], which serves as a raw material of the specific polyurethane according to the invention, can be obtained.

The method of reacting a compound represented by Formula (1) with a compound represented by Formula (2) to obtain the (a) specific diol compound represented by Formula (I) is known, and for example, methods described in Edwin D. Parker et al. J. Med. Chem., 1963, 6, 73-76; Marek Wlostwski et al. Tetrahedron Asym., 2004, 15, 2333-2338; Jordan L. Meier et al. J. Am. Chem. Soc., 2006, 128, 12174-12184; Gordon C. Fischer et al. J. Org. Chem., 1985, 50, 2011-2019; Esmond E. Snell J. Biol. Chem., 1941, 139, 975-976; J. F. Mead et al. J. Biol. Chem., 1946, 163, 465-473; R. Winterbottom et al. J. Am. Chem. Soc., 1947, 69, 1393-1401; Natalia N. Dioubankova et al. Tetrahedron, 2006, 62, 6762-6773; Barney J. Magerlein et al. U.S. Pat. No. 2,993,067; Rong J. Lu et al. Anal. Chem., 2000, 72, 1798-1801, and the like can be used.

Specific examples of the (a) specific diol compound represented by Formula (I) that is obtained by reacting a compound represented by Formula (1) with a compound represented by Formula (2) [Exemplary Compound (a)-1 to Exemplary Compound (a)-29] are described below, but the invention is not intended to be limited to these.

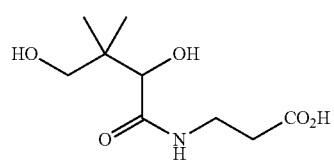
(a)-1

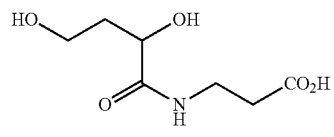
(a)-2

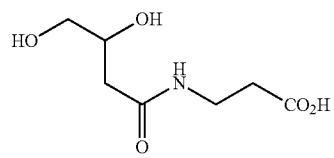
(a)-3

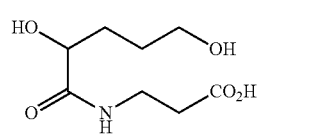
(a)-4

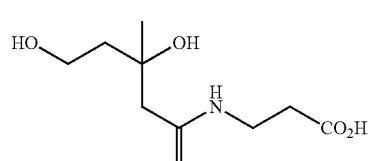
(a)-5

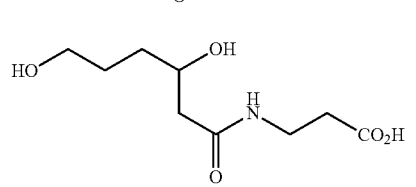
(a)-6

-continued

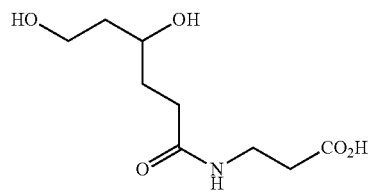
(a)-7

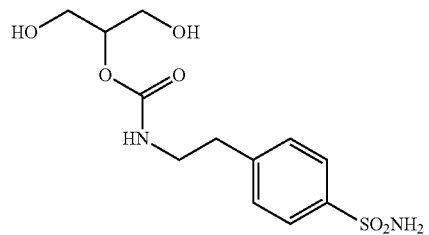
(a)-8

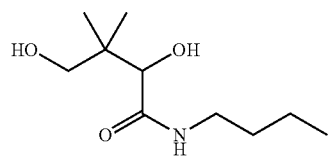
(a)-9

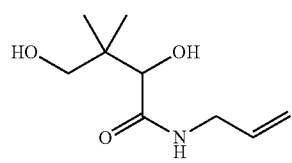
(a)-10

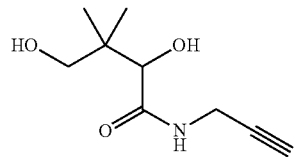
(a)-11

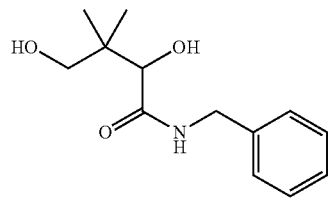
(a)-12

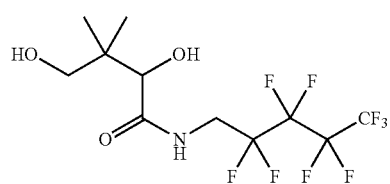
(a)-13

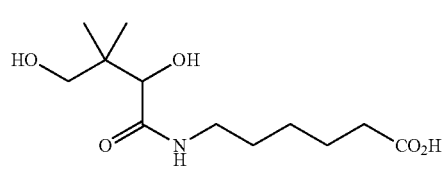
(a)-14

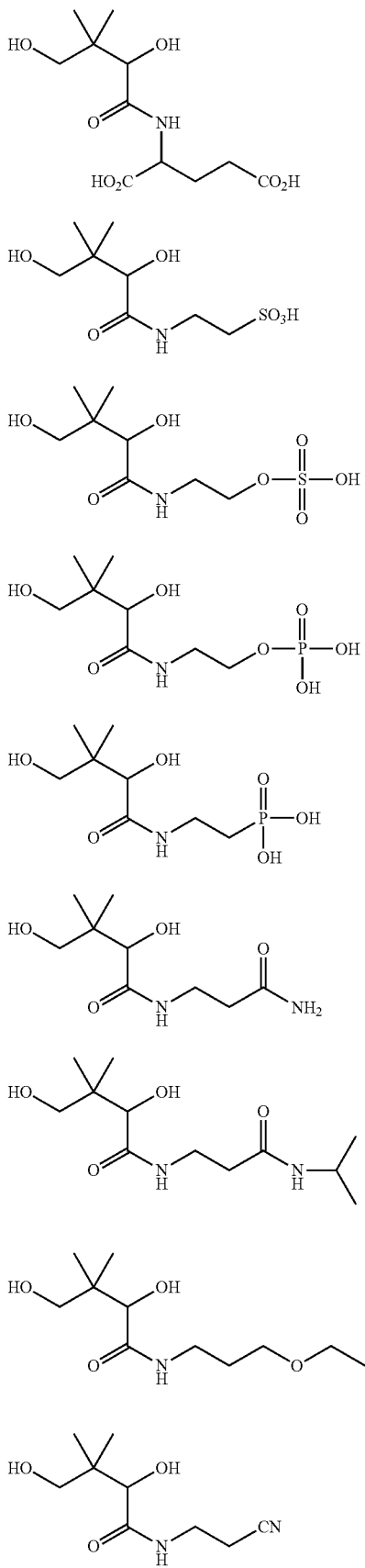
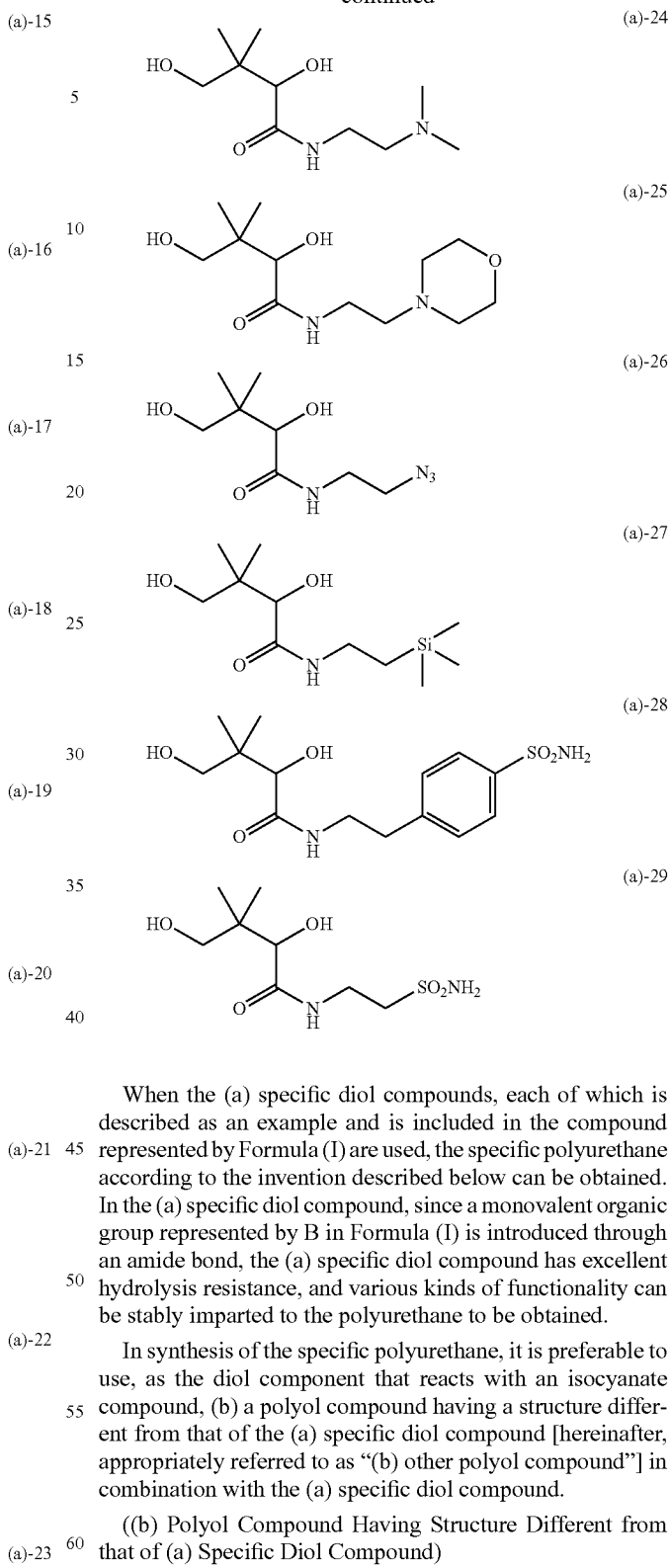

When the (a) specific diol compounds, each of which is described as an example and is included in the compound represented by Formula (I) are used, the specific polyurethane according to the invention described below can be obtained. In the (a) specific diol compound, since a monovalent organic group represented by B in Formula (I) is introduced through an amide bond, the (a) specific diol compound has excellent hydrolysis resistance, and various kinds of functionality can be stably imparted to the polyurethane to be obtained.

In synthesis of the specific polyurethane, it is preferable to use, as the diol component that reacts with an isocyanate compound, (b) a polyol compound having a structure different from that of the (a) specific diol compound [hereinafter, appropriately referred to as "(b) other polyol compound"] in combination with the (a) specific diol compound.

((b) Polyol Compound Having Structure Different from that of (a) Specific Diol Compound)

The (b) other polyol compound which has a structure different from that of the (a) specific diol compound represents a compound which has a structure different from the structure represented by Formula (I) and has two or more OH groups in one molecule of a diol compound, a triol compound or the like.

In the synthesis of a polyurethane, it is preferable to use the (b) other diol compound in combination with the (a) specific diol compound, in view of efficiently synthesizing a linear polymer.

Among preferred (b) other polyol compounds that can be used in the invention, specific examples of diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinone dihydroxyethyl ether, p-xylene glycol, dihydroxyethylsulfone, bis(2-hydroxyethyl)-2,4-tolylene dicarbamate, 2,4-tolylene-bis(2-hydroxyethylcarbamide), bis(2-hydroxyethyl)-m-xylylene dicarbamate, bis(2-hydroxyethyl) isophthalate, 1,3-propanediol, 1,4-butanediol, 1,5-pentanediol, 1,6-hexanediol, 1,7-heptanediol, 1,8-octanediol, 1,10-decanediol, 2-butene-1,4-diol, cis-2-butene-1,4-diol, trans-2-butene-1,4-diol, catechol, resorcin, hydroquinone, 4-methylcatechol, 4-t-butylcatechol, 4-acetylcatechol, 3-methoxycatechol, 4-phenylcatechol, 4-methylresorcin, 4-ethylresorcin, 4-t-butylresorcin, 4-hexylresorcin, 4-chlororesorcin, 4-benzylresorcin, 4-acetylresorcin, 4-carbomethoxyresorcin, 2-methylresorcin, 5-methylresorcin, t-butyl hydroquinone, 2,5-di-t-butyl hydroquinone, 2,5-di-t-amyl hydroquinone, tetramethyl hydroquinone, tetrachloro hydroquinone, methylcarboamino hydroquinone, methylureido hydroquinone, methylthio hydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl)hexane, 1,4-bis(2-(p-hydroxyphenyl)propyl)benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenethyl alcohol, 2-hydroxyethyl-4-hydroxybenzoate, 2-hydroxyethyl-4-hydroxyphenyl acetate, resorcin mono-2-hydroxyethyl ether, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, a polyethylene glycol having an average molecular weight of 1000, a polyethylene glycol having an average molecular weight of 1500, a polyethylene glycol having an average molecular weight of 2000, a polyethylene glycol having an average molecular weight of 3000, a polyethylene glycol having an average molecular weight of 7500, a polypropylene glycol having an average molecular weight of 400, a polypropylene glycol having an average molecular weight of 700, a polypropylene glycol having an average molecular weight of 1000, a polypropylene glycol having an average molecular weight of 2000, a polypropylene glycol having an average molecular weight of 3000, and a polypropylene glycol having an average molecular weight of 4000.

The (b) other diol compound is also available as a commercially available product, and examples thereof include polyether diol compounds such as PTMG650, PTMG1000, PTMG20000, PTMG3000, NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128, NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BP-2P, NEWPOL BPE-23P, NEWPOL BPE-3P, NEWPOL BPE-5P, NEWPOL 50HB-100, NEWPOL 50HB-260, NEWPOL 50HB-400, NEWPOL 50HB-660, NEWPOL 50HB-2000, and NEWPOL 50HB-5100, all manufactured by Sanyo Chemical Industries, Ltd.; polyester diol compounds, and polycarbonate diol compounds.

Furthermore, it is possible to use a diol compound containing a carboxyl group in combination, such as 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycin, or N,N-bis(2-hydroxyethyl)-3-carboxy-propionamide.

Furthermore, the diol compounds described in the various methods of Patent Documents 1 to 5 described above (JP-A Nos. 2003-177533, H11-352691, H10-260530, 2005-250158 and 2009-86321) can also be used as preferred embodiments of the (b) other diol compound.

In synthesis of a polyurethane, the content in the case of using the (b) other polyol compound is preferably from 0.1 mol % to 80 mol %, and more preferably from 20 mol % to 60 mol %, with respect to 100 mol % of the total amount of the (a) specific diol compound and the (b) other polyol compound.

(Other Components: Chain Extending Agent)

In synthesis of a polyurethane, a chain extending agent may also further be used in combination, in addition to the (a) specific diol compound and the (b) other polyol compound that is optionally used in combination, and the (c) isocyanate compound that is described below. Examples of the chain extending agent that can be used in the invention include aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2,6,6-tetramethylpiperidine, N,N-dimethylethylenediamine, lysine, L-cystine, and isophoronediamine; aromatic diamine compounds such as o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis(4-aminophenyl) sulfone, 4-carboxyl-o-phenylenediamine, 3-carboxyl-m-phenylenediamine, 4,4'-diaminophenyl ether, and 1,8-naphthalenediamine; heterocyclic amine compounds such as 2-aminoimidazole, 3-aminotriazole, 5-amino-1H-tetrazole, 4-aminopyrazole, 2-aminobenzimidazole, 2-amino-5-carboxytriazole, 2,4-diamino-6-methyl-s-triazine, 2,6-diaminopyridine, L-histidine, DL-tryptophan, and adenine; and amino alcohols or aminophenol compounds such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1- propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol, and L-tyrosine.

Furthermore, in polymer synthesis, a urethane polymer, in which an unreacted terminal isocyanate group is capped with a radical-polymerizable group-containing alcohol compound to terminate the reaction, is more preferred since print durability is further enhanced. Examples of the radical polymerizable group-containing alcohol compound include 2-hydroxyethyl (meth)acrylate, 2-hydroxypropyl (meth)acrylate, 2-hydroxy-3-chloropropyl (meth)acrylate, 2-hydroxy-3-allyloxypropyl (meth)acrylate, 2-hydroxy-3-phenoxypropyl (meth)acrylate, 4-hydroxybutyl (meth)acrylate, glycerol diacrylate, glycerol acrylate methacrylate, glycerol dimethacrylate, pentaerythritol triacrylate, and tris(acryloyloxyethyl) isocyanurate.

[(c) Isocyanate Compound]

As the isocyanate compound that is used in the synthesis of the specific polyurethane according to the invention, a polyisocyanate compound, that is, a compound having two or more isocyanate groups in one molecule, such as a diisocyanate compound, a triisocyanate compound or the like, is used. A diisocyanate compound is preferred for synthesizing a linear polymer, and a diisocyanate compound represented by the following Formula (C) may be mentioned as a preferred embodiment:

$$OCN-R^1-NCO \quad (C)$$

In Formula (C), $R^1$ represents a divalent aliphatic hydrocarbon group or an aromatic hydrocarbon group. The hydrocarbon group may have a substituent (for example, groups of alkyl, alkenyl, aralkyl, aryl, alkoxy, and halogeno each are preferred). Furthermore, if necessary, the structure of the hydrocarbon group represented by $R^1$ may also have another functional group or a bonding structure that do not react with an isocyanate group, for example, an ester, a urethane, an amide, a ureido group, or a carbon-carbon unsaturated bond.

Specific examples of the diisocyanate compound represented by Formula (C) include compounds described below. That is, specific examples thereof include aromatic diisocyanate compounds such as 2,4-tolylene diisocyanate, dimer of 2,4-tolylene diisocyanate, 2,6-tolylene diisocyanate, p-xylene diisocyanate, m-xylene diisocyanate, 4,4'-diphenylmethane diisocyanate, 1,5-naphthylene diisocyanate, and 3,3'-dimethylbiphenyl-4,4'-diisocyanate; aliphatic diisocyanate compounds such as hexamethylene diisocyanate, trimethylhexamethylene diisocyanate, lysine diisocyanate, and dimer acid diisocyanate; aliphatic diisocyanate compounds such as isophorone diisocyanate, 4,4'-methylenebis(cyclohexyl isocyanate), methylcyclohexane-2,4 (or 2,6)-diisocyanate, and 1,3-(isocyanatomethyl)cyclohexane; and a diisocyanate compound which is a reaction product of a diol and a diisocyanate such as an adduct of 1 mole of 1,3-butylene glycol and 2 moles of tolylene diisocyanate.

Regarding the method of synthesizing the specific polyurethane by reacting, with the (b) other polyol compound and the (c) polyisocyanate compound, the (a) specific diol compound which is obtained by a reaction between at least one compound represented by Formula (1) and a compound represented by Formula (2), for example, the synthesis can be performed by a general synthesis method such as those described in JP-A No. 2005-250158 and the like.

The specific polyurethane having a partial structure represented by Formula (I-1), which is obtained by the production method described above, is a novel compound.

Specific examples of the novel polyurethane (Exemplary Compound PU-1 to Exemplary Compound PU-61) obtained by using, as starting raw materials, the (A) specific polyurethane and (a) specific diol compound according to the invention are described together with the starting materials, content ratios (feed ratio: mol %) of the various raw materials (starting materials), and the weight average molecular weight of the (A) specific polyurethane thus obtained. However, the invention is not intended to be limited to these. Regarding the weight average molecular weight of a polymer compound in the present specification, a value measured by a GPC method and calculated in terms of polystyrene is used.

The synthesis scheme for the (A) specific polyurethane is illustrated below. In the scheme described below, Ra represents a divalent linking group.

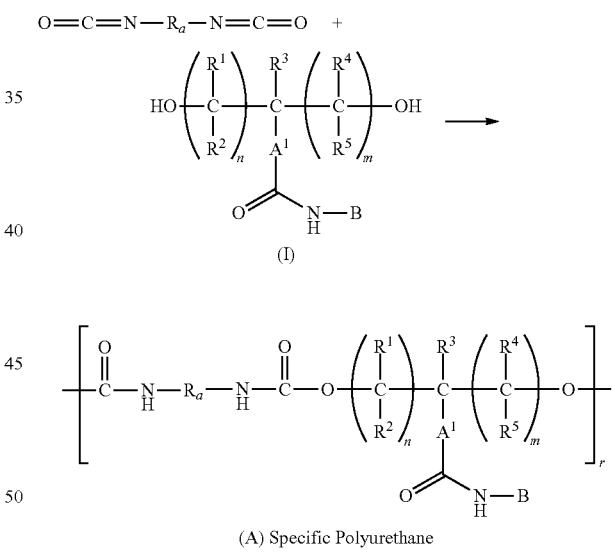

(A) Specific Polyurethane

| Diisocyanate compound structure |
|---|
| (c) Diisocyanate compound |

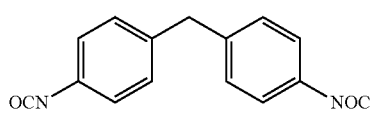

PU-1

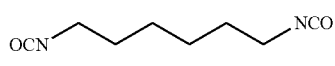

40    10

-continued
PU-2 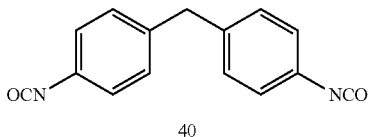 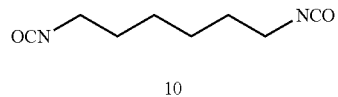
40 10
PU-3 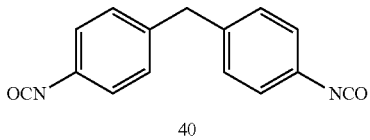 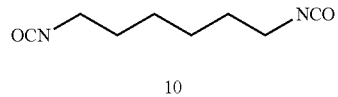
40 10
PU-4 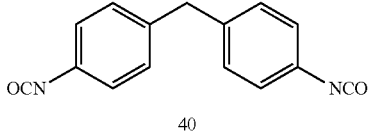 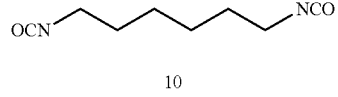
40 10
PU-5 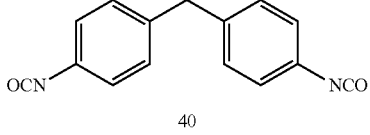 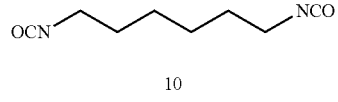
40 10
PU-6 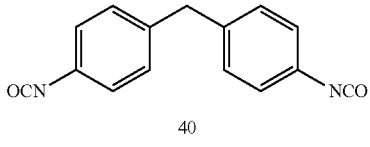 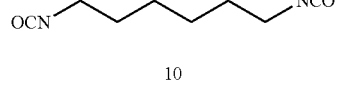
40 10
PU-7 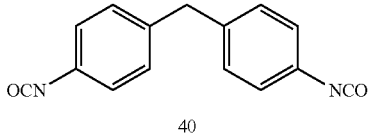 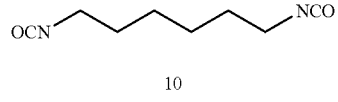
40 10
PU-8 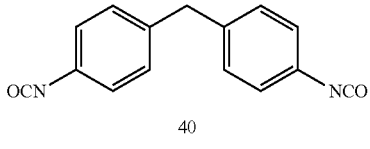 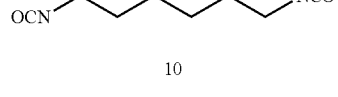
40 10
PU-9 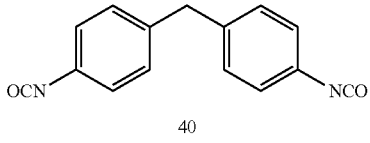 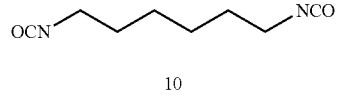
40 10
PU-10 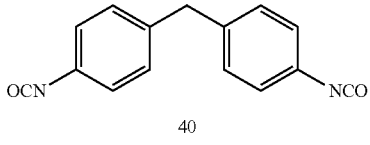 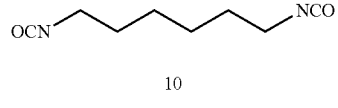
40 10

-continued
PU-11 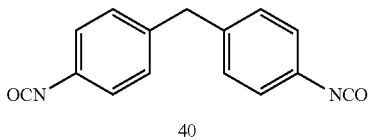 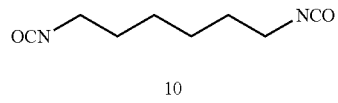
40  10
PU-12 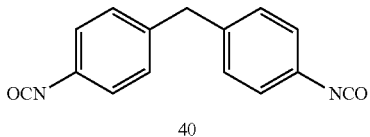 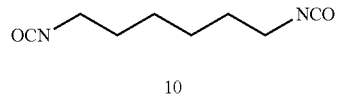
40  10
PU-13 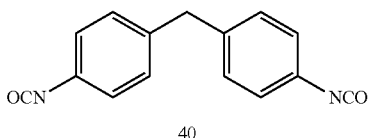 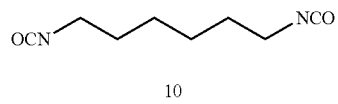
40  10
PU-14 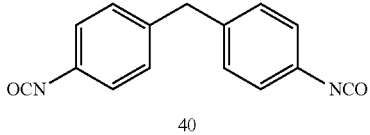 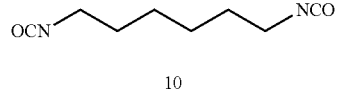
40  10
PU-15 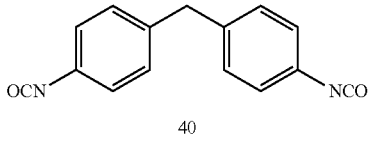 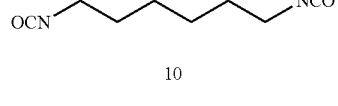
40  10
PU-16 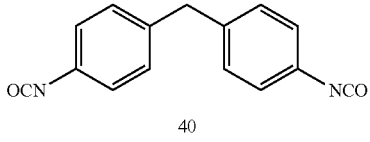 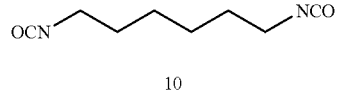
40  10
PU-17 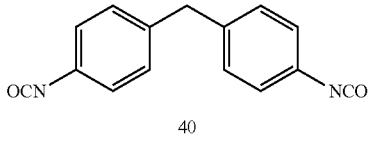 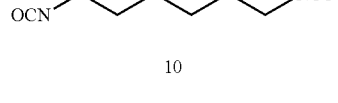
40  10
PU-18 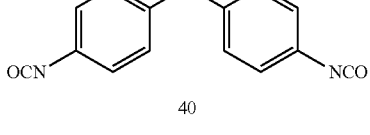 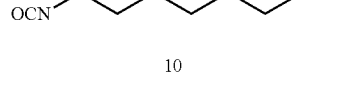
40  10
PU-19 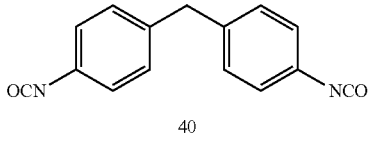 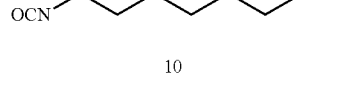
40  10

-continued
PU-20 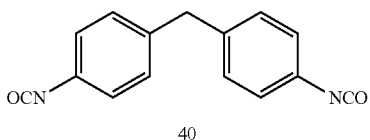 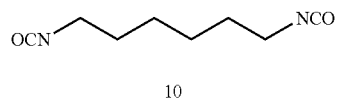
PU-21 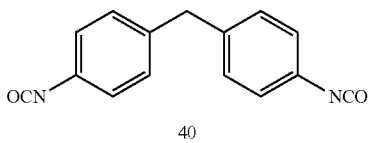 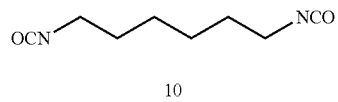
PU-22 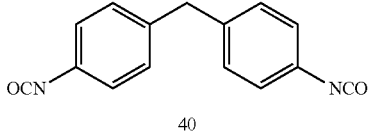 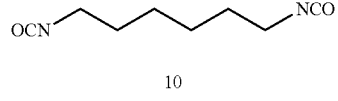
PU-23 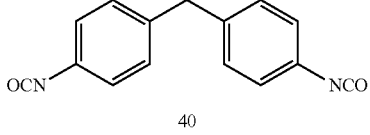 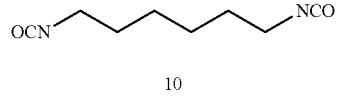
PU-24 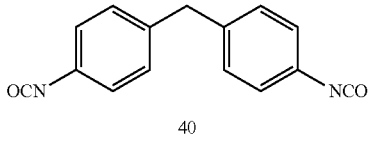 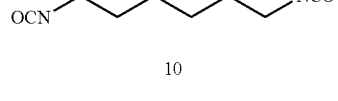
PU-25 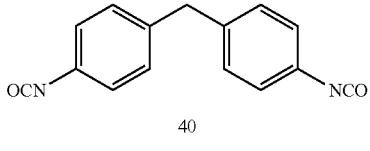 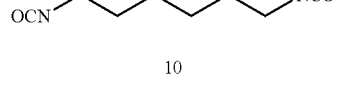
PU-26 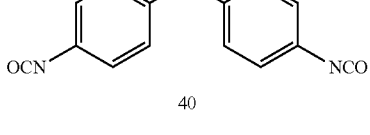 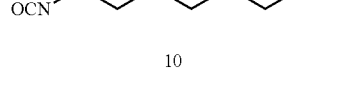
PU-27 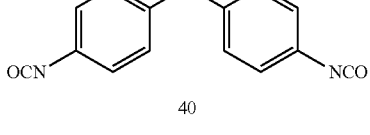 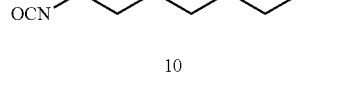
PU-28 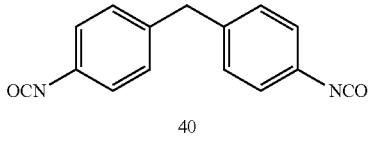 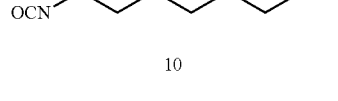

-continued
PU-29 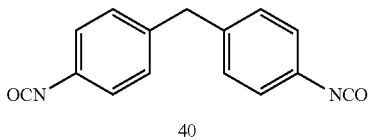 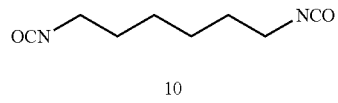
PU-30 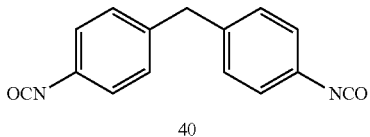 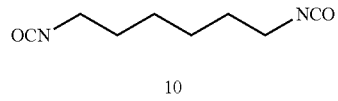
PU-31 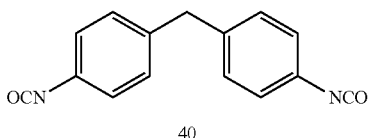 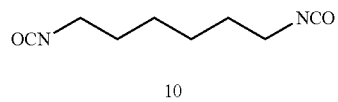
PU-32 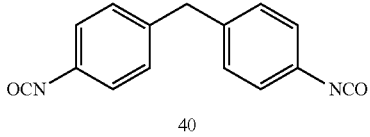 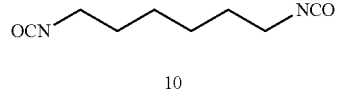
PU-33 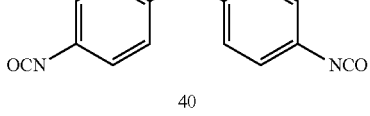 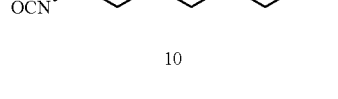
PU-34 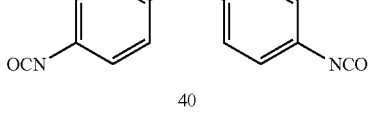 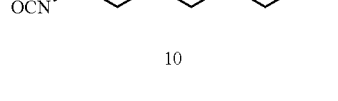
PU-35 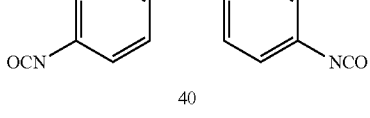 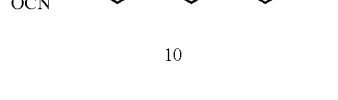
PU-36 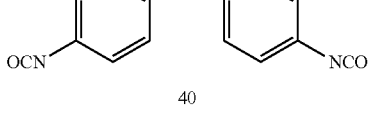 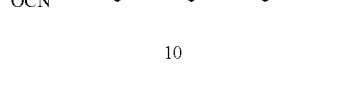
PU-37 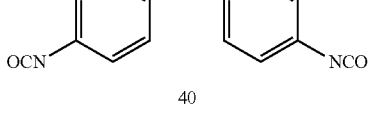 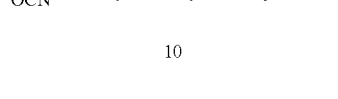

-continued
PU-38 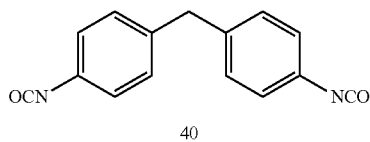 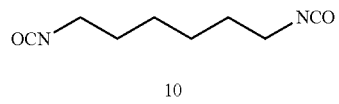
40    10
PU-39 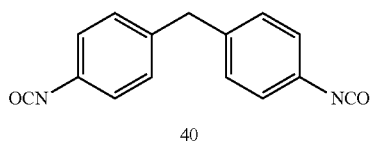 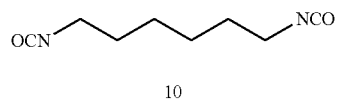
40    10
PU-40 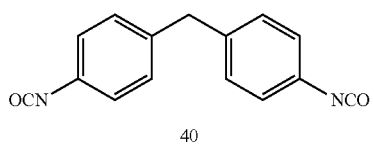 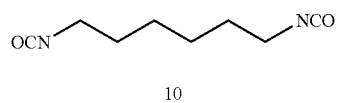
40    10
PU-41 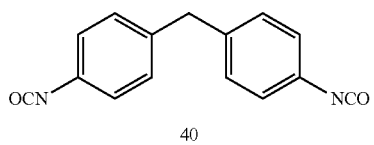 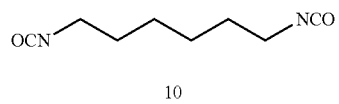
40    10
PU-42 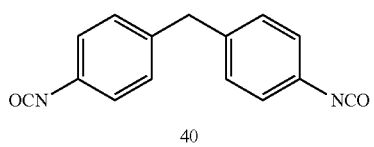 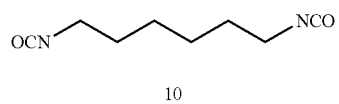
40    10
PU-43 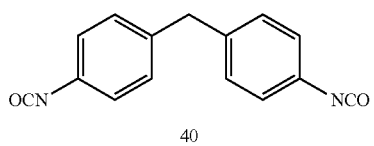 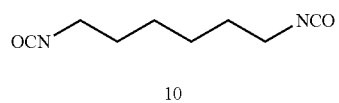
40    10
PU-44 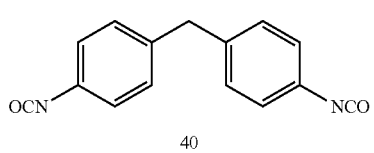 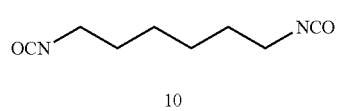
40    10
PU-45 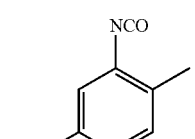
50
PU-46 
50

-continued
PU-47 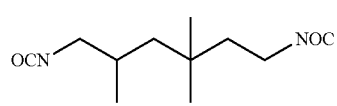
50
PU-48 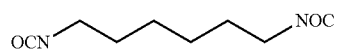
50
PU-49 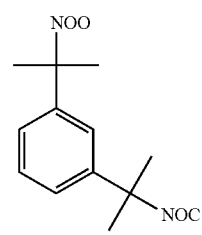
50
PU-50 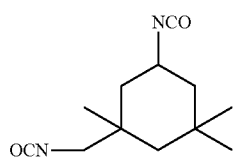
50
PU-51 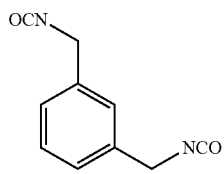
50
PU-52 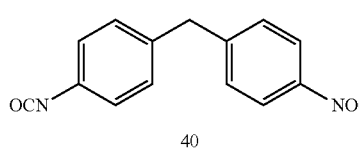 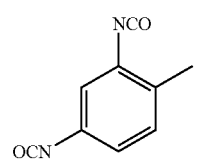
40  10
PU-53 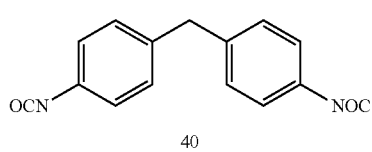 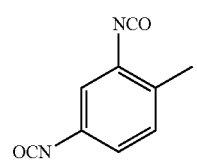
40  10

PU-54 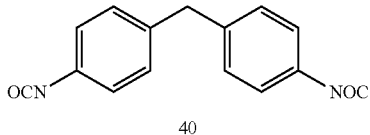 40 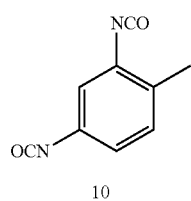 10
PU-55 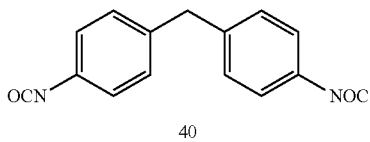 40 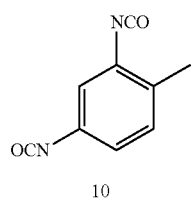 10
PU-56 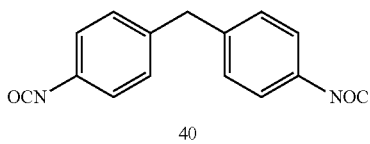 40 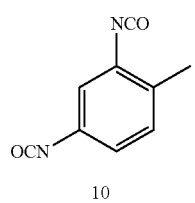 10
PU-57 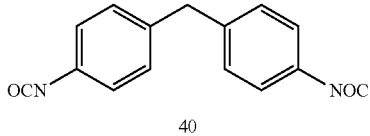 40 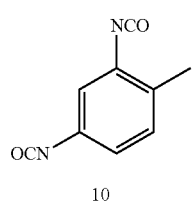 10
PU-58 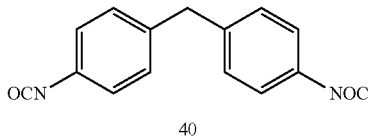 40 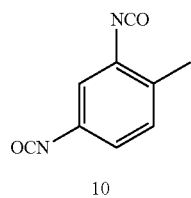 10
PU-59 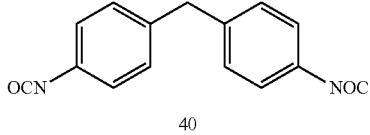 40 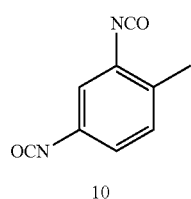 10
PU-60 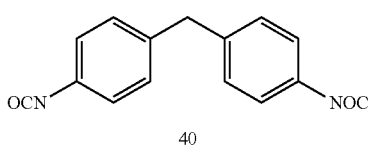 40 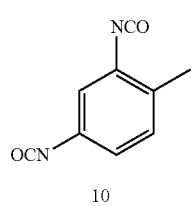 10

-continued
PU-61 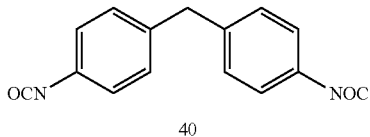 40 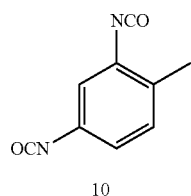 10
| | Diol compound structure | | |
|---|---|---|---|
| | (a) Specific diol component | (b) Other polyol compound | Mw |
| PU-1 | (a)-1 13 | HO─┬─OH <br> CO₂H <br> 37 | 43000 |
| PU-2 | (a)-2 13 | HO─┬─OH <br> CO₂H <br> 37 | 40000 |
| PU-3 | (a)-3 13 | HO─┬─OH <br> CO₂H <br> 37 | 44000 |
| PU-4 | (a)-4 13 | HO─┬─OH <br> CO₂H <br> 37 | 45000 |
| PU-5 | (a)-5 13 | HO─┬─OH <br> CO₂H <br> 37 | 50000 |
| PU-6 | (a)-6 13 | HO─┬─OH <br> CO₂H <br> 37 | 45000 |
| PU-7 | (a)-7 13 | HO─┬─OH <br> CO₂H <br> 37 | 42000 |

-continued
| | | | |
|---|---|---|---|
| PU-8 | (a)-8 13 | 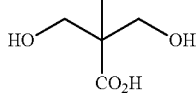 37 | 43000 |
| PU-9 | (a)-9 13 | 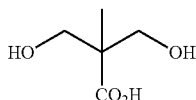 37 | 44000 |
| PU-10 | (a)-10 13 | 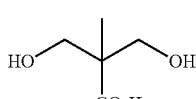 37 | 40000 |
| PU-11 | (a)-11 13 | 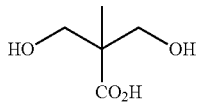 37 | 45000 |
| PU-12 | (a)-12 13 | 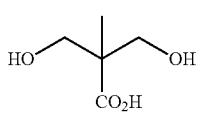 37 | 46000 |
| PU-13 | (a)-13 13 | 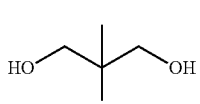 37 | 43000 |
| PU-14 | (a)-14 13 | 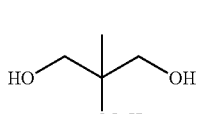 37 | 44000 |
| PU-15 | (a)-15 13 | 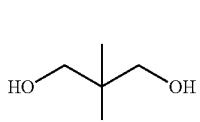 37 | 42000 |
| PU-16 | (a)-16 13 | 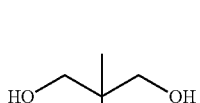 37 | 50000 |

-continued
| | | | |
|---|---|---|---|
| PU-17 | (a)-17<br>13 | 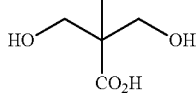<br>37 | 42000 |
| PU-18 | (a)-18<br>13 | 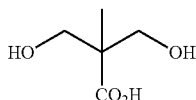<br>37 | 43000 |
| PU-19 | (a)-19<br>13 | 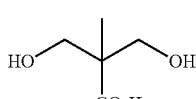<br>37 | 40000 |
| PU-20 | (a)-20<br>13 | 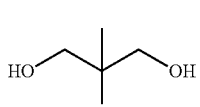<br>37 | 42000 |
| PU-21 | (a)-21<br>13 | 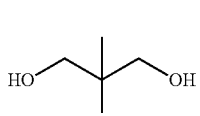<br>37 | 41000 |
| PU-22 | (a)-22<br>13 | 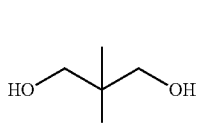<br>37 | 48000 |
| PU-23 | (a)-23<br>13 | 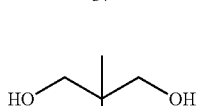<br>37 | 43000 |
| PU-24 | (a)-24<br>13 | 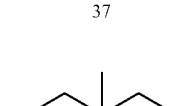<br>37 | 45000 |
| PU-25 | (a)-25<br>13 | 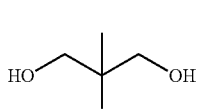<br>37 | 45000 |

-continued
| | | | | |
|---|---|---|---|---|
| PU-26 | (a)-26 13 | 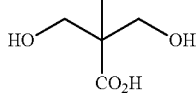 37 | | 44000 |
| PU-27 | (a)-27 13 | 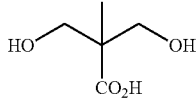 37 | | 46000 |
| PU-28 | (a)-28 13 | 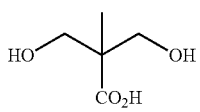 37 | | 42000 |
| PU-29 | (a)-29 13 | 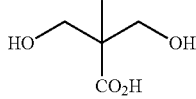 37 | | 49000 |
| PU-30 | (a)-28 25 | 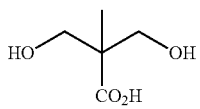 37 | | 40000 |
| PU-31 | (a)-28 40 | 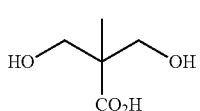 37 | | 41000 |
| PU-32 | (a)-1 50 | | | 43000 |
| PU-33 | (a)-15 50 | | | |
| PU-34 | (a)-16 50 | | | 48000 |
| PU-35 | (a)-18 50 | | | 46000 |
| PU-36 | (a)-19 50 | | | 54000 |
| PU-37 | (a)-28 50 | | | 53000 |
| PU-38 | (a)-1 25 | 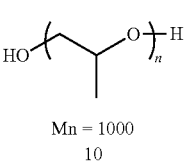 Mn = 1000 10 | 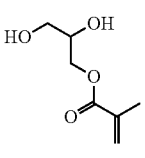 15 | 48000 |

-continued
| | | | | |
|---|---|---|---|---|
| PU-39 | (a)-14<br>25 | 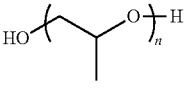<br>Mn = 1000<br>10 | 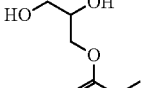<br>15 | 41000 |
| PU-40 | (a)-15<br>25 | 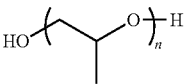<br>Mn = 1000<br>10 | 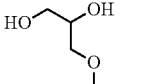<br>15 | 43000 |
| PU-41 | (a)-16<br>25 | 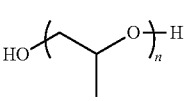<br>Mn = 1000<br>10 | 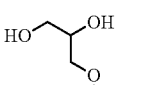<br>15 | 44000 |
| PU-42 | (a)-17<br>25 | 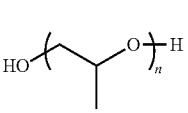<br>Mn = 1000<br>10 | 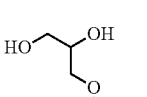<br>15 | 44000 |
| PU-43 | (a)-18<br>25 | 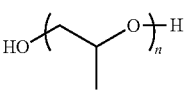<br>Mn = 1000<br>10 | 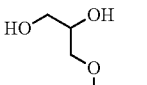<br>15 | 41000 |
| PU-44 | (a)-19<br>25 | 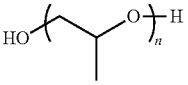<br>Mn = 1000<br>10 | 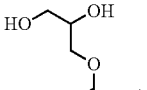<br>15 | 41000 |
| PU-45 | (a)-14<br>25 | 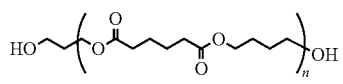<br>Mn = 1000<br>10 | 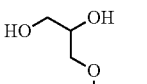<br>15 | 43000 |
| PU-46 | (a)-14<br>25 | 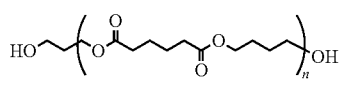<br>Mn = 1000<br>10 | 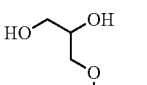<br>15 | 44000 |

-continued

| | | | | |
|---|---|---|---|---|
| PU-47 | (a)-14<br>25 | HO-[O-CO-(CH₂)₄-CO-O-(CH₂)₄]ₙ-OH<br>Mn = 1000<br>10 | HO-CH₂-CH(OH)-CH₂-O-CO-C(CH₃)=CH₂<br>15 | 44000 |
| PU-48 | (a)-14<br>25 | HO-[O-CO-(CH₂)₄-CO-O-(CH₂)₄]ₙ-OH<br>Mn = 1000<br>10 | HO-CH₂-CH(OH)-CH₂-O-CO-C(CH₃)=CH₂<br>15 | 41000 |
| PU-49 | (a)-14<br>25 | HO-[O-CO-(CH₂)₄-CO-O-(CH₂)₄]ₙ-OH<br>Mn = 1000<br>10 | HO-CH₂-CH(OH)-CH₂-O-CO-C(CH₃)=CH₂<br>15 | 41000 |
| PU-50 | (a)-14<br>25 | HO-[O-CO-(CH₂)₄-CO-O-(CH₂)₄]ₙ-OH<br>Mn = 1000<br>10 | HO-CH₂-CH(OH)-CH₂-O-CO-C(CH₃)=CH₂<br>15 | 43000 |
| PU-51 | (a)-14<br>25 | HO-[O-CO-(CH₂)₄-CO-O-(CH₂)₄]ₙ-OH<br>Mn = 1000<br>10 | HO-CH₂-CH(OH)-CH₂-O-CO-C(CH₃)=CH₂<br>15 | 44000 |
| PU-52 | (a)-28<br>15 | HOCH₂-C(CH₃)(CO₂H)-CH₂OH<br>37 | HO-[(CH₂)₆-O-CO-O-(CH₂)₆]ₙ-OH<br>Mn = 1000<br>5 | 44000 |
| PU-53 | (a)-28<br>15 | HOCH₂-C(CH₃)(CO₂H)-CH₂OH<br>37 | HO—(CH₂)₄—OH<br>5 | 41000 |
| PU-54 | (a)-28<br>15 | HOCH₂-C(CH₃)(CO₂H)-CH₂OH<br>37 | HO—(CH₂)₆—OH<br>5 | 41000 |
| PU-55 | (a)-28<br>15 | HOCH₂-C(CH₃)(CO₂H)-CH₂OH<br>37 | HO—(CH₂)₁₀—OH<br>5 | 43000 |

| | | | | |
|---|---|---|---|---|
| PU-56 | (a)-28 15 | HO−CH2−C(CH3)(CO2H)−CH2−OH  37 | HO−(CH2CH2CH2CH2−O)n−H  Mn = 1000  5 | 44000 |
| PU-57 | (a)-8 15 | HO−CH2−C(CH3)(CO2H)−CH2−OH  37 | HO−(CH(CH3)CH2−O)n−H  Mn = 1000  10 | 40000 |
| PU-58 | (a)-20 15 | HO−CH2−C(CH3)(CO2H)−CH2−OH  37 | HO−(CH(CH3)CH2−O)n−H  Mn = 1000  10 | 40000 |
| PU-59 | (a)-22 15 | HO−CH2−C(CH3)(CO2H)−CH2−OH  37 | HO−(CH(CH3)CH2−O)n−H  Mn = 1000  10 | 41000 |
| PU-60 | (a)-23 15 | HO−CH2−C(CH3)(CO2H)−CH2−OH  37 | HO−(CH(CH3)CH2−O)n−H  Mn = 1000  10 | 42000 |
| PU-61 | (a)-24 15 | HO−CH2−C(CH3)(CO2H)−CH2−OH  37 | HO−(CH(CH3)CH2−O)n−H  Mn = 1000  10 | 44000 |

The content of the (A) specific polyurethane in the photosensitive composition according to the invention is preferably in the range of from 5% by mass to 95% by mass, and more preferably in the range of from 40% by mass to 80% by mass, in terms of solid content of the photosensitive composition. The term "in terms of solid content" means the total amount of all the components except for the solvent that is included in the photosensitive composition.

[(A) Polyester Obtained by Reacting Diol Component Including Compound Represented by Formula (I) with Polycarboxylic Acid Compound]

The polyester having a partial structure represented by Formula (I-1) can be obtained by reacting the (a) specific diol compound described above with (d) a polycarboxylic acid compound that is described below. Hereinafter, the polyester obtained by reacting the diol component including a compound represented by Formula (I) with a polycarboxylic acid compound may be referred to as a "specific polyester".

[(d) Polycarboxylic Acid Compound]

A polycarboxylic acid compound refers to a compound having two or more carboxyl groups in one molecule, such as a dicarboxylic acid, a tricarboxylic acid, or the like. Dicarboxylic acids and dicarboxylic acid ester derivatives are preferable for synthesizing linear polymers. Specific examples of preferable dicarboxylic acids and dicarboxylic acid ester derivatives include aliphatic dicarboxylic acids and aliphatic dicarboxylic acid diesters such as diethyl malonate, succinic acid, diethyl succinate, itaconic acid, diethyl itaconate, malic acid, diethyl malate, fumaric acid, dimethyl fumarate, adipic acid, dimethyl adipate 2,3-dimethyladipic acid, sebacic acid, diethyl sebacate, and eicosanedioic acid; alicyclic dicarboxylic acids and esters thereof such as 1,1-cyclopropanedicarboxylic acid, dimethyl 1,1-cyclopropanedicarboxylate, 1,1-cyclopentanecarboxylic acid, diethyl cis-1,2-cyclohexanediacetate, and 1,4-(2-norbornene)dicarboxylic acid; and aromatic dicarboxylic acids and esters thereof such as phthalic acid, dimethyl phthalate, isophthalic acid, dimethyl isophthalate, terephthalic acid, dimethyl terephthalate, 1,8-naphthalenedicarboxylic acid, dimethyl 1,8-naphthalenedicarboxylate, 1,4-anthracenedicarboxylic acid, dimethyl 1,4-anthracenedicarboxylate, 4,4'-biphenylenedicarboxylic acid, diethyl 4,4'-biphenylenedicarboxylate, diethyl p-phenylenediacetate, and 4,4'-biphenyldiacetic acid.

Regarding the method of obtaining a polyester by reacting, with the (d) polycarboxylic acid compound, the (a) specific diol compound that is obtained by a reaction of at least one selected from the group consisting of a compound represented by Formula (1) and a compound represented by Formula (3), which is a preferred embodiment thereof. and a compound represented by Formula (2), versatile methods such as those described in "Jikken Kagaku Kouza (Lectures on Experimental Chemistry), 3$^{rd}$ Edition, Vol. 19-1, p. 145-p. 150" and "Jikken Kagaku Kouza (Lectures on Experimental Chemistry), 4$^{th}$ Edition, Vol. 28, p. 208-p. 231", can be applied except that the (a) specific diol compound is used as a starting material.

The specific polyester containing a partial structure represented by Formula (I-1) that is obtained by the production method is also another novel compound.

A synthesis scheme for the novel polyester that is used in the invention is shown below. In the following scheme, Rc represents a divalent linking group.

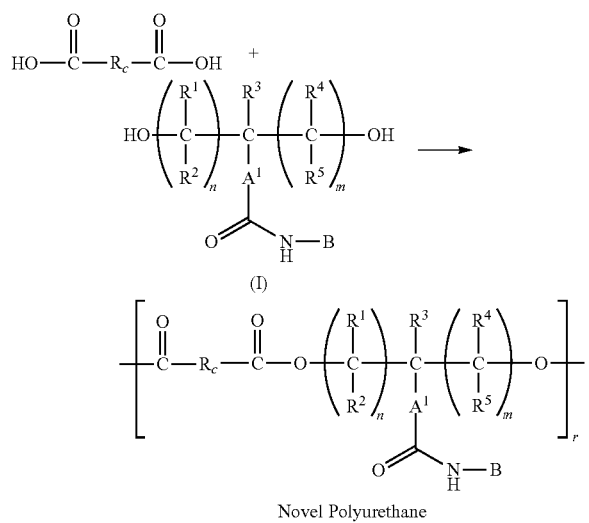

Novel Polyurethane

A specific example of the novel polyester (Exemplary Compound PE-1) that is obtained by using, as a starting material, the (a) specific diol compound according to the invention is described below together with the starting materials, the content ratio of various raw materials (starting materials) (feed ratio: mol %), and the weight average molecular weight of the polyester thus obtained. However, the invention is not intended to be limited to these.

| Dicarboxylic acid compound structure (d) Dicarboxylic acid compound | Diol compound structure (a) Specific diol component | Mw |
|---|---|---|
| PE-1  HO₂C—⟨benzene⟩—CO₂H  50 | (a)-28  50 | 40000 |

(Other Components that are Included in Photosensitive Composition)

The photosensitive composition according to the invention exhibits photosensitivity by containing various components that are capable of exhibiting photosensitivity (photosensitive components) depending on the purpose, in addition to at least one binder polymer selected from the group consisting of the (A) specific polyurethane and the specific polyester.

The various components that are contained in the photosensitive composition may be negative type photosensitive components in which alkali-solubility in an exposed region decreases, or may be positive type photosensitive components in which alkali-solubility in an exposed region increases.

Regarding the photosensitive component (compound) contained in the photosensitive composition, the component by itself alone does not necessarily have photosensitivity. That is, in the case in which a component alone does not have photosensitivity is used, various groups of compounds in which alkali-solubility is decreased or increased by light exposure as a result of an interaction with other co-existing components may be appropriately in combination. The individual compounds included in such plural compound groups are also referred to as photosensitive components in the invention.

Hereinafter, the components that are included in a photosensitive composition suitable to the invention are explained.

When the photosensitive composition according to the invention contains at least one compound selected from the group consisting of a polymerizable compound and a crosslinkable compound and at least one compound selected from the group consisting of a polymerization initiator and an acid generator, the photosensitive composition according to the invention is a negative photosensitive composition in which an exposed region is cured by polymerization or crosslinking.

Furthermore, when the photosensitive composition contains an alkali-soluble resin and a dissolution inhibitor that forms an interaction with the alkali-soluble resin to suppress the alkali-solubility of the alkali-soluble resin, the interaction in an exposed region is cancelled, whereby the photosensitive composition is a positive type photosensitive composition in which alkali-solubility in the exposed region is increased.

<Negative Type Photosensitive Composition>

First, the various components included in the negative type photosensitive composition are described.

The negative type photosensitive composition may be a photosensitive composition of a radical polymerization system which contains a polymerization initiator that generates radicals by light exposure and a polymerizable compound that is polymerized and cured by the radicals thus generated, or may be a photosensitive composition of a crosslinked system which contains an acid generator that generates an acid by light exposures and a crosslinkable compound that forms a crosslinked structure by the acid thus generated to be cured.

(Photosensitive Composition of Crosslinked System)

The acid generator that is used in a photosensitive composition of a crosslinked system is a compound which generates an acid by light or heat, and generates an acid when decomposed by infrared irradiation or the like. The acid thus generated is preferably a strong acid having a pKa value of 2 or less such as sulfonic acid, hydrochloric acid, or the like.

It is preferable that the photosensitive composition of an acid-crosslinked system further contain an alkali-soluble resin that is capable of reacting with a crosslinkable compound in the presence of an acid. The acid generated from the acid generator functions as a catalyst, and a robust crosslinked structure is formed between the crosslinkable compounds or between the crosslinkable compound and the alkali-soluble resin, whereby the photosensitive composition is cured, its alkali-solubility is decreased, and the photosensitive composition becomes insoluble in a developer. At this time, it is also preferable to use an infrared absorber in combination in order to use the energy of an infrared laser efficiently.

Suitable examples of the acid generator include onium salts such as iodonium salts, sulfonium salts, phosphonium salts, and diazonium salts.

Such onium salts are described in paragraphs [0010] to [0035] of JP-A No. H10-39509 as compounds of Formulas (I) to (III).

The addition amount of the acid generator is preferably from 0.01% by mass to 50% by mass, more preferably from 0.1% by mass to 25% by mass, and most preferably from 0.5% by mass to 20% by mass, with respect to the mass of the total solid content of the recording layer.

Furthermore, suitable examples of the crosslinkable compound include (i) an aromatic compound substituted with a hydroxymethyl group or an alkoxymethyl group, (ii) a compound having an N-hydroxymethyl group, an N-alkoxymethyl group, or an N-acyloxymethyl group, and (iii) an epoxy compound.

Examples of the (i) aromatic compound substituted with a hydroxymethyl group or an alkoxymethyl group include aromatic compounds or heterocyclic compounds that are polysubstituted with a hydroxymethyl group, an acetoxymethyl group or an alkoxymethyl group. Resin-like compounds which are known as resol resins and obtained by subjecting phenols and aldehydes to a condensation polymerization reaction under basic conditions are also included.

Among the aromatic compounds or heterocyclic compounds that are polysubstituted with a hydroxymethyl group or an alkoxymethyl group, compounds having a hydroxymethyl group or an alkoxymethyl group at a position adjacent to a hydroxy group are particularly preferred. Specific examples thereof include compounds of Formulas (8) to (11) that are described in paragraphs [0077] to [0083] of JP-A No. 2000-267265.

Examples of the (ii) compound having an N-hydroxymethyl group, an N-alkoxymethyl group or an N-acyloxymethyl group include the monomer and oligomer—melamine-formaldehyde condensates and urea-formaldehyde condensates described in European Patent Application Laid-Open (hereinafter, described as "EP-A") Nos. 0,133,216, German Patent Nos. 3,634,671 and 3,711,264; and alkoxy-substituted compounds described in EP-A No. 0,212,482.

Among them, for example, a melamine-formaldehyde derivative having at least two free N-hydroxymethyl groups, N-alkoxymethyl groups or N-acyloxymethyl groups is preferred, and an N-alkoxymethyl derivative is most preferred.

The (iii) epoxy compound may be, for example, a monomeric, dimeric, oligomeric or polymeric epoxy compound having at least one epoxy group, and examples thereof include a reaction product of bisphenol A and epichlorohydrin, and a reaction product of a low molecular weight phenol-formaldehyde resin and epichlorohydrin.

In addition to those, the epoxy resins described and used in the respective specifications of U.S. Pat. No. 4,026,705 and U.K. Patent No. 1,539,192 may be used.

Regarding the addition amount in the case of using the compounds of (i) to (iii) described above as crosslinking agents, the addition amount is preferably from 5% by mass to 80% by mass, more preferably from 10% by mass to 75% by mass, and most preferably from 20% by mass to 70% by mass, with respect to the mass of the total solid content of the recording layer.

(Photosensitive Composition of Radical Polymerization System)

The negative type photosensitive composition is preferably a radical polymerization system from the viewpoints of sensitivity and stability. Hereinafter, the various components that can be included in the photosensitive composition of a radical polymerization system are described.

In the negative type photosensitive composition of a polymerization system, a robust covalent bond is formed between the polymerizable compounds or between the polymerizable compound and the alkali-soluble resin, by the radical generated from a polymerization initiator, whereby the photosensitive composition is cured, its alkali-solubility is decreased, and the photosensitive composition becomes insoluble in a developer.

(B-1) Polymerization Initiator

The photosensitive composition according to the invention contains a polymerization initiator (hereinafter, also referred to as initiator compound). In the invention, a radical polymerization initiator is preferably used.

Regarding the initiator compound in the invention, compounds which are known to those having ordinary skill in the art can be used without any limitations, and specific examples thereof include a trihalomethyl compound, a carbonyl compound, an organic peroxide, an azo-based compound, an azide compound, a metallocene compound, a hexaarylbiimidazole compound, an organic boron compound, a disulfone compound, an oxime ester compound, an onium salt compound, and an iron-arene complex. Among them, the initiator compound is preferably at least one selected from the group consisting of a hexaarylbiimidazole-based compound, an onium salt, a trihalomethyl compound and a metallocene compound; and particularly, a hexaarylbiimidazole-based compound and an onium salt are preferred. Two or more kinds of the polymerization initiators can be appropriately used in combination.

Examples of the hexaarylbiimidazole-based compound include lophine dimmers described in the respective specifications of European Patent Application Nos. 24629 and 107792, and U.S. Pat. No. 4,410,621, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluoromethylphenyl)-4,4',5,5'-tetraphenylbiimidazole.

It is particularly preferable that the hexaarylbiimidazole-based compound is used in combination with a sensitizing dye having the maximum absorption at 300 nm to 450 nm.

Preferred examples of onium salts that are suitably used in the invention include sulfonium salts, iodonium salts, and diazonium salts. Particularly, diaryliodonium salts and triarylsulfonium salts are preferably used. It is particularly preferable that the onium salts is used in combination with an infrared absorber having the maximum absorption at 750 nm to 1400 nm.

Regarding other polymerization initiators, the polymerization initiators described in paragraphs [0071] to [0129] of JP-A No. 2007-206217 can be preferably used.

The polymerization initiators in the invention are suitably used singly or in combination of two or more kinds The amount to be used of the polymerization initiator in the photosensitive composition according to the invention is preferably from 0.01% by mass to 20% by mass, and more preferably from 0.1% by mass to 15% by mass, with respect to the mass of the total solid content of the photosensitive composition. The amount to be use is even more preferably from 1.0% by mass to 10% by mass.

(B-2) Polymerizable Compound

The polymerizable compound used in the photosensitive composition according to the invention is an addition polymerizable compound having at least one ethylenically unsaturated double bond, and is selected from compounds having at least one, and preferably two or more, terminal ethylenically unsaturated bonds. These have a chemical form of, for example, a monomer, a prepolymer, namely, a dimer, a trimer or an oligomer, or a mixture thereof. Examples of the monomer include unsaturated carboxylic acids (for example, acrylic acid, methacrylic acid, itaconic acid, crotonic acid, isocrotonic acid, and maleic acid), or esters and amides thereof. Preferably, an ester of an unsaturated carboxylic acid and a polyhydric alcohol compound, or an amide of an unsaturated carboxylic acid and a polyvalent amine compound is used. Furthermore, an addition reaction product of an unsaturated carboxylic acid ester or amide compound having a nucleophilic substituent such as a hydroxyl group, an amino group or a mercapto group and a monofunctional or polyfunctional isocyanate or epoxy compound; and a dehydration condensation reaction product with a monofunctional or polyfunctional carboxylic acid are also suitably used. Also, an addition reaction product of an unsaturated carboxylic acid ester or amide compound having an electrophilic substituent such as an isocyanate group or an epoxy group and a monofunctional or polyfunctional alcohol, amine or thiol compound; and a substitution reaction product of an unsaturated carboxylic acid ester or amide compound having a desorption substituent such as a halogen group or a tosyloxy group and a monofunctional or polyfunctional alcohol, amine or thiol compound are also suitable. Furthermore, as other examples, a group of compounds obtained by using unsaturated phosphonic acid, styrene, vinyl ether or the like instead of the unsaturated carboxylic acid described above, can also be used. These are described in reference documents including Japanese Patent Application National Publication (Laid-Open) No. 2006-508380, JP-A Nos. 2002-287344, 2008-256850, 2001-342222, H09-179296, H09-179297, H09-179298, 2004-294935, 2006-243493, 2002-275129, 2003-64130, 2003-280187, and H10-333321.

Specific examples of a monomer of an ester of a polyhydric alcohol compound and an unsaturated carboxylic acid include, as acrylic acid esters, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, and a polyester acrylate oligomer; and as methacrylic acid esters, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane, and bis[p-(methacryloxyethoxy)phenyl]dimethylmethane. Furthermore, specific examples of a monomer of an amide of a polyvalent amine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylenebisacrylamide, and xylenebismethacrylamide.

Furthermore, a urethane-based addition polymerizable compound that is produced using an addition reaction of an isocyanate and a hydroxyl group is also suitable, and specific examples thereof include a vinylurethane compound containing two or more polymerizable vinyl groups in one molecule, which is obtained by adding a vinyl monomer containing a hydroxyl group as represented by the following Formula (A) to a polyisocyanate compound having two or more isocyanate groups in one molecule as described in, for example, Japanese Patent Application Publication (JP-B) No. S48-41708:

$$CH_2=C(R^4)COOCH_2CH(R^5)OH \quad (A)$$

wherein each of $R^4$ and $R^5$ represents H or $CH_3$.

Furthermore, the urethane acrylates described in JP-A No. S51-37193, JP-B Nos. H02-32293 and H02-16765, JP-A Nos. 2003-344997 and 2006-65210; the urethane compounds having an ethylene oxide-based skeleton described in JP-B Nos. S58-49860, S56-17654, S62-39417 and S62-39418, JP-A Nos. 2000-250211 and 2007-94138; and the urethane compounds having a hydrophilic group described in U.S. Pat. No. 7,153,632, Japanese Patent Application National Publication (Laid-Open) No. H08-505958, JP-A Nos. 2007-293221 and 2007-293223 are also suitable.

The details of the method of use such as the structure of these polymerizable compounds, whether the polymerizable compound is used singly or in combination, and the addition amount can be arbitrarily set in accordance with the performance design of the final planographic printing plate precursor. The polymerizable compound described above is used in an amount in the range of preferably from 5% by mass to 75% by mass, more preferably from 25% by mass to 70% by mass, and particularly preferably from 30% by mass to 60% by mass, with respect to the total solid content of the photosensitive composition.

(B-3) Sensitizing Dye

It is preferable that a sensitizing dye is contained together with the negative type photosensitive component, from the viewpoint of increasing sensitivity. Any sensitizing dye can be used without any particular limitations, as long as a sensitizing dye is capable of absorbing light at the time of image exposure to be in an excited state, and provide energy to the polymerization initiator described below by electron transfer, energy transfer, heat emission or the like to improve the function of polymerization initiation. Particularly, a sensitizing dye having the maximum absorption at 300 nm to 450 nm or at 750 nm to 1400 nm is preferably used.

Examples of the sensitizing dye having the maximum absorption in a wavelength range of 350 nm to 450 nm include merocyanine dyes, benzopyrans, coumarins, aromatic ketones, anthracenes, styryls, and oxazoles.

Among the sensitizing dyes having the maximum absorption in the wavelength range of 350 nm to 450 nm, a more preferred dye from the viewpoint of high sensitivity is a dye represented by the following Formula (IX):

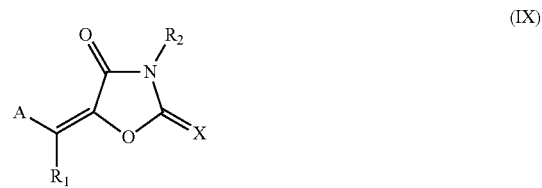

wherein in Formula (IX), A represents an aryl group or a heteroaryl group; X represents an oxygen atom, a sulfur atom or N—($R^3$); each of $R^1$, $R^2$ and $R^3$ independently represents a monovalent non-metal atomic group; and A with $R^1$ may be bonded to each other and $R^2$ with $R^3$ may be bonded to each other, to form an aliphatic or aromatic ring.

Formula (IX) is described in more detail. Each of $R^1$, $R^2$ and $R^3$ independently represent a monovalent non-metal atomic group, and preferably represent a hydrogen atom, a substituted or unsubstituted alkyl group, a substituted or unsubstituted alkenyl group, a substituted or unsubstituted aryl group, a substituted or unsubstituted heteroaryl residue, a substituted or unsubstituted alkoxy group, a substituted or unsubstituted alkylthio group, a hydroxyl group, or a halogen atom.

Next, A in Formula (IX) is explained. A represents an aryl group or heteroaryl group which may have a substituent. The aryl group or heteroaryl group may further have a substituent. Specific examples of the aryl group or heteroaryl group include the same groups such as those described as $R^1$, $R^2$ and $R^3$ in Formula (IX).

Specific examples of such a sensitizing dye that can be preferably used include the compounds described in JP-A No. 2007-58170 paragraphs [0047] to [0053], JP-A No. 2007-93866 paragraphs [0036] to [0037], and JP-A No. 2007-72816 paragraphs [0042] to Furthermore, the sensitizing dyes described in JP-A Nos. 2006-189604, 2007-171406, 2007-206216, 2007-206217, 2007-225701, 2007-225702, 2007-316582, and 2007-328243 can also be preferably used.

Next, the sensitizing dye having the maximum absorption at 750 nm to 1400 nm (hereinafter, may be referred to as "infrared absorber"), which is suitably used in the invention, is described in detail. As the infrared absorber, a dye or a pigment is preferably used.

Regarding the dye, commercially available dyes and known dyes that are described in documents such as, for example, "Senryo Binran (Handbook of Dyes)" (edited by the Society of Synthetic Organic Chemistry, Japan, annual of 1970) can be used. Specific examples thereof include dyes such as azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, and metal thiolate complexes.

Among these dyes, particularly preferred dyes include cyanine dyes, squarylium dyes, pyrylium salts, nickel thiolate complexes, and indolenine cyanine dyes. Furthermore, cyanine dyes or indolenine cyanine dyes are preferred, and particularly preferred examples thereof include a cyanine dye represented by the following Formula (a):

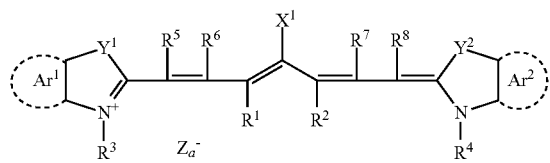

Formula (a)

In Formula (a), $X^1$ represents a hydrogen atom, a halogen atom, —$NPh_2$, $X^2$-$L^1$, or a group shown below; $X^2$ represents an oxygen atom or a sulfur atom; and $L^1$ represents a hydrocarbon group having 1 to 12 carbon atoms, an aromatic ring having a heteroatom, or a hydrocarbon group having 1 to 12 carbon atoms and containing a heteroatom. The heteroatom as used herein means N, S, O, a halogen atom, or Se.

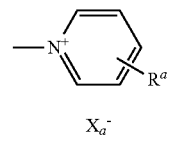

wherein, in the above formula, $Xa^-$ has the same definition as $Za^-$ described below; and $R^a$ represents a substituent selected from the group consisting of a hydrogen atom, an alkyl group, an aryl group, a substituted or unsubstituted amino group, and a halogen atom.

Each of $R^1$ and $R^2$ independently represents a hydrocarbon group having 1 to 12 carbon atoms. In view of the storage stability of the coating liquid for a recording layer, each of $R^1$ and $R^2$ is preferably a hydrocarbon group having two or more carbon atoms, and it is particularly preferable that $R^1$ and $R^2$ are bonded to each other to form a 5-membered ring or 6-membered ring.

$Ar^1$ and $Ar^2$ may be the same as or different from each other, and each represent an aryl group which may have a substituent. Preferred examples of the aryl group include a benzene ring and a naphthalene ring. Furthermore, preferred examples of the substituent include a hydrocarbon group having 12 or fewer carbon atoms, a halogen atom, and an alkoxy group having 12 or fewer carbon atoms. $Y^1$ and $Y^2$ may be the same as or different from each other, and each represent a sulfur atom or a dialkylmethylene group having 12 or fewer carbon atoms. $R^3$ and $R^4$ may be the same as or different from each other, and each represent a hydrocarbon group having 20 or fewer carbon atoms, which may have a substituent. Preferred examples of the substituent include an alkoxy group having 12 or fewer carbon atoms, a carboxyl group, and a sulfo group. $R^5$, $R^6$, $R^7$ and $R^8$ may be the same as or different from one another, and each represent a hydrogen atom or a hydrocarbon group having 12 or fewer carbon atoms. From the viewpoint of the availability of the raw materials, the substituent is preferably a hydrogen atom. Furthermore, $Za^-$ represents a counter anion. When the cyanine dye represented by Formula (a) has an anionic substituent in a structure thereof and does not require neutralization of the charge, $Za^-$ is not necessary. Preferred examples of $Za^-$ include, from the viewpoint of the storage stability of the coating liquid for a recording layer, a halogen ion, a perchlorate ion, a tetrafluoroborate ion, a hexafluorophosphate ion, and a sulfonate ion, and particularly preferred examples thereof include a perchlorate ion, a hexafluorophosphate ion, and an arylsulfonate ion. Furthermore, it is particularly preferable that the cyanine dye does not contain a halogen ion as a counter ion.

Specific examples of the cyanine dye represented by Formula (a) that can be suitably used include the compounds described in paragraphs [0017] to [0019] of JP-A No. 2001-133969; and the compounds described in paragraphs [0016] to [0021] of JP-A No. 2002-023360 and paragraphs [0012] to [0037] of JP-A No. 2002-040638. Preferred examples thereof include the compounds described in paragraphs [0034] to [0041] of JP-A No. 2002-278057 and paragraphs [0080] to [0086] of JP-A No. 2008-195018, and most preferred examples thereof include the compounds described in paragraphs [0035] to [0043] of JP-A No. 2007-90850.

Furthermore, the compounds described in paragraphs [0008] to [0009] of JP-A No. H05-5005 and paragraphs [0022] to [0025] of JP-A No. 2001-222101 can also be preferably used.

These infrared absorbent dyes may be used singly, or two or more kinds may be used in combination. Infrared absorbers other than infrared absorbent dyes, such as pigments, may also be used in combination. Preferred examples of the pigment include the compounds described in paragraphs [0072] to [0076] of JP-A No. 2008-195018.

A preferred addition amount of the sensitizing dye is preferably in the range of from 0.05 parts by mass to 30 parts by mass, more preferably from 0.1 parts by mass to 20 parts by mass, and most preferably from 0.2 parts by mass to 10 parts by mass, with respect to 100 parts by mass of the total solid content of the photosensitive composition.

(B-4) Binder Polymer

The negative type photosensitive composition may contain a film-forming binder polymer having a structure different from the (A) specific polyurethane and the specific polyester in terms of structure, that is, a film-forming binder polymer that does not contain the partial structure represented by Formula (I-1) in the molecule, from the viewpoint of uniformity of the coating film.

As the binder polymer, a polymer which can support a photosensitive component on a support and can be removed by a developing liquid, is used. Examples of the binder polymer that may be used include a (meth)acrylic polymer, a polyurethane resin which does not contain the partial structure represented by Formula (I-1), a polyvinyl alcohol resin, a polyvinyl butyral resin, a polyvinylformal resin, a polyamide resin, a polyester resin which does not contain the partial structure represented by Formula (I-1), and an epoxy resin. Particularly, a (meth)acrylic polymer, a polyurethane resin which does not contain the partial structure represented by Formula (I-1), and a polyvinyl butyral resin are preferably used.

In the invention, the "(meth)acrylic polymer" refers to a copolymer having (meth)acrylic acid derivatives, as polymerization components, such as (meth)acrylic acid, (meth)acrylic acid esters (an alkyl ester, an aryl ester, an allyl ester or the like), (meth)acrylamide, and (meth)acrylamide derivatives. The "polyurethane resin" refers to a polymer produced by a condensation reaction of a compound having two or more isocyanate groups and a compound having two or more hydroxyl groups. The "polyvinyl butyral resin" refers to a polymer synthesized by reacting a polyvinyl alcohol that is obtained by saponifying a portion of or whole polyvinyl acetate, with butyl aldehyde under acidic conditions (acetalization reaction), and also includes polymers having an acid group introduced therein by a method of reacting a residual hydroxyl group with a compound having an acid group or the like.

A suitable example of the (meth)acrylic polymer in the invention may be, for example, a copolymer having a repeating unit containing an acid group. Examples of the acid group include a carboxylic acid group, a sulfonic acid group, a phosphonic acid group, a phosphoric acid group, and a sulfonamide group, and a carboxylic acid group is particularly preferred.

The proportion of the copolymerization component having a carboxylic acid group in all of the copolymerization components of the (meth)acrylic polymer is preferably from 1 mol % to 70 mol %, from the viewpoint that developability is further enhanced. In light of both developability and print durability, the proportion is more preferably from 1 mol % to 50 mol %, and particularly preferably from 1 mol % to 30 mol %.

The (meth)acrylic polymer used in the invention is preferably a polymer further having a crosslinking group. The crosslinking group as used herein is a group which induces crosslinking of a binder polymer in the course of a radical polymerization reaction that occurs in the recording layer when a planographic printing plate precursor is exposed. There are no particular limitations as long as a group has such a function, and examples thereof include an ethylenically unsaturated bonding group, an amino group, and an epoxy group, as a functional group capable of being subjected to an addition polymerization reaction. Also, a functional group which can be radical by light irradiation may also be used, and examples of such a crosslinking group include a thiol group and a halogen group. Among them, an ethylenically unsaturated bonding group is preferred. The ethylenically unsaturated bonding group is preferably a styryl group, a (meth)acryloyl group, or an allyl group.

When the binder polymer has a crosslinking group in the molecule, for example, a free radical (a polymerization initiating radical or a growing radical in the process of polymerization of a polymerizable compound) is added to the crosslinking-functional group, addition polymerization occurs between polymers directly or through a polymerization-chain of a polymerizable compound, whereby crosslinking occurs between the polymers to perform curing. Alternatively, an atom in the polymer (for example, a hydrogen atom on a carbon atom that is adjacent to the functional crosslinking group) is pulled out by a free radical to produce a polymer radical. When polymer radicals are bonded to each other, crosslinking occurs between polymers to perform curing. When a binder polymer having a crosslinking group in the molecule is used, curability of the negative type photosensitive composition is further enhanced.

The content of the crosslinking group in the case where the (meth)acrylic polymer has a crosslinking group is preferably from 0.01 mmol to 10.0 mmol, more preferably from 0.05 mmol to 9.0 mmol, and most preferably from 0.1 mmol to 8.0 mmol, per 1 gram of the binder polymer. The content of the crosslinking group according to the present specification is the content of an unsaturated double bond in a polymer which is capable of being radically polymerized and which is determined by iodine titration.

The (meth)acrylic polymer which may be used as a binder polymer in the photosensitive composition according to the invention may have at least any one of a polymerization unit having the acid group described above and a polymerization unit having a crosslinking group, and may also have other polymerization units, for example, a polymerization unit of a (meth)acrylic acid alkyl or aralkyl ester, a polymerization unit of (meth)acrylamide or a derivative thereof, a polymerization unit of α-hydroxymethylacrylate, and a polymerization unit of a styrene derivative.

The alkyl group of the (meth)acrylic acid alkyl ester is preferably an alkyl group having 1 to 5 carbon atoms, or an alkyl group having 2 to 8 carbon atoms and having the substituent described above, and a methyl group is more preferred.

Examples of the (meth)acrylic acid aralkyl ester include benzyl (meth)acrylate.

Examples of the (meth)acrylamide derivative include N-isopropylacrylamide, N-phenylmethacrylamide, N-(4-methoxycarbonylphenyl)methacrylamide, N,N-dimethylacrylamide, and morpholinoacrylamide.

Examples of the α-hydroxymethylacrylate include ethyl α-hydroxymethylacrylate and cyclohexyl α-hydroxymethylacrylate.

Examples of the styrene derivative include styrene and 4-tert-butylstyrene.

Suitable examples of the polyvinyl butyral resin that may be used as a binder polymer in the photosensitive composition according to the invention include the polyvinyl butyral resins described in paragraphs [0119] to [0120] of JP-A No. 2001-75279.

When the binder polymer has an acid group, a portion of the acid group may be neutralized with a basic compound. Examples of the basic compound include compounds containing basic nitrogen, alkali metal hydroxides, and quaternary ammonium salts of alkali metals.

The binder polymer is preferably a polymer having a mass average molecular weight of 5000 or more, and more preferably from 10,000 to 300,000. The binder polymer is preferably a polymer having a number average molecular weight of 1000 or more, and more preferably from 2000 to 250,000. The polydispersity (mass average molecular weight/number average molecular weight) is preferably from 1.1 to 10.

When the photosensitive composition according the invention contains a binder polymer, the binder polymer may be used singly, or two or more kinds may be mixed and used.

The content in the case of using a binder polymer in the photosensitive composition is preferably from 5% by mass to 75% by mass, more preferably from 10% by mass to 70% by mass, and even more preferably from 10% by mass to 60% by mass, with respect to the total solid content of the recording layer, from the viewpoints of favorable strength of an image part and image forming property.

Furthermore, the total content of the polymerizable compound and the binder polymer is preferably 90% by mass or less with respect to the total solid content of the recording layer. When the total content is more than 90% by mass, a decrease in sensitivity and a decrease in developability may occur. The total content is more preferably from 35% by mass to 80% by mass.

(B-5) Other Components Included in Negative Type Photosensitive Composition

The negative type photosensitive composition according to the invention may further contain various additives if necessary.

Examples of the additive include a surfactant that is used to promote developability and to enhance the morphology of the coated surface; a microcapsule that is used for achieving both developability and print durability; a hydrophilic polymer that is used to enhance developability or to enhance dispersion stability of microcapsules; a colorant or a printing-out agent that is used to visualize an image part and a non-image part; a polymerization inhibitor that is used to prevent unnecessary thermal polymerization of a radical polymerizable compound during the production or storage of the recording layer; a hydrophobic low-molecular weight compound such as a higher fat derivative that is used to prevent polymerization inhibition by oxygen; inorganic fine particles or organic fine particles that are used to increase the strength of cured coating films of an image part; a hydrophilic low-molecular weight compound that is used to enhance developability; a co-sensitizer or a chain transfer agent that is used to enhance sensitivity; and a plasticizer that is used to enhance plasticity.

Regarding all of these additives, known agents can be used, and for example, the compounds described in paragraphs [0161] to [0215] of JP-A No. 2007-206217, and the compounds described in paragraph [0067] of Japanese Patent Application National Publication (Laid-Open) No. 2005-509192 and paragraphs [0023] to [0026] and [0059] to [0066] of JP-A No. 2004-310000 can be used. In regard to the surfactant, the surfactants described below as surfactants that may be added to a developing liquid can also be used as additives of the photosensitive composition.

The negative type photosensitive composition preferably contains a chain transfer agent. The chain transfer agent is, for example, defined in *Kobunshi Jiten* (Polymer Dictionary) $3^{rd}$ Edition (edited by the Society of Polymer Science, Japan, 2005), p. 683-p. 684. As the chain transfer agent, for example, a group of compounds having SH, PH, SiH and GeH in the molecules are used. These are compounds capable of producing radicals by donating hydrogen to low-active radical species, or producing radicals by being oxidized and then deprotonated. In the recording layer in the invention, particularly thiol compounds (for example, 2-mercaptobenzimidazoles, 2-mercaptobenzothiazoles, 2-mercaptobenzoxazoles, 3-mercaptotriazoles, and 5-mercaptotetrazoles) can be preferably used as chain transfer agents.

A preferred addition amount of the chain transfer agent is preferably in the range of from 0.01 parts by mass to 20 parts by mass, more preferably from 1 part by mass to 10 parts by mass, and most preferably from 1 part by mass to 5 parts by mass, with respect to 100 parts by mass of the total solid content of the photosensitive composition.

<Positive Type Photosensitive Composition>

Next, the photosensitive component that is included in a positive type photosensitive composition is explained.

Regarding the photosensitive component in the case where the photosensitive composition according to the invention is a positive type photosensitive composition, any system that forms a known positive type photosensitive composition may be used. For example, a polarity conversion material system in which an exposed area changes from a hydrophobic state to a hydrophilic state; an acid catalyst decomposition system in which an exposed area is solubilized by an acid generated from an acid catalyst which is decomposed by light exposure; an interaction cancellation system in which an interaction between an alkali-soluble resin and a compound having dissolution inhibition property is cancelled by light exposure, whereby an exposed area is solubilized (also called heat-sensitive positive) can all be used. Among them, from the viewpoints of stability and sensitivity, it is preferable that at least the photosensitive composition according to the invention contain a water-insoluble and alkali-soluble resin, a compound which is capable of forming an interaction with the alkali-soluble resin and capable of suppressing dissolution (a representative example is an infrared absorber such as a cyanine dye), and contain a photosensitive component of the interaction cancellation system in which solubility in an alkali developing liquid in an exposed area is increased.

The positive type recording layer of an interaction cancellation system in the invention, which is an infrared-sensitive positive type recording layer, is a photosensitive composition which is configured to include a compound having dissolution inhibition property that is represented by an infrared absorber described below and a known water-insoluble and alkali-soluble resin, and is capable of forming a coating film having alkali-resistant developability by an interaction between the alkali-soluble resin and the compound having dissolution inhibition property. In this positive type photosensitive composition, the aforementioned interaction is cancelled in an infrared laser light-irradiated area, whereby the exposed area exhibits solubility to alkali developability; thus, an image is formed.

(B-6) Water-Insoluble and Alkali-Soluble Resin

In the invention, the term "alkali-soluble" means that an object is soluble in an aqueous alkali solution at pH 8.5 to 13.5 by a treatment for a standard development time. Furthermore, the term "water-insoluble" means that an object does not dissolve or swell in water at pH 6.0 to 8.0.

When a water-insoluble and alkali-soluble resin is contained, an interaction is formed between the dissolution inhibitor such as an infrared absorber and a polar group that the alkali-soluble resin has, and the composition becomes a composition having positive type photosensitivity.

General water-insoluble and alkali-soluble resins are described below in detail, but among these, preferred examples include polyamide resins, epoxy resins, polyacetal resins, acrylic resins, methacrylic resins, polystyrene-based resins, and novolac type phenolic resins.

The alkali-soluble resin that can be used in the invention is not particular limited as long as it has a characteristic of being dissolved when brought into contact with an alkaline developing liquid. Among such resins, homopolymers containing an acidic group in the main chain and/or a side chain of the polymer, copolymers thereof, or mixtures thereof are preferred.

As the alkali-soluble resin having an acidic group, it is preferable that the alkali-soluble resin have a functional group such as a phenolic hydroxyl group, a carboxyl group, a sulfonic acid group, a phosphoric acid group, a sulfonamide group, or an active imide group. Therefore, such a resin can be suitably produced by copolymerizing a monomer mixture which includes one or more ethylenically unsaturated monomers having the functional group described above.

Such a resin containing 10 mol % or more of a monomer having an acidic functional group that imparts alkali solubility may be used, and a resin containing 20 mol % or more of the monomer is more preferred. When the proportion of the copolymerization component of a monomer that imparts alkali solubility is 10 mol % or more, sufficient alkali solubility is obtained, and excellent developability is obtained.

As other polymerizable monomers that do not have an acidic functional group that can be used in the synthesis of an alkali-soluble resin, examples thereof include compounds described below:

alkyl acrylates and alkyl methacrylates such as methyl acrylate, ethyl acrylate, propyl acrylate, benzyl acrylate, methyl methacrylate, ethyl methacrylate, cyclohexyl methacrylate, and benzyl methacrylate; acrylic acid esters and methacrylic acid esters having an aliphatic hydroxyl group, such as 2-hydroxyethyl acrylate and 2-hydroxyethyl methacrylate; acrylamides and methacrylamides such as acrylamide, methacrylamide, N-methylacrylamide, N-ethylacrylamide, and N-phenylacrylamide; vinyl esters such as vinyl acetate, vinyl chloroacetate, vinyl butyrate, and vinyl benzoate; styrenes such as styrene, α-methylstyrene, methylstyrene, and chloromethylstyrene; other nitrogen atom-containing monomers such as N-vinylpyrrolidone, N-vinylpyridine, acrylonitrile, and methacrylonitrile; and maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide.

Among these other ethylenically unsaturated monomers, preferably used examples include (meth)acrylic acid esters, (meth)acrylamides, maleimides, and (meth)acrylonitrile.

Furthermore, preferably used examples of the alkali-soluble resin include novolac resins.

Preferred examples of the novolac resin that can be used in the invention include novolac resins such as a phenol formaldehyde resin, an m-cresol formaldehyde resin, a p-cresol formaldehyde resin, an m-/p-mixed cresol formaldehyde resin, a phenol/cresol (may be any of m-, p-, and m-/p-mixture) mixed formaldehyde resin; and pyrogallol acetone resins.

Further examples thereof include polycondensation reaction products of phenol having an alkyl group having 3 to 8 carbon atoms as a substituent and formaldehyde, such as a t-butylphenol formaldehyde resin and an octylphenol formaldehyde resin, as described in the specification of U.S. Pat. No. 4,123,279.

The phenol resin may be a resol resin.

The resol resin that is used in the invention is a resin obtained by condensing a phenol compound and an aldehyde compound under basic conditions.

Regarding the phenol compound described above, for example, phenol, m-cresol, p-cresol, o-cresol, and bisphenol A are preferably used. Examples of the aldehyde compound include formaldehyde. The phenol compounds and the aldehyde compounds can be used singly or in combination of two or more kinds Furthermore, the resol resin may be a resol resin obtained from a mixture of phenols described above and formaldehyde. In the case of obtaining the resol resin, the degree of condensation of phenols and formaldehyde, the molecular weight, the residual ratio of residual monomers, and the like may be selected according to the purpose.

The water-insoluble and alkali-soluble resin is preferably a resin having a weight average molecular weight of 2,000 or more and a number average molecular weight of 500 or more, and more preferably a resin having a weight average molecular weight of 5,000 to 300,000 and a number average molecular weight of 800 to 250,000. Also, the dispersity (weight average molecular weight/number average molecular weight) of the alkali-soluble resin is preferably from 1.1 to 10.

The alkali-soluble resin in the photosensitive composition according to the invention may be used singly, or two or more kinds may be used in combination.

The content of the alkali-soluble resin in the photosensitive composition according to the invention is preferably from 2.0% by mass to 99.5% by mass, more preferably from 10.0% by mass to 99.0% by mass, and even more preferably from 20.0% by mass to 90.0% by mass, with respect to the total solid content. When the addition amount of the alkali-soluble resin is in the range described above, the durability of the photosensitive layer (recording layer) of an unexposed part, and the sensitivity in an exposed part, that is, developability, are both excellent.

(B-7) Infrared Absorber

A preferable example of a compound which forms an interaction with the (B-6) water-insoluble and alkali-soluble resin to exhibit dissolution inhibition property may be, for example, an infrared absorber. The infrared absorber used in the invention is not particularly limited as long as it is a compound having dissolution inhibition property, and various dyes known as infrared absorbers can be appropriately selected and used. Furthermore, since the infrared absorber that is added for the purpose of enhancing the exposure sensitivity does not particularly require an interaction forming ability, for example, an infrared absorber which does not have an interaction forming ability, such as an infrared-absorptive pigment, may also be used in combination in addition to the infrared absorber having an interaction forming ability.

Regarding the infrared absorber that can be used in the invention, commercially available dyes and known agents described in documents (for example, "*Senryo Binran* (Handbook of Dyes)" (edited by the Society of Synthetic Organic Chemistry, Japan, annual of 1970) can be utilized. Specific examples thereof include dyes such as azo dyes, metal complex salt azo dyes, pyrazolone azo dyes, anthraquinone dyes, phthalocyanine dyes, carbonium dyes, quinoneimine dyes, methine dyes, and cyanine dyes.

In the invention, particularly preferred examples among these dyes include cyanine dyes, phthalocyanine dyes, oxonol dyes, squarylium dyes, pyrylium salts, thiopyrylium dyes, and nickel thiolate complexes. Furthermore, a dye which absorbs at least infrared light or near-infrared light is preferred from the viewpoint of being adequate for the use with a laser which emits infrared light or near-infrared light, and from such a point of view, cyanine dyes are particularly preferred. As the cyanine dyes, cyanine dyes represented by Formula (a) described above in detail in the section of Negative type photosensitive component (B-3) Sensitizing dye, or various exemplified cyanine dyes are preferably used as the infrared absorbers according to the present exemplary embodiment.

A preferred addition amount of the infrared absorber in the positive type photosensitive composition is preferably from 0.01% by mass to 50% by mass, more preferably 0.1% by mass to 30% by mass, and particularly preferably from 1.0% by mass to 30% by mass, with respect to the total solid content. When the addition amount is in the range described above, high sensitivity is obtained, the recording layer thus formed acquires favorable uniformity, and the coating film has excellent durability.

(B-8) Other Components that are Included in Positive Type Photosensitive Composition In the positive type photosensitive composition according to the invention, various additives can be further contained as necessary.

For example, an acid generator may be used together in order to enhance sensitivity. When an acid generator is used in combination, acid is generated at the exposed part, and the solubility to an aqueous alkali solution of an infrared-sensitive positive type recording layer in which interaction is cancelled is further increased. Examples of the acid generator include the onium salts.

A preferred addition amount in the case of adding an acid generator is in the range of from 0.01% by mass to 50% by mass, preferably from 0.1% by mass to 40% by mass, and more preferably from 0.5% by mass to 30% by mass, with respect to the total solid content. When the addition amount is in the range described above, an increase in sensitivity, which is an effect of adding an acid generator, is seen, and also, generation of residual film in a non-image part is suppressed.

In the positive type photosensitive composition according to the invention, an acid proliferation agent may be contained.

The acid proliferation agent according to the invention is a compound that is substituted with a residue of a relatively strong acid, and is a compound which is easily detached in the presence of an acid catalyst to freshly generates acid. That is, the compound is decomposed by an acid catalysis reaction, and generates acid (hereinafter, described by general formula: ZOH) again. One or more acid is increased by one reaction, and as the acid concentration increases acceleratedly along with the progress of the reaction to increase sensitivity dramatically. The strength of the acid generated by the acid proliferation agent is 3 or less in terms of the acid dissociation constant (pKa). Furthermore, the acid dissociation constant (pKa) is preferably 2 or less. If the acid generated by the acid proliferation agent is a weak acid having an acid dissociation constant (pKa) of greater than 3, a detachment reaction by an acid catalyst cannot occur.

Examples of the acid that is used as such an acid proliferation agent include dichloroacetic acid, trichloroacetic acid, methanesulfonic acid, ethanesulfonic acid, benzenesulfonic acid, p-toluenesulfonic acid, naphthalenesulfnoic acid, and phenylsulfonic acid.

The addition amount in the case of adding an acid proliferation agent is in the range of from 0.01% by mass to 20% by mass, preferably from 0.01% by mass to 10% by mass, and more preferably from 0.1% by mass to 5% by mass, in terms of solid content. When the addition amount of the acid proliferation agent is in the range described above, the effect of adding an acid proliferation agent is sufficiently obtained, an increase in sensitivity is achieved, a decrease in film strength of an image part is suppressed, whereby excellent film strength attributable to the specific polyurethane is maintained.

In the positive type photosensitive composition, development accelerators such as acid anhydrides, phenols and organic acids may be added for the purpose of increasing sensitivity.

Furthermore, nonionic surfactants described in JP-A Nos. S62-251740 and H03-208514; amphoteric surfactants described in JP-A Nos. S59-121044 and H04-13149; and copolymers containing fluorine-containing monomers as copolymerization components that are described in JP-A Nos. S62-170950, H11-288093 and 2003-57820 can be added for the purpose of improving coatability of the positive type photosensitive composition-coating liquid, or for the purpose of enhancing the stability of a treatment of a formed positive type photosensitive recording layer under the development conditions.

The addition amount of the surfactant is preferably from 0.01% by mass to 15% by mass, more preferably from 0.01% by mass to 5% by mass, and even more preferably from 0.05% by mass to 2.0% by mass, with respect to the total solid content.

Furthermore, a printing-out agent for obtaining a visible image immediately after heating by exposure, or a dye or a pigment as an image colorant can be added.

The printing-out agent and the colorant are described in, for example, paragraphs [122] to [0123] of JP-A No. 2009-229917 in detail, and the compounds described herein can also be applied to the invention.

In the positive type photosensitive composition, compounds such as a plasticizer for imparting flexibility or the like of the coating film, and a wax agent for decreasing the coefficient of static friction of a surface for the purpose of imparting resistance to damage, may also be added.

<Planographic Printing Plate Precursor>

The photosensitive composition according to the invention is preferably used as a recording layer of a planographic printing plate precursor. The planographic printing plate precursor according to the invention has, on a support, a recording layer containing the photosensitive composition according to the invention.

The recording layer in the planographic printing plate precursor according to the invention is formed by dispersing or dissolving the various aforementioned components needed for the recording layer in a solvent to prepare a coating liquid, applying the coating liquid to a support, and drying the coating liquid. Examples of the solvent that is used herein include, but are not limited to, methyl ethyl ketone, ethylene glycol monomethyl ether, 1-methoxy-2-propanol, 2-methoxyethyl acetate, 1-methoxy-2-propyl acetate, and γ-butyrolactone. These solvents are used singly or as mixtures. The solid content concentration of the coating liquid is preferably from 1% by mass to 50% by mass.

[Negative Type Photosensitive Planographic Printing Plate Precursor]

First, a planographic printing plate precursor having a negative type recording layer is explained.

The negative type recording layer is formed by dissolving the negative type photosensitive composition in a solvent, and applying the solution to a support.

The amount of coating (solid content) of the recording layer to the support that is obtained after application and drying is preferably from 0.3 g/m² to 3.0 g/m².

Regarding the coating method, various methods can be used. Examples thereof include bar coater coating, rotation coating, spray coating, curtain coating, dip coating, air knife coating, blade coating, and roll coating.

<Protective Layer>

It is preferable that the planographic printing plate precursor according to the invention has a protective layer (oxygen blocking layer) on the recording layer, in order to block the diffusive intrusion of oxygen that interrupts the polymerization reaction at the time of exposure. Regarding the material that can be used in the protective layer, any of water-soluble polymers and water-insoluble polymers can be appropriately selected and used. These water-soluble or water-insoluble polymers may be used singly, or if necessary, two or more kinds may be mixed and used.

Specific examples of the water-soluble or water-insoluble polymers used in the recording layer include polyvinyl alcohol, modified polyvinyl alcohol, polyvinylpyrrolidone, water-soluble cellulose derivatives, and poly(meth)acrylonitrile. Among these, it is preferable to use a water-soluble polymer compound having relatively favorable crystallinity, and specifically, using polyvinyl alcohol as a main component provides most favorable results in the essential characteristics such as oxygen blocking properties and development removability.

The polyvinyl alcohol used in the protective layer may have a portion substituted with an ester, an ether and acetal, as long as the polyvinyl alcohol contains an unsubstituted vinyl alcohol unit to acquire necessary oxygen blocking properties and water-solubility. Furthermore, similarly, the polyvinyl alcohol may also have other copolymerization components in a portion. Polyvinyl alcohol may be obtained by hydrolyzing polyvinyl acetate, and a specific example of polyvinyl alcohol may include a polyvinyl alcohol that is hydrolyzed at a proportion of 69.0 mol % to 100 mol % and has 300 to 2400 polymerization repeating units.

Specific examples include PVA-102, PVA-103, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-235, PVA-217EE, PVA-217E, PVA-220E, PVA-224E, PVA-403, PVA-405, PVA-420, PVA-424H, PVA-505, PVA-617, PVA-613, PVA-706, and L-8, all manufactured by Kuraray Co., Ltd., and these may be used singly or mixed and used. According to a preferred embodiment, the content ratio of polyvinyl alcohol in the protective layer is 20% by mass to 95% by mass, and more preferably 30% by mass to 90% by mass.

Furthermore, known modified polyvinyl alcohols can also be preferably used. Particularly, an acid-modified polyvinyl alcohol having a carboxylic acid group or a sulfonic acid group is preferably used. Specific examples of polyvinyl alcohol that is suitably used in the invention include the polyvinyl alcohols described in JP-A Nos. 2005-250216 and 2006-259137.

In the formation of the protective layer, when unmodified polyvinyl alcohol and a material different from the unmodified polyvinyl alcohol are mixed and used, the component to be mixed is preferably a modified polyvinyl alcohol, polyvinylpyrrolidone, or a modification product thereof, from the viewpoints of oxygen blocking properties and development removability. The content ratio of the material that is different from the unmodified polyvinyl alcohol in the protective layer is 3.5% by mass to 80% by mass, preferably 10% by mass to 60% by mass, and more preferably 15% by mass to 30% by mass.

Furthermore, it is also preferable to contain an inorganic lamellar compound into the protective layer for the planographic printing plate precursor according to the invention, for the purpose of enhancing the oxygen blocking properties or the properties of protecting the recording layer surface. Among inorganic lamellar compounds, fluorine-based swellable synthetic mica, which is a synthetic inorganic lamellar compound, is particularly useful. Specifically, the inorganic lamellar compounds described in JP-A No. 2005-119273 may be suitably used in the invention.

The amount of coating of the protective layer is, in terms of the amount of coating after drying, preferably in the range of 0.05 g/m² to 10 g/m², and in the case where the protective layer contains an inorganic lamellar compound, the amount of coating is more preferably in the range of 0.1 g/m² to 5 g/m². In the case where the protective layer does not contain an inorganic lamellar compound, the amount of coating is more preferably in the range of 0.5 g/m² to 5 g/m².

[Support]

The support that is used in the planographic printing plate precursor according to the invention is not particularly limited, as long as it may be a hydrophilic support having a dimensionally stable plate shape. Particularly, an aluminum plate is preferred.

Before an aluminum plate is used, it is preferable to performing surface treatments such as a surface roughening treatment and an anodic oxidation treatment. The surface roughening treatment of the aluminum plate surface is carried out by various methods, and example thereof include a mechanical surface roughening treatment, an electrochemical surface roughening treatment (a surface roughening treatment of electrochemically dissolving the surface), and a chemical surface roughening treatment (a surface roughening treatment of chemically selectively dissolving the surface). Regarding these treatments, the methods described in paragraphs [0241] to [0245] of JP-A No. 2007-206217 can be preferably used.

The support in which the center line mean roughness is 0.10 μm to 1.2 μm is preferable. When the roughness is in this range, favorable adhesiveness to the recording layer, favorable print durability, and favorable anti-contamination are obtained.

Furthermore, the color density of the support is preferably 0.15 to 0.65 in terms of the reflection density value. When the color density is in this range, favorable image formability caused by the prevention of halation at the time of image exposure and favorable plate inspectability after development are obtained.

The thickness of the support is preferably 0.1 mm to 0.6 mm, more preferably 0.15 mm to 0.4 mm, and even more preferably 0.2 mm to 0.3 mm.

[Support-Hydrophilization Treatment and Undercoat Layer]

For the planographic printing plate precursor according to the invention, it is also preferable to carry out a hydrophilization treatment of the support surface, and to provide an undercoat layer between the support and the recording layer, in order to enhance hydrophilicity of non-image area, thereby preventing print contamination.

Examples of the hydrophilization treatment of the support surface include a method of treating the support by immersing in an aqueous solution of sodium silicate or the like; an alkali metal silicate treatment method of electrolytically treating the support using an aqueous solution of sodium silicate or the like; a method of treating the support with potassium fluorozirconate; and a method of treating the support with polyvinylphosphonic acid. Among them, a method of treating the support by immersing in an aqueous solution of polyvinylphosphonic acid is preferably used.

As the undercoat layer, an undercoat layer containing a compound having an acid group such as phosphonic acid, phosphoric acid or sulfonic acid is preferably used. The compound having an acid group that is used in the formation of the undercoat layer is preferably a compound further having a polymerizable group, in order to enhance the adhesiveness to the recording layer. The polymerizable group is preferably an ethylenically unsaturated bond group. Furthermore, a compound having a hydrophilicity-imparting group such as an ethyleneoxy group may also be used as a suitable compound.

The compound used for the formation of the undercoat layer may be a low molecular weight compound or may be a high molecular weight polymer. Also, these compounds may be used singly, or if necessary, two or more kinds may be mixed and used.

The undercoat layer is coated by a known method. The amount of coating (solid content) of the undercoat layer is preferably 0.1 m g/m² to 100 mg/m², and more preferably 1 mg/m² to 30 mg/m².

[Backcoat Layer]

After the support is subjected to a surface treatment or an undercoat layer is formed, if necessary, a backcoating may be provided on the back surface of the support.

As the backcoating, suitable examples thereof include coating layers formed from the organic polymer compounds described in JP-A No. H05-45885, or from the metal oxides that are obtained by hydrolysis and polycondensation of the organic metal compounds or inorganic metal compounds described in JP-A No. H06-35174. Among them, it is preferable to use alkoxy compounds of silicon such as $Si(OCH_3)_4$, $Si(OC_2H_5)_4$, $Si(OC_3H_7)_4$, and $Si(OC_4H_9)_4$, from the viewpoint that the raw materials are easily available at low cost.

[Positive Type Photosensitive Planographic Printing Plate Precursor]

Next, the planographic printing plate precursor having a positive type recording layer is explained.

A positive type recording layer is formed by dissolving the positive type photosensitive composition in a solvent, and applying the solution to a support or an undercoat layer formed on the support. The positive type recording layer may be a single layer, or may have a multilayered structure. From the viewpoint of enhancing stability by a development treatment and suppressing residual film of a non-image part, a positive type recording layer which is a multilayer-structured recording layer having a lower layer containing an alkali-soluble resin and an upper layer containing a water-insoluble and alkali-soluble resin, and contains an infrared absorber in at least one layer of the upper layer and the lower layer, is preferred.

That is, when a lower layer having high alkali-solubility is provided near the support as a multilayered recording layer, there is an advantage that when the upper layer is removed by exposure, the lower layer suppresses the occurrence of residual film due to its high alkali-solubility, and thus the development latitude is improved.

When a positive type recording layer having a multilayer structure is provided, the specific polyurethane according to the invention may be contained in at least one of the upper layer and the lower layer, and excellent effects according to the invention are exhibited in both cases.

As the support that is used in the positive type photosensitive planographic printing plate precursor, the same support as that described in connection with the negative type planographic printing plate precursor is used, and the same also applies to preferred embodiments.

Regarding the method of forming the lower layer, a method of preparing a coating liquid for a lower layer formation containing an alkali-soluble resin, an infrared absorber and various additives, which are used in combination as necessary, applying the liquid onto a support or an undercoated support, and drying the coating liquid, is described. When the lower layer contains the (A) specific polyurethane, it is preferable that the lower layer further contain an infrared absorber.

The other alkali-soluble resin that is included in the lower layer of the recording layer in the invention may be used singly, or two or more kinds may be used in combination.

Regarding the content of the alkali-soluble resin with respect to the total solid content of the lower layer in the invention, the resin is used in an addition amount of 0.1% by mass to 98% by mass.

The addition amount when an infrared absorber is added to the lower layer is preferably from 0.01% by mass to 50% by mass, more preferably from 0.1% by mass to 30% by mass, and particularly preferably from 1.0% by mass to 30% by mass, with respect to the total solid content of the lower layer.

A preferred content in the case where the lower layer contains the (A) specific polyurethane is appropriately selected depending on the characteristics of the (A) specific polyurethane, and the content is preferably in the range of 0.1% by mass to 95% by mass, and more preferably 50% by mass to 90% by mass.

The upper layer of the image forming layer in the invention is preferably an infrared-sensitive positive type recording layer in which solubility to an aqueous alkali solution is enhanced by exposure with infrared laser light.

There are no particular limitations on the mechanism that solubility to an aqueous alkali solution is enhanced by heat in the upper layer, and any upper layer can be used as long as it contains a binder resin and the solubility of a heated area is increased. Regarding the heat utilized for image formation, examples thereof include the heat generated in the case where the lower layer containing an infrared absorber is exposed, and the heat generated by an infrared absorber contained in the upper layer.

Examples of the upper layer include a layer containing an alkali-soluble resin which has a hydrogen bonding ability, such as novolac or urethane; a layer containing a water-insoluble and alkali-soluble resin and a compound which has a dissolution inhibitory function; and a layer containing a compound which is capable of ablation.

When an infrared absorber is added to the upper layer, the heat generated in the upper layer can also be used for image formation. Regarding the configuration of the upper layer containing an infrared absorber, examples thereof include a layer containing an infrared absorber, a water-insoluble and alkali-soluble resin, and a compound having a dissolution inhibitory action; and a layer containing an infrared absorber, a water-insoluble and alkali-soluble resin, and a compound which generates acid by heat. In the case of the former configuration, when the infrared absorber is a compound which forms an interaction with an alkali-soluble resin to have a dissolution inhibitory function, it is not necessary to separately use a compound having dissolution inhibition property.

The alkali-soluble resin in the upper layer of the image recording material in the invention may be used singly, or two or more kinds may be used in combination.

The content of the alkali-soluble resin with respect to the total solid content of the upper layer in the invention is preferably from 2.0% by mass to 99.5% by mass, more preferably from 10.0% by mass to 99.0% by mass, and even more preferably from 20.0% by mass to 90.0% by mass, with respect to the total solid content.

A preferred content in the case where the upper layer contains the (A) specific polyurethane is appropriately selected depending on the characteristics of the (A) specific polyurethane, and the content is preferably in the range of 0.1% by mass to 90% by mass, and more preferably 5% by mass to 80% by mass.

The positive type recording layer in the positive type planographic printing plate precursor according to the invention can be generally formed by dissolving the various components described above in a solvent, and applying the solution onto an appropriate support. Furthermore, in the case that the recording layer has a multilayer structure, the lower layer and the upper layer can also be respectively formed by dissolving the various necessary components in a solvent, and applying the solution onto an appropriate support.

Examples of the solvent used herein include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, and toluene. These solvents are used singly or mixed and used.

When a recording layer has a multilayer structure, it is preferable to principally form two layers of the lower layer and the upper layer separately.

As the method for forming two layers separately, examples thereof include a method of utilizing the difference in solvent solubility between the components contained in the lower layer and the components contained in the upper layer. In the invention, since the (A) polymer having a salt structure formed by a monovalent basic compound and a carboxylic acid group in the molecule is used in the lower layer, compatibility at the interface between layers is effectively suppressed.

As other methods of forming two layers separately, examples thereof include a method of applying the upper layer and then rapidly drying and removing the solvent. By using this method in combination, separation between layers can be carried out more favorably.

Hereinafter, these methods are described in detail, but the method of applying two layers separately is not intended to be limited to these.

As the method of utilizing the difference in solvent solubility between the components contained in the lower layer and the components contained in the upper layer, a method of using a solvent system in which all of the components contained in the lower layer are insoluble, at the time of applying a coating liquid for an upper layer. By this method, even when two-layer coating is performed, the respective layers can be clearly separated into coating films. For example, components that are insoluble in a solvent such as methyl ethyl ketone or 1-methoxy-2-propanol, which dissolves the alkali-soluble resin that is an upper layer component, are selected as the lower layer components, a lower layer is applied using a solvent system which dissolves the lower layer components and is dried, subsequently the upper layer containing an alkali-soluble resin as a main component is dissolved in methyl ethyl ketone or 1-methoxy-2-propanol, and is applied and dried, whereby two-layer formation can be made.

Next, as the method of applying a second layer (upper layer) and then drying the solvent very rapidly, the process can be achieved by spraying high pressure air through slit nozzles that are provided almost perpendicular to the running direction of the web, by providing, from a lower side of the web, heat energy as conductive heat using the roll (heating roll) in which a heating medium such as steam is supplied therein, or by a combination of these methods.

The amount of coating after drying of the lower layer components that are applied onto the support of the planographic printing plate precursor according to the invention is preferably in the range of 0.5 g/m$^2$ to 4.0 g/m$^2$, and more preferably in the range of 0.6 g/m$^2$ to 2.5 g/m$^2$. When the amount of coating is 0.5 g/m$^2$ or more, excellent print durability is obtained, and when the amount of coating is 4.0 g/m$^2$ or less, excellent image reproducibility and sensitivity are obtained.

Furthermore, the amount of coating after drying of the upper layer components is preferably in the range of 0.05 g/m$^2$ to 1.0 g/m$^2$, and more preferably in the range of 0.08 g/m$^2$ to 0.7 g/m$^2$. When the amount of coating is 0.05 g/m$^2$ or more, excellent development latitude and scratch resistance are obtained, and when the amount of coating is 1.0 g/m$^2$ or less, excellent sensitivity is obtained.

In the case of a single-layered recording layer, the amount of coating after drying of combined lower layer and upper layer is preferably in the range of 0.6 g/m$^2$ to 4.0 g/m$^2$, and more preferably in the range of 0.7 g/m$^2$ to 2.5 g/m$^2$. When the amount of coating is in the range described above, a planographic printing plate having excellent image formability at the time of recording and excellent sensitivity and having an image part with excellent print durability is obtained.

[Platemaking Method]

A planographic printing plate is produced by exposing imagewise the planographic printing plate precursor according to the invention and performing a development treatment.

<Exposure Process>

The method for platemaking a planographic printing plate precursor in the invention includes an exposure process of exposing imagewise the planographic printing plate precursor according to the invention.

The light source of the active light ray used in the imagewise exposure of the planographic printing plate precursor is preferably a light source having an emission wavelength in the range of from near-infrared to infrared light, and more preferably a solid laser or a semiconductor laser. Among them, in the invention, it is particularly preferable that imagewise exposure is performed by a solid laser or a semiconductor laser which emits infrared light having a wavelength of 750 nm to 1,400 nm.

The power output of the laser is preferably 100 mW or greater, and in order to shorten the exposure time, it is preferable to use a multibeam laser device. Also, it is preferable that the exposure time per pixel is 20 peconds or less.

The dose of the energy irradiated to the planographic printing plate precursor is preferably 10 mJ/cm$^2$ to 300 mJ/cm$^2$. When the energy dose is in the range described above, curing proceeds sufficiently, and laser ablation is suppressed, so that damage of images can be prevented.

Regarding the exposure in the invention, exposure can be carried out by overlapping light beams of a light source. The overlap means that the vertical scanning pitch width is smaller than the beam diameter. The overlap can be quantitatively expressed, for example, FWHM/vertical scanning pitch width (overlap coefficient), when the beam diameter is expressed as the full width at half maximum (FWHM) of the beam intensity. In the invention, this overlap coefficient is preferably 0.1 or greater.

There are no particular limitations on the scanning method of the light source of an exposure apparatus that can be used in the invention, and a cylindrical outer surface scanning method, a cylindrical inner surface scanning method, a plane surface scanning method, and the like can be used. Furthermore, the channel of the light source may be a single channel or a multi-channel and, in the case of the cylindrical outer surface method, a multi-channel is preferably used.

<Development Process>

Platemaking of the planographic printing plate precursor in the invention includes a development process of performing development using an aqueous alkali solution at pH 8.5 to 10.8.

The aqueous alkali solution at pH 8.5 to 10.8 that is used in the development process (hereinafter, referred to as "developing liquid") is an aqueous alkali solution at pH 8.5 to 10.8, and more preferably pH 9.0 to 10.0. Furthermore, the developing liquid preferably contains a surfactant, and more preferably contains at least an anionic surfactant or a nonionic surfactant. The surfactant contributes to an enhancement of treatability. Also, a water-soluble polymer compound may also be contained.

Regarding the surfactant used in the developing liquid, anionic, nonionic, cationic and amphoteric surfactants can all be used, and anionic and nonionic surfactants are preferred.

There are no particular limitations on the anionic surfactant that is used in the developing liquid in the invention, and examples thereof include fatty acid salts, abietic acid salts, hydroxyalkanesulfonic acid salts, alkanesulfonic acid salts, dialkylsulfosuccinic acid salts, straight-chained alkylbenzenesulfonic acid salts, branched alkylbenzenesulfonic acid salts, alkylnaphthalenesulfonic acid salts, alkyldiphenyl ether (di)sulfonic acid salts, alkylphenoxypolyoxyethylene alkylsulfonic acid salts, polyoxyethylene alkylsulfophenyl ether salts, N-alkyl-N-oleyltaurin sodium salts, N-alkylsulfosuccinic acid monoamide disodium salts, petroleum sulfonic acid salts, sulfated castor oil, sulfated beef tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkyl phenyl ether sulfuric acid ester salts, polyoxyethylene styryl phenyl ether sulfuric acid ester salts, alkylphosphoric acid ester salts, polyoxyethylene alkyl ether phosphoric acid ester salts, polyoxyethylene alkyl phenyl ether phosphoric acid ester salts, partial saponification products of styrene-maleic anhydride copolymers, partial saponification products of olefin-maleic anhydride copolymers, and naphthalenesulfonic acid salt-formalin condensates. Among these, alkylbenzenesulfonic acid salts, alkylnaphthalenesulfonic acid salts, and alkyl diphenyl ether (di)sulfonic acid salts are particularly preferably used.

There are no particular limitations on the nonionic surfactant that is used in the developing liquid in the invention, and examples thereof include higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of oils and fats, and polypropylene glycol ethylene oxide adducts, of polyethylene glycol type, dimethylsiloxane-ethylene oxide block copolymers, dimethylsiloxane-(propylene oxide-ethylene oxide) block copolymers; fatty acid esters of glycerol of polyhydric alcohol type; fatty acid esters of pentaerythritol, fatty acid esters of sorbitol and sorbitan; fatty acid esters of sucrose, alkyl ethers of polyhydric alcohols; and fatty acid amides of alkanolamines. Among these, compounds having an aromatic ring and an ethylene oxide chain are preferred, and alkyl-substituted or unsubstituted phenol ethylene oxide adducts or alkyl-substituted or unsubstituted naphthol ethylene oxide adducts are more preferred.

Two or more kinds surfactants may be used, and the ratio of the surfactant contained in the developing liquid is preferably 0.01% by mass to 20% by mass, and more preferably 0.1% by mass to 10% by mass.

Furthermore, examples of the water-soluble polymer compound used in the developing liquid in the invention include soybean polysaccharides, modified starches, gum arabic, dextrin, cellulose derivatives (for example, carboxymethyl cellulose, carboxyethyl cellulose, and methyl cellulose) and modification products thereof, pullulan, polyvinyl alcohol and derivatives thereof, polyvinylpyrrolidone, polyacrylamide and acrylamide copolymers, vinyl methyl ether/maleic anhydride copolymers, vinyl acetate/maleic anhydride copolymers, styrene/maleic anhydride copolymers, polyvinylsulfonic acid and salts thereof, and polystyrenesulfonic acid and salts thereof.

Two or more kinds of water-soluble polymer compounds can be used in combination. The content of the water-soluble polymer compound in the developing liquid is preferably 0.1% by mass to 20% by mass, and more preferably 0.5% by mass to 10% by mass.

The developing liquid used in the invention may further contain a pH buffer agent.

As the pH buffer agent in the invention, any buffer agent can be used without particular limitations as long as it exhibits a buffering action at pH 2 to 11. In the invention, a weakly alkaline buffer agent is preferably used, and examples thereof include a (a) carbonate ion and a hydrogen carbonate ion, a (b) borate ion, a (c) water-soluble amine compound and ions of amine compounds, and combinations thereof. That is, for example, a combination of (a) the carbonate ion-hydrogen carbonate ion, (b) the borate ion, or (c) a combination of the water-soluble amine compound-ion of the amine compound exhibits a pH buffering action in the developing liquid, and even when the developing liquid is used for a long time, change in pH can be suppressed, and a decrease in developability caused by change in pH, generation of development residue, and the like can be suppressed. A particularly preferred agent is a combination of a carbonate ion and a hydrogen carbonate ion.

In order to contain a carbonate ion and a hydrogen carbonate ion in the developing liquid, a carbonate salt and a hydrogen carbonate salt may be added to the developing liquid, or a carbonate ion and a hydrogen carbonate ion may be generated by adding a carbonate salt or a hydrogen carbonate salt and then adjusting the pH. There are no particular limitations on the carbonate salt and the hydrogen carbonate salt, and the salts are preferably alkali metal salts. Examples of the alkali metal include lithium, sodium, and potassium, and sodium is particularly preferred. These may be used singly, or two or more kinds may be used in combination.

When the combination of a (a) carbonate ion and a hydrogen carbonate ion is employed as the pH buffer agent, the total amount of the carbonate ion and the hydrogen carbonate ion is preferably from 0.05 mol/L to 5 mol/L, more preferably from 0.07 mol/L to 2 mol/L, and particularly preferably from 0.1 mol/L to 1 mol/L, with respect to the total mass of the aqueous solution.

Furthermore, the developing liquid may also contain an organic solvent. When the developing liquid contains an organic solvent, the concentration of the solvent is preferably less than 40% by mass from the viewpoints of safety and flammability.

The developing liquid can contain an antiseptic agent, a chelate compound, a defoaming agent, an organic acid, an inorganic acid, an inorganic salt and the like, in addition to the components described above. Specifically, the compounds described in paragraphs [0266] to [0270] of JP-A No. 2007-206217 can be preferably used.

The developing liquid described above can be used as a developing liquid and a developer replenishing liquid of an exposed planographic printing plate precursor, and it is preferable that the developing liquid be applied to an automatic processing machine. When development is performed using an automatic processing machine, since the developing liquid is fatigued according to the throughput, the processing ability may be recovered using a replenishing liquid or a fresh developing liquid described below.

The temperature of development is not particularly limited as long as it is capable of performing development, but the temperature is preferably 60° C. or lower, and more preferably 15° C. to 40° C. In the development treatment using an automatic processing machine, since there are cases in which the developing liquid is fatigued according to the throughput, the processing capability may be recovered by using a replenishing liquid or a fresh developing liquid. As an example of the development and processing after development, a method of performing alkali development, removing alkali by a postwater washing process, performing a gum treatment by a gum drawing process, and drying by a drying process may be mentioned as an example. Furthermore, as another example, a method of performing pre-water washing, development, and gum drawing simultaneously by using an aqueous solution containing a carbonate ion, a hydrogen carbonate ion and a a surfactant may be mentioned as a preferred example. Therefore, in particular, the pre-water washing process is not necessarily performed, and it is preferable to perform the pre-water washing, development and gum drawing by using a single liquid only in a single bath, and then performing a drying process. After the development, it is preferable to perform drying after removing an excess developing liquid using a squeeze roller or the like.

The development process can be suitably carried out using an automatic processing machine equipped with a rubbing member. Examples of the automatic processing machine include the automatic processing machine described in JP-A Nos. H02-220061 and S60-59351, which performs a rubbing treatment while conveying a planographic printing plate precursor after imagewise exposure; and the automatic processing machine described in U.S. Pat. Nos. 5,148,746 and 5,568,768, and U.K. Patent No. 2297719, which performs a rubbing treatment on a planographic printing plate precursor after imagewise exposure that is mounted on a cylinder, while rotating the cylinder. Among them, an automatic processing machine using a rotating brush roll as the rubbing member is particularly preferred.

After the development process, it is preferable to provide a continuous or non-continuous drying process. Drying is carried out using hot air, infrared radiation, far-infrared radiation, or the like.

The automatic processing machine that is suitably used in the method for platemaking a planographic printing plate is preferably an apparatus having a developing unit and a drying unit, and a planographic printing plate precursor is subjected to development and gum drawing in the development bath, and then is dried in the drying unit to obtain a planographic printing plate.

Furthermore, the printing plate obtained after development may also be heated under very severe conditions, for the purpose of enhancing print durability or the like. The heating temperature is generally in the range of 200° C. to 500° C. When the temperature is low, a sufficient image reinforcing effect is not obtained, and when the temperature is too high, there is a risk in which problems such as deterioration of the support and thermal decomposition of an image part occur.

A planographic printing plate thus obtained in this manner is mounted on an offset printing machine and is suitably used for the printing of a large number of sheets.

Since the recording layer in the planographic printing plate precursor according to the invention contains the (A) specific polyurethane, an image part thus formed have excellent durability and solvent resistance. Also, since the developability of an uncured part is favorable, and the occurrence of residual film is suppressed, a planographic printing plate which can give a large number of sheets of high quality printed matters without contamination in the non-image part, is obtained.

EXAMPLES

Hereinafter, the present invention is described in detail by way of Examples, but the invention is not intended to be limited to these.

Synthesis Example 1

Synthesis of (a) Specific Diol Compound a-14

In a 1-L three-necked flask, 9.3 g of DL-pantoyllactone (manufactured by Tokyo Chemical Industry Co., Ltd.), 80.0 g of acetonitrile (manufactured by Wako Pure Chemical Industries, Ltd.), and 10.0 g of 6-aminohexanoic acid (manufactured by Wako Pure Chemical Industries, Ltd.) were weighed, and the mixture was heated and stirred at 80° C. for 6 hours. The reaction solution thus obtained was cooled to a room temperature, and 15.2 g of a white powder precipitated was collected by filtration. It was confirmed by NMR, LC-MS and IR that the white powder thus obtained was the Exemplary Compound (a)-14.

Synthesis Example 2

Synthesis of (A) Specific Polyurethane PU-14

In a 500-mL three-necked flask equipped with a condenser and a stirrer, 10.2 g of the (a) specific diol compound [(a)-14] obtained in Synthesis Example 1, 245.0 g of N,N-dimethylacetamide (manufactured by Wako Pure Chemical Industries, Ltd.), and 14.9 g of dimethylolpropionic acid (manufactured by Tokyo Chemical Industry Co., Ltd.) were weighed. Into the reaction solution which had been stirred at a room temperature, 5.2 g of hexamethylene diisocyanate (manufactured by Wako Pure Chemical Industries, Ltd.), 30.9 g of diphenylmethane diisocyanate (manufactured by Nippon Polyurethane Industry Co., Ltd.), and 0.37 g of NEOSTANN U-600 (manufactured by Nitto Chemical Industry Co., Ltd.) were introduced, and the mixture was stirred while heated at 80° C. for 4 hours. Subsequently, 5.0 g of methanol was added thereto to terminate the reaction. The reaction solution was introduced into 4 L of distilled water while stirring to precipitate a white polymer was precipitated. The polymer was separated by filtration, washed with water, and dried in a vacuum, whereby 55.0 g of a polyurethane resin (PU-28) according to the invention was collected. It was confirmed by NMR and IR that the white powder thus obtained was the (A) specific polyurethane (PU-14) (Exemplary Compound PU-14 described above). Also, the weight average molecular weight was measured using GPC (in terms of polystyrene).

Synthesis Example 3

Synthesis of (a) Specific Diol Compound (a)-28

In a 1-L three-necked flask, 130.0 g of DL-pantoyllactone (manufactured by Tokyo Chemical Industry Co., Ltd.), 530.0 g of acetonitrile (manufactured by Wako Pure Chemical Industries, Ltd.), and 200.0 g of 4-(2-aminoethyl)benzenesulfonamide (manufactured by Wako Pure Chemical Industries, Ltd.) were weighed, and the mixture was heated and stirred at 80° C. for 6 hours. The reaction solution thus obtained was cooled to a room temperature, and 235.2 g of a white powder precipitated therefrom was collected by filtration. It was confirmed by NMR, LC-MS and IR that the white powder thus obtained was the (a) specific diol compound [Exemplary Compound (a)-28]. FIG. 1 is an NMR chart of the diol compound (a)-28.

Synthesis Example 4

Synthesis of (A) Specific Polyurethane PU-28

In a 500-mL three-necked flask equipped with a condenser and a stirrer, 12.9 g of the (a)-28, 256.0 g of N,N-dimethylacetamide (manufactured by Wako Pure Chemical Industries, Ltd.), and 14.9 g of dimethylolpropionic acid (manufactured by Tokyo Chemical Industry Co., Ltd.) were weighed. Into the reaction solution which had been stirred at a room temperature, 5.2 g of hexamethylene diisocyanate (manufactured by Wako Pure Chemical Industries, Ltd.), 30.9 g of diphenylmethane diisocyanate (manufactured by Nippon Polyurethane Industry Co., Ltd.), and 0.38 g of NEOSTANN U-600 (manufactured by Nitto Chemical Industry Co., Ltd.) were introduced, and the mixture was stirred while heated at 80° C. for 4 hours. Subsequently, 5.0 g of methanol was added thereto to terminate the reaction. The reaction solution was introduced into 4 L of distilled water while stirring to precipitate a white polymer. The polymer was separated by filtration, washed with water, and dried in a vacuum, whereby 56.2 g of a polyurethane resin (PU-28) according to the invention was collected. It was confirmed by NMR and IR that the white powder thus obtained was the (A) specific polyurethane PU-28 (Exemplary Compound PU-28 described above). Also, the weight average molecular weight was measured using GPC (in terms of polystyrene).

Comparative Synthesis Example 1

Synthesis of (REF-4)

(1) In a three-necked flaks, 1,1,1-tris(hydroxymethyl) ethane (200 g) and 2,2-dimethoxypropane (260 g) were suspended in acetone (150 g), one droplet of concentrated sulfuric acid was added thereto at 0° C., and then the mixture was stirred for 2 hours. The temperature was changed back to a room temperature, and the mixture was stirred for 2 hours. After acetone was distilled off, a fraction obtained at 70° C. under reduced pressure (1.7 mmHg) was collected to obtain (1,4,4-trimethyl-3,5-dioxanyl)methane-1-ol (192 g).

(2) Subsequently, succinic anhydride (32 g), (1,4,4-trimethyl-3,5-dioxanyl)methane-1-ol (46.3 g) obtained in the above (1), and triethylamine (35 g) were dissolved in acetone (150 ml), and the solution was stirred for 20 hours at a room temperature. After acetone was distilled off, the residue was introduced into 3 L of a 0.5 mol/L aqueous solution of sodium hydrogen carbonate, and the mixture was stirred for 30 minutes. Subsequently, 500 mL of ethyl acetate was added thereto, to separate and collect an aqueous layer. pH of the aqueous layer thus collected was adjusted to pH of from 1 to 2 with a 1 mol/L aqueous solution of hydrochloric acid, and the aqueous layer was stirred for 2 hours at a room temperature. Furthermore, after 300 g of sodium chloride was added to this aqueous solution, 1.5 L of ethyl acetate was added thereto, and the mixture was stirred to separate and collect a layer of ethyl acetate. After anhydrous magnesium sulfate was added to the ethyl acetate solution thus collected, the mixture was filtered to distill off ethyl acetate from the liquid thus obtained, whereby compound DA-1 (30 g) was obtained.

(3) In a 500-mL three-necked flask equipped with a condenser and a stirrer, 16.5 g of DA-1 described above, 7.2 g of BLEMMER (manufactured by NOF Corporation) GLM, 30.0 g of polypropylene glycol (Mn=1000) (manufactured by Wako Pure Chemical Industries, Ltd.), and 359.0 g of N,N-dimethylacetamide (manufactured by Wako Pure Chemical Industries, Ltd.) were weighed. Into the reaction solution that had been stirred at a room temperature, 5.2 g of hexamethylene diisocyanate (manufactured by Wako Pure Chemical Industries, Ltd.), 30.9 g of diphenylmethane diisocyanate (manufactured by Nippon Polyurethane Industry Co., Ltd.), and 0.54 g of NEOSTANN U-600 (manufactured by Nitto Chemical Industry Co., Ltd.) were introduced, and the mixture was heated and stirred for 4 hours at 80° C. Subsequently, 5.0 g of methanol was added thereto to terminate the reaction. The reaction solution was introduced into 4 L of distilled water while stirring to precipitate a white polymer. The polymer was separated by filtration, washed with water, and then dried in a vacuum, whereby 82.2 g of a comparative polyurethane resin: REF-4 was collected. It was confirmed by NMR and IR that a white powder thus obtained was (REF-4: the following structure). Also, the weight average molecular weight was measured using GPC (in terms of polystyrene).

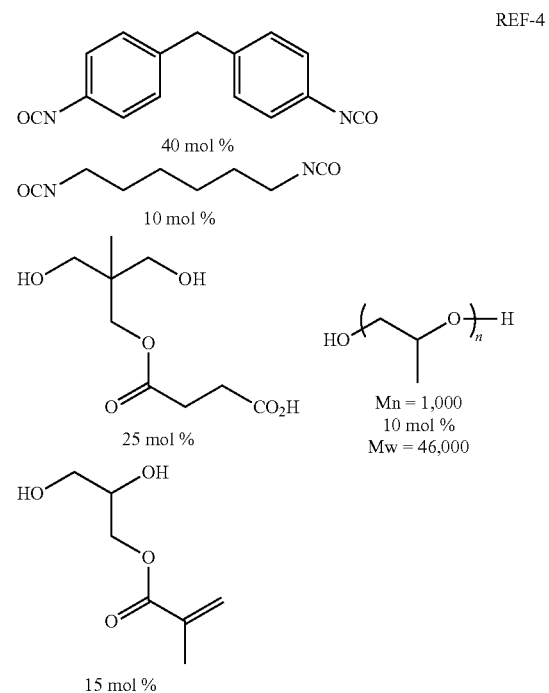

In comparison between Synthesis Examples 1 to 4 (the present invention) and Comparative Synthesis Example 1, Comparative Synthesis Example 1 requires two processes for the functionalization of a diol compound and one process for polyurethane synthesis; in contrast, when the production method of the invention is used, the synthesis of a functionalized specific diol compound is carried out by one process, and then further, one process is required for polyurethane synthesis. It is understood that simplification of the processes for the synthesis of polyurethane using a functionalized polyol is enabled.

Examples 1 to 26 and Comparative Examples 1 and 2

Production of Support

The surface of a JIS A 1050 aluminum plate having a thickness of 0.3 mm was grained with a rotating nylon brush using a pumice-water suspension liquid as a polishing agent. The surface roughness (center line average roughness) thereof was 0.5 μm. After the aluminum plate was washed with water, the aluminum plate was immersed in a solution prepared by warming a 10% aqueous solution of caustic soda to 70° C., and then the aluminum plate was etched such that the amount of dissolution of aluminum was 6 g/m³. After washing with water, the aluminum plate was immersed in a 30% aqueous solution of nitric acid for one minute to neutralize, and then the aluminum plate was sufficiently washed with water. Subsequently, electrolytic surface-roughening was carried out for 20 seconds in a 0.7% aqueous solution of nitric acid using a rectangular wave-alternating waveform-voltage of an anode time voltage of 13 volts and a cathode time voltage of 6 volts, and then the surface was washed by immersing the plate in a 20% solution of sulfuric acid at 50° C., and then the aluminum plate was washed with water. The aluminum sheet obtained after surface roughening was subjected to a porous anodic oxidation-coating film formation-treatment using a direct current in a 20% aqueous solution of sulfuric acid. Electrolysis was carried out at a current density of 5 A/dm², and a substrate having an anodic oxidation-coating film having a mass of 4.0 g/m² on the surface was produced by adjusting the electrolysis time. The substrate was treated in a steam chamber saturated at 100° C. and 1 atom for 10 seconds to prepare a substrate (b) having a pore sealing ratio of 60%. After the substrate (b) was treated with a 2.5 mass % aqueous solution of sodium silicate for 10 seconds at 30° C. to perform surface hydrophilization, the following undercoat liquid 1 was applied thereon, the coating film was dried at 80° C. for 15 seconds, whereby a support for planographic printing plate [A] was obtained. The coating amount of the coating film after drying was 15 mg/m².

[Formation of Undercoat Intermediate Layer]

Onto the support [A] produced as described above, the following coating liquid for forming an intermediate layer was applied, and then was dried for 15 seconds at 80° C., whereby an intermediate layer was provided thereon. The coating amount after drying was 15 mg/m².

[Undercoat liquid 1]

| | |
|---|---|
| The following copolymer having a molecular weight of 28,000 | 0.5 g |
| Methanol | 100 g |
| Water | 1 g |

-continued

[Undercoat liquid 1]

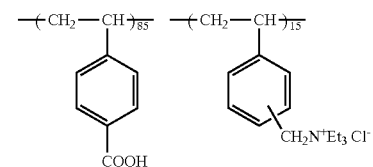

Molecular Weight 28000

[Formation of Positive Type Recording Layer]

A photosensitive liquid I having the following composition was applied to a surface of the undercoat layer of the undercoated support [A] thus obtained using a wire bar, and then the photosensitive liquid was dried in a drying oven at 150° C. for 40 seconds such that the coating amount is 1.3 g/m², whereby a lower layer was provided. After the lower layer was provided, a coating liquid II having the following composition was applied thereto with a wire bar, whereby an upper layer was provided. After the application, the upper layer was dried at 150° C. for 40 seconds to obtain a photosensitive planographic printing plate precursor for infrared laser, which has a layered-structure-positive type recording layer and has a coating amount of combined lower and upper layers of 1.7 g/m².

(Photosensitive liquid I: Coating liquid for lower layer)

| | |
|---|---|
| Binder polymer shown in Table 1 | 3.5 g |
| Dye with 6-hydroxy-β-naphthalenesulfonic acid as a counteranion of Ethyl Violet | 0.15 g |
| Infrared absorber shown in Table 1 | 0.25 g |
| Bisphenolsulfone | 0.3 g |
| Tetrahydrophthalic acid | 0.4 g |
| Fluorine-based surfactant (MEGAFACE F-780, manufactured by DIC Corporation) | 0.02 g |
| Methyl ethyl ketone | 30 g |
| Propylene glycol monomethyl ether | 15 g |
| γ-Butyrolactone | 15 g |

(Photosensitive liquid II: Coating liquid for upper layer)

| | |
|---|---|
| Novolac resin (m-cresol/p-cresol/phenol = 3/2/5, Mw 8,000) | 0.68 g |
| Infrared absorber (IR Dye (1)) | 0.045 g |
| Fluorine-based surfactant (MEGAFACE F-780, manufactured by DIC Corporation) | 0.03 g |
| Methyl ethyl ketone | 15.0 g |
| 1-Methoxy-2-propanol | 30.0 g |

The structures of the infrared absorbers used in Table 1 (in the table, described as IR Dye (1) to IR Dye (3)) and comparative polymer compounds (REF1 and REF2) are as shown below.

IR Dye (1)

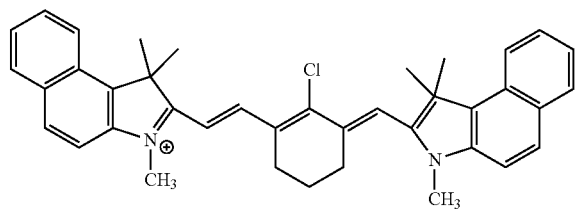

IR Dye (2)

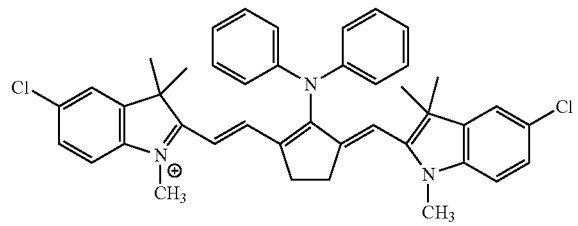

IR Dye (3)

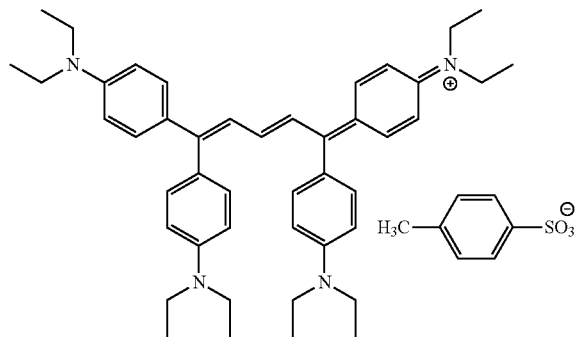

REF-1

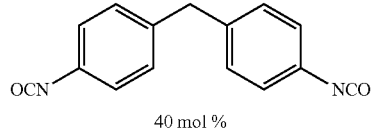

40 mol %

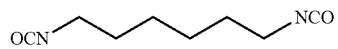

10 mol %

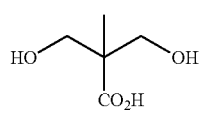

50 mol %
Mw = 42,000

REF-2

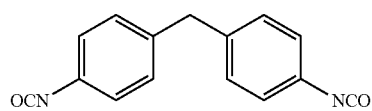

40 mol %

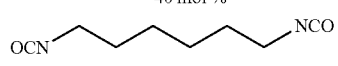

10 mol %

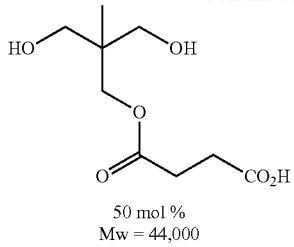

50 mol %
Mw = 44,000

The planographic printing plates thus obtained were subjected to the following evaluations.

<Evaluation of Print Durability>

Writing of a test pattern in the form of an image was conducted on the planographic printing plate precursor using TRENDSETTER (trade name) manufactured by Creo, Inc. at a beam intensity of 9 W and a drum rotation speed of 150 rpm. Subsequently, development was carried out using a PS Processor LP940H manufactured by Fuji Photo Film Co., Ltd., in which a developing liquid, DT-2 (trade name), (diluted and adjusted to have a conductivity of 43 mS/cm) manufactured by Fujifilm Corporation was placed, at a development temperature of 30° C. for a development time of 12 seconds. This was used to perform continuous printing using a printing machine, LITHRONE (trade name), manufactured by Komori Corporation. At this time, print durability was evaluated by visually measuring how many sheets could be printed while maintaining a sufficient ink density. The number of sheets that could be printed while maintaining a sufficient ink density (number of printed sheets) is hereinbelow referred to as the number of sheets durably printed. In the evaluation of print durability, print durability was described as a relative value obtained by defining the number of sheets durably printed of Comparative Example 1 as 1.0. Also, regarding the test pattern, a solid image (entire-surface image part) having a size of 2 cm×2 cm was used. The number of sheets in which blurring or discoloration had occurred in the printed part, which was measured by a visual evaluation of printed matters, was defined as the number of printed sheets (number of sheets durably printed). At this time, score "1.0" was 80,000 sheets.

<Evaluation of Development Latitude>

Writing of a test pattern in the form of an image was conducted on the planographic printing plate precursor thus obtained using TRENDSETTER (trade name) manufactured by Creo, Inc. at a beam intensity of 9 W and a drum rotation speed of 150 rpm. Subsequently, development was carried out using a PS Processor 900H (trade name) manufactured by Fujifilm Corporation, in which a developing liquid prepared by changing the amount of water to change the dilution ratio of an alkali developing liquid having the following composition, thereby changing the conductivity was placed, for a development time of 15 seconds while maintaining the liquid temperature at 30° C. At this time, the difference between the highest conductivity and the lowest conductivity of developing liquids in which there was no elution of an image part and which could perform development favorably without any contamination or coloration attributable to the poor development of a residual film of the recording layer was evaluated as the development latitude.

The results are shown in tables.

<Evaluation of Sensitivity>

Writing of a test pattern was conducted with respect to the planographic printing plate precursor thus obtained using TRENDSETTER 3244VFS manufactured by Creo, Inc., while the exposure energy was varied. Subsequently, development was carried out using an alkali developing liquid having an intermediate conductivity (mean value) between the highest conductivity and the lowest conductivity of the developing liquids in which there was no elution of an image part in the evaluation of the development latitude and which could perform development favorably without any contamination or coloration attributable to poor development of the residual film of the recording layer. The amount of exposure (beam intensity at a drum rotation speed of 160 rpm) at which a non-image part could be developed using this developing liquid, was measured and defined as sensitivity. It is evaluated that a smaller value represents higher sensitivity. The results are shown in Table 1.

<Evaluation of Developability Change>

An evaluation was carried out in the same manner as in the evaluation of sensitivity, except that the planographic printing plate precursor was stored for one hour in an environment at 25° C. and a relative humidity of 70% after exposure. The result of the evaluation of sensitivity was collected as the sensitivity immediately after exposure, and the degree in which the sensitivity decreases is defined as an indicator of developability change The results are shown in Table 1. The values in Table 1 represent sensitivity one hour after exposure, and it is evaluated that as the value is closer to the sensitivity immediately after exposure, the developability change is more favorable.

<Evaluation of Chemical Resistance>

The planographic printing plate precursors of Examples were subjected to exposure, development and printing in the same manner as in the evaluation of print durability. At this time, every time printing of 5,000 sheets was completed, a process of wiping the plate surfaces with a cleaner (manufactured by Fujifilm Corporation, MULTI CLEANER) was added, and chemical resistance was evaluated. The print durability (number of printed sheets; hereinafter, referred to as number of sheets durably printed) at this time was compared to the print durability described above (number of sheets durably printed), and the results were evaluated according to the following criteria.

AA: The number of sheets durably printed in the case where a process of wiping a plate surface with a cleaner is performed is 95% to 100% with respect to the number of sheets durably printed in the case where a process of wiping a plate surface with a cleaner is not performed.

A: The number of sheets durably printed in the case where a process of wiping a plate surface with a cleaner is performed is more than or equal to 80% and less than 95% with respect to the number of sheets durably printed in the case where a process of wiping a plate surface with a cleaner is not performed.

B: The number of sheets durably printed in the case where a process of wiping a plate surface with a cleaner is performed is more than or equal to 60% and less than 80% with respect to the number of sheets durably printed in the case where a process of wiping a plate surface with a cleaner is not performed.

C: The number of sheets durably printed in the case where a process of wiping a plate surface with a cleaner is performed is less than 60% with respect to the number of sheets durably printed in the case where a process of wiping a plate surface with a cleaner is not performed.

Even in the case where a process of wiping a plate surface with a cleaner was added, it is evaluated that a smaller change (decrease) in the number of sheets durably printed represents superior chemical resistance. The results are shown in the following Table 1.

<Model Experiment of Treatment Bath Scum>

0.1 g of a binder polymer was weighed and dissolved in 10 mL of the developing liquid (amount of the binder polymer per 1 liter, which is soluble when a planographic printing plate precursor of 20 m$^2$ is subjected to a development treatment). The occurrence of any residue in the developing liquid after storage for one week at 30° C. was visually observed, and the results were evaluated according to the following criteria.

A: The liquid is a uniform dispersion liquid.

B: Turbidity has been generated but the liquid is in a level that is not practically problematic.

C: Precipitation has been generated.

| (Developing liquid) | |
|---|---|
| D-sorbitol | 2.5 mass % |
| Sodium hydroxide | 0.85 mass % |
| Monosodium lauryl aminodipropionate (surfactant) | 0.5 mass % |
| Water | 96.15 mass % |

TABLE 1

| | Material in photosensitive liquid | | | Development latitude | | | | | | |
|---|---|---|---|---|---|---|---|---|---|---|
| | Polyurethane | IR dye | Print durability | Upper limit (mS/cm) | Lower limit (mS/cm) | Δ (mS/cm) | Sensitivity (W) | Developability change | Chemical resistance | Treatment bath scum |
| Example 1 | PU-1 | IR Dye (1) | 1.1 | 58 | 50 | 8 | 4.5 | 5.5 | A | A |
| Example 2 | PU-12 | IR Dye (1) | 1.1 | 60 | 54 | 6 | 5.0 | 6.0 | A | A |
| Example 3 | PU-14 | IR Dye (1) | 1.1 | 58 | 50 | 8 | 4.5 | 5.5 | A | A |
| Example 4 | PU-15 | IR Dye (1) | 1.1 | 58 | 50 | 8 | 4.5 | 5.5 | A | A |
| Example 5 | PU-16 | IR Dye (1) | 1.0 | 58 | 50 | 8 | 4.0 | 4.5 | AA | A |
| Example 6 | PU-17 | IR Dye (1) | 1.0 | 60 | 50 | 10 | 4.0 | 4.5 | AA | A |
| Example 7 | PU-18 | IR Dye (1) | 1.0 | 60 | 50 | 10 | 4.0 | 4.5 | AA | A |
| Example 8 | PU-19 | IR Dye (1) | 1.0 | 60 | 50 | 10 | 4.0 | 4.5 | AA | A |
| Example 9 | PU-20 | IR Dye (1) | 1.2 | 60 | 50 | 10 | 4.5 | 5.0 | AA | A |
| Example 10 | PU-21 | IR Dye (1) | 1.1 | 59 | 50 | 9 | 4.5 | 5.0 | AA | A |
| Example 11 | PU-22 | IR Dye (1) | 1.0 | 56 | 50 | 6 | 4.5 | 5.0 | AA | A |
| Example 12 | PU-23 | IR Dye (1) | 1.2 | 60 | 50 | 10 | 4.5 | 5.0 | AA | A |
| Example 13 | PU-24 | IR Dye (1) | 1.2 | 60 | 50 | 10 | 4.5 | 5.0 | AA | A |
| Example 14 | PU-25 | IR Dye (1) | 1.2 | 60 | 50 | 10 | 4.5 | 5.0 | AA | A |
| Example 15 | PU-28 | IR Dye (1) | 1.2 | 60 | 50 | 10 | 4.5 | 5.0 | AA | A |
| Example 16 | PU-29 | IR Dye (1) | 1.2 | 60 | 50 | 10 | 4.5 | 5.0 | AA | A |

TABLE 1-continued

| | Material in photosensitive liquid | | Print durability | Development latitude | | | Sensitivity (W) | Develop-ability change | Chemical resistance | Treatment bath scum |
|---|---|---|---|---|---|---|---|---|---|---|
| | Poly-urethane | IR dye | | Upper limit (mS/cm) | Lower limit (mS/cm) | Δ (mS/cm) | | | | |
| Example 17 | PU-30 | IR Dye (1) | 1.2 | 61 | 50 | 11 | 4.5 | 5.0 | AA | A |
| Example 18 | PU-31 | IR Dye (1) | 1.2 | 62 | 50 | 12 | 4.5 | 5.0 | AA | A |
| Example 19 | PU-33 | IR Dye (1) | 1.1 | 58 | 50 | 8 | 4.5 | 5.5 | A | A |
| Example 20 | PU-34 | IR Dye (1) | 1.0 | 60 | 50 | 10 | 4.5 | 5.0 | AA | A |
| Example 21 | PU-35 | IR Dye (1) | 1.0 | 60 | 50 | 10 | 4.5 | 5.0 | AA | A |
| Example 22 | PU-36 | IR Dye (1) | 1.0 | 60 | 50 | 10 | 4.5 | 5.0 | AA | A |
| Example 23 | PU-37 | IR Dye (1) | 1.2 | 63 | 50 | 13 | 4.5 | 5.0 | AA | A |
| Example 24 | PU-28 | IR Dye (2) | 1.2 | 60 | 50 | 10 | 4.5 | 5.0 | AA | A |
| Example 25 | PU-28 | IR Dye (3) | 1.2 | 60 | 50 | 10 | 4.5 | 5.0 | AA | A |
| Example 26 | PE-1 | IR Dye (1) | 0.8 | 60 | 50 | 10 | 4.5 | 5.0 | AA | A |
| Comparative Example 1 | REF-1 | IR Dye (1) | 1.0 | 54 | 50 | 4 | 4.5 | 8.0 | C | A |
| Comparative Example 2 | REF-2 | IR Dye (1) | 0.7 | 52 | 48 | 4 | 4.5 | 8.0 | C | C |

As shown in Table 1, it is understood that the planographic printing plate precursors having a recording layer in which the specific polyurethane according to the invention is used show improved development latitude, sensitivity, developability change and chemical resistance, as compared with the case of using a general polyurethane in Comparative Examples.

Furthermore, it was found that the treatment bath scum is also reduced. It is assumed that the scum in the development bath generated in Comparative Example 2 was generated because the ester group which is a linking group of the carboxylic acid group existing in the molecule of comparative polyurethane resin: REF-2 was hydrolyzed, and the carboxylic acid group which is an alkali-soluble group was eliminated from the polymer. When the specific polyurethane according to the invention was used, it is assumed that since there was no ester group between the main chain and the carboxylic acid group, but the two were linked by an amide group, a hydrolysis reaction did not occur, and therefore, the generation of scum was suppressed.

Examples 27 to 47 and Comparative Examples 3 and 4

Production of Support

A support was produced in the same manner as in Example 1.

[Formation of Undercoat Intermediate Layer]

An undercoat intermediate layer was produced in the same manner as in Example 1, except that the undercoat liquid 1 was changed to the following undercoat liquid 2.

| [Undercoat liquid 2] | |
|---|---|
| Copolymer having a molecular weight of 31,000 shown below | 0.3 g |
| Methanol | 100 g |
| Water | 1 g |

[Undercoat liquid 2]

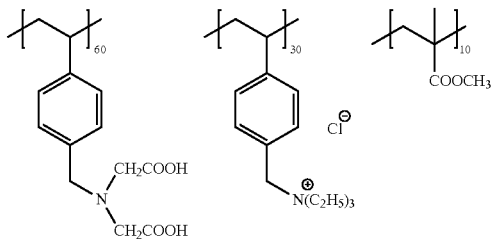

[Formation of Recording Layer]

A photosensitive liquid III having the following composition was applied to an undercoated support thus obtained with a wire bar, and then the photosensitive liquid was dried in a drying oven at 150° C. for 40 seconds such that the coating amount was adjusted to 1.3 g/m², whereby a lower layer was provided. After the lower layer was provided, a coating liquid IV having the following composition was applied thereto with a wire bar, whereby an upper layer was provided. After the application, drying was performed at 150° C. for 40 seconds, and thus a photosensitive planographic printing plate precursor for infrared laser, which has a layered-structure-positive type recording layer and has a coating amount of combined lower layer and upper layer of 1.7 g/m², was obtained.

| (Photosensitive liquid III: Coating liquid for lower layer) | |
|---|---|
| Binder polymer (B-1) | 3.5 g |
| Dye with 6-hydroxy-β-naphthalenesulfonic acid as a counteranion of Ethyl Violet | 0.15 g |
| m-, p-cresol novolac (m/p ratio = 6/4, weight average molecular weight 6000) | 0.6 g |
| Infrared absorber (IR Dye (1)) | 0.25 g |
| Bisphenolsulfone | 0.3 g |
| Tetrahydrophthalic acid | 0.4 g |
| Fluorine-based surfactant (MEGAFACE F-780, manufactured by DIC Corporation) | 0.02 g |
| Methyl ethyl ketone | 30 g |
| Propylene glycol monomethyl ether | 15 g |
| γ-Butyrolactone | 15 g |

(Photosensitive liquid IV)

| | |
|---|---|
| Novolac resin (m-cresol/p-cresol/phenol = 3/2/5, Mw 8,000) | 0.68 g |
| Binder polymer shown in Table 2 | 0.20 g |
| Infrared absorber shown in Table 2 | 0.045 g |
| Fluorine-based surfactant (MEGAFACE F-780, manufactured by DIC Corporation) | 0.03 g |
| Methyl ethyl ketone | 15.0 g |
| 1-Methoxy-2-propanol | 30.0 g |

With respect to the planographic printing plate precursor thus obtained, the evaluations were performed under the same conditions as in Example 1. The results are shown in Table 2.

TABLE 2

| | Material in photosensitive liquid | | Print durability | Development latitude | | | Sensitivity (W) | Developability change | Chemical resistance | Treatment bath scum |
|---|---|---|---|---|---|---|---|---|---|---|
| | Polyurethane | IR dye | | Upper limit (mS/cm) | Lower limit (mS/cm) | Δ (mS/cm) | | | | |
| Example 27 | PU-1 | IR Dye (1) | 1.1 | 58 | 50 | 8 | 4.5 | 5.5 | A | A |
| Example 28 | PU-2 | IR Dye (1) | 1.1 | 58 | 50 | 8 | 4.5 | 5.5 | A | A |
| Example 29 | PU-3 | IR Dye (1) | 1.1 | 58 | 50 | 8 | 4.5 | 5.5 | A | A |
| Example 30 | PU-4 | IR Dye (1) | 1.1 | 58 | 50 | 8 | 4.5 | 5.5 | A | A |
| Example 31 | PU-5 | IR Dye (1) | 1.1 | 58 | 50 | 8 | 4.5 | 5.5 | A | A |
| Example 32 | PU-6 | IR Dye (1) | 1.1 | 58 | 50 | 8 | 4.5 | 5.5 | A | A |
| Example 33 | PU-7 | IR Dye (1) | 1.1 | 58 | 50 | 8 | 4.5 | 5.5 | A | A |
| Example 34 | PU-8 | IR Dye (1) | 1.1 | 60 | 50 | 10 | 4.5 | 5.0 | AA | A |
| Example 35 | PU-9 | IR Dye (1) | 1.2 | 60 | 54 | 6 | 5.0 | 5.5 | A | A |
| Example 36 | PU-10 | IR Dye (1) | 1.2 | 60 | 54 | 6 | 5.0 | 5.5 | A | A |
| Example 37 | PU-14 | IR Dye (1) | 1.1 | 58 | 50 | 8 | 4.5 | 5.5 | A | A |
| Example 38 | PU-15 | IR Dye (1) | 1.1 | 58 | 50 | 8 | 4.5 | 5.5 | A | A |
| Example 39 | PU-28 | IR Dye (1) | 1.2 | 60 | 50 | 10 | 4.5 | 5.0 | AA | A |
| Example 40 | PU-29 | IR Dye (1) | 1.1 | 60 | 50 | 10 | 4.5 | 5.0 | AA | A |
| Example 41 | PU-30 | IR Dye (1) | 1.1 | 61 | 50 | 11 | 4.5 | 5.0 | AA | A |
| Example 42 | PU-31 | IR Dye (1) | 1.1 | 62 | 50 | 12 | 4.5 | 5.0 | AA | A |
| Example 43 | PU-32 | IR Dye (1) | 1.1 | 58 | 50 | 8 | 4.5 | 5.5 | AA | A |
| Example 44 | PU-33 | IR Dye (1) | 1.1 | 58 | 48 | 10 | 4.5 | 5.5 | AA | A |
| Example 45 | PU-37 | IR Dye (1) | 1.1 | 63 | 50 | 13 | 4.5 | 5.0 | AA | A |
| Example 46 | PU-28 | IR Dye (2) | 1.1 | 58 | 50 | 8 | 4.5 | 5.0 | AA | A |
| Example 47 | PU-28 | IR Dye (3) | 1.1 | 58 | 50 | 8 | 4.5 | 5.0 | AA | A |
| Comparative Example 3 | REF-1 | IR Dye (1) | 1.0 | 54 | 50 | 4 | 4.5 | 8.0 | C | A |
| Comparative Example 4 | REF-2 | IR Dye (1) | 0.8 | 52 | 48 | 4 | 4.5 | 8.0 | C | C |

As shown in Table 2, it is understood that the planographic printing plate precursors having a recording layer in which the specific polyurethane according to the invention was used show improved development latitude, sensitivity, developability change and chemical resistance, as compared with the case of using a general polyurethane in Comparative Examples. Furthermore, it is found that the treatment bath scum is also reduced.

Furthermore, it was confirmed from the various Examples that when the specific polyurethane according to the invention is used in the upper layer in a layered-structure-positive type recording layer, excellent effects are exhibited similarly to the case where the polyurethane is used in the lower layer.

Examples 48 to 73 and Comparative Examples 5 and 6

Production of Support

The following surface treatment was carried out using an aluminum plate (JIS A1050) having a thickness of 0.03 mm.

(a) Mechanical Surface Roughening Treatment

A mechanical surface roughening treatment was carried out by providing, to a surface of the aluminum plate, a suspension of a polishing agent (pumice) having a specific gravity of 1.12 and water as a polishing slurry liquid using a rotating roller-shaped nylon brush. The average particle diameter of the polishing agent was 30 μm, and the maximum particle diameter was 100 μm. The material of the nylon brush was 6.10 nylon, the bristle length was 45 mm, and the bristle diameter was 0.3 mm. The nylon brush was formed such that holes having a diameter of φ 300 mm were made on a cylinder made of stainless steel and the bristles of the nylon brush were transplanted densely. Three rotating brushes were used. The distance between two supporting rollers (φ 200 mm) below the brushes was 300 mm. The brush roller was pressed down until the load of the driving motor that rotated the brush was 7 kW greater than the load before the brush roller was pressed down on the aluminum plate. The rotation direction of the brush was the same as the direction of movement of the aluminum plate. The number of revolution of the brush was 200 rpm.

(b) Alkali Etching Treatment

An aluminum plate was subjected to an etching treatment by spraying with an aqueous solution of a temperature of 70° C. having a concentration of caustic soda of 2.6% by mass and a concentration of aluminum ions of 6.5% by mass, to dissolve 10 g/m² of the aluminum plate. Subsequently, washing with water by spraying was performed.

(c) Desmutting Treatment

A desmutting treatment by spraying with an aqueous solution of nitric acid having a concentration of 1% by mass at a temperature of 30° C. (containing 0.5% by mass of aluminum ions) was carried out, and thereafter, washing with water by spraying was performed. Regarding the aqueous solution of nitric acid used in the desmutting treatment, waste water from the process of performing an electrochemical surface roughening treatment using an alternating current in the aqueous solution of nitric acid described below, was used.

(d) Electrochemical Surface Roughening Treatment

An electrochemical surface roughening treatment was carried out in a continuous manner using an alternating current voltage of 60 Hz. The electrolyte liquid at this time was a 10.5 g/L aqueous solution of nitric acid (containing 5 g/L of aluminum ions and 0.007% by mass of ammonium ions), and the liquid temperature was 50° C. The electrochemical surface roughening treatment was carried out using a trapezoidal rectangular wave-alternating current having a time to which the current value reached the peak value from zero (TP) of 0.8 msec and a duty ratio of 1:1 and using a carbon electrode as a counter electrode. Ferrite was used for an auxiliary anode. A radial cell type electrolyte tank was used. The current density was 30 A/dm$^2$ as the peak value of current, and the amount of electricity was 220 C/dm$^2$ in sum total of the amounts of electricity when the aluminum plate served as an anode. To the auxiliary anode, 5% of the current flowing from the power supply was separately flown. Subsequently, washing with water by spraying was performed.

(e) Alkali Etching Treatment

An aluminum plate was subjected to an etching treatment by spraying with an aqueous solution of a temperature of 32° C. having a concentration of caustic soda of 26% by mass and a concentration of aluminum ions of 6.5% by mass, to dissolve 0.50 g/m$^2$ of the aluminum plate. A smut component primarily containing the aluminum hydroxide produced when the electrochemical surface roughening treatment was carried out using an alternating current in the previous stage, was eliminated, and the edge part of the pits produced were dissolved to smoothen the edge part. Subsequently, washing with water by spraying was performed.

(f) Desmutting Treatment

A desmutting treatment by spraying with an aqueous solution of sulfuric acid having a concentration of 15% by mass at a temperature of 30° C. (containing 4.5% by mass of aluminum ions) was carried out, and thereafter, washing with water by spraying was performed.

(g) Electrochemical Surface Roughening Treatment

An electrochemical surface roughening treatment was carried out in a continuous manner using an alternating current voltage of 60 Hz. The electrolyte liquid at this time was a 5.0 g/L aqueous solution of hydrochloric acid (containing 5 g/L of aluminum ions), and the liquid temperature was 35° C. The electrochemical surface roughening treatment was carried out using a trapezoidal rectangular wave-alternating current having a time to which the current value reached the peak value from zero (TP) of 0.8 msec and a duty ratio of 1:1 and using a carbon electrode as a counter electrode. Ferrite was used for an auxiliary anode. A radial cell type electrolyte tank was used. The current density was 25 A/dm$^2$ as the peak value of current, and the amount of electricity was 50 C/dm$^2$ in sum total of the amounts of electricity when the aluminum plate served as an anode. Subsequently, washing with water by spraying was performed.

(h) Anodic Oxidation Treatment

An anodic oxidation treatment was carried out using an anodic oxidation apparatus of a dual power-supplied electrolysis treatment method (lengths of first and second electrolyzing unit: 6 m respectively; lengths of first and second power supply unit: 3 m respectively; and lengths of first and second power supply electrode unit: 2.4 m respectively). The electrolyte liquids supplied to the first and second electrolyzing units both having a concentration of sulfuric acid of 50 g/L (containing 0.5% by mass of aluminum ions) respectively, and the temperature was 20° C. Subsequently, washing with water by spraying was carried out. The final amount of oxide coating film was 2.7 g/m$^2$.

The aluminum plate that was subjected to all of the processes (a) to (h) was defined as support [B].

The support [B] was immersed in an aqueous solution containing 4 g/L of polyvinyl phosphonic acid at 40° C. for 10 seconds, and was washed with tap water at 20° C. for 2 seconds and dried to produce a support [B] having an undercoat layer applied thereto.

The support [B] having an undercoat layer applied thereto was bar-coated with a photosensitive liquid V having the following composition, and then the support was dried in an oven at 90° C. for 60 seconds, whereby a negative type recording layer having a dry coating amount of 1.20 g/m$^2$ was formed.

| (Photosensitive liquid V) | |
|---|---|
| Binder polymer shown in Table 3 | 0.54 parts by mass |
| Compound (M-1) having an ethylenically unsaturated bond | 0.48 parts by mass |
| Radical polymerization initiator (I-1) | 0.08 parts by mass |
| Sensitizing dye shown in Table 3 | 0.06 parts by mass |
| Chain transfer agent (S-2) | 0.07 parts by mass |
| Dispersion of ε-phthalocyanine pigment [pigment: 15 parts by mass, allyl methacrylate/ methacrylic acid (80/20) copolymer as a dispersant: 10 parts by mass, cyclohexanone/ methoxypropyl acetate/1-methoxy-2-propanol = 15 parts by mass/20 parts by mass/40 parts by mass, as a solvent] | 0.40 parts by mass |
| Thermal polymerization inhibitor (N-nitrosophenylhydroxylamine aluminum salt) | 0.01 parts by mass |
| Fluorine-based surfactant (F-1) | 0.001 parts by mass |
| Polyoxyethylene-polyoxypropylene condensate (manufactured by Adeka Corporation, PLURONIC L44) | 0.04 parts by mass |
| 1-Methoxy-2-propanol | 3.5 parts by mass |
| Methyl ethyl ketone | 8.0 parts by mass |

The structures of the compounds used in the photosensitive liquid V are shown below.

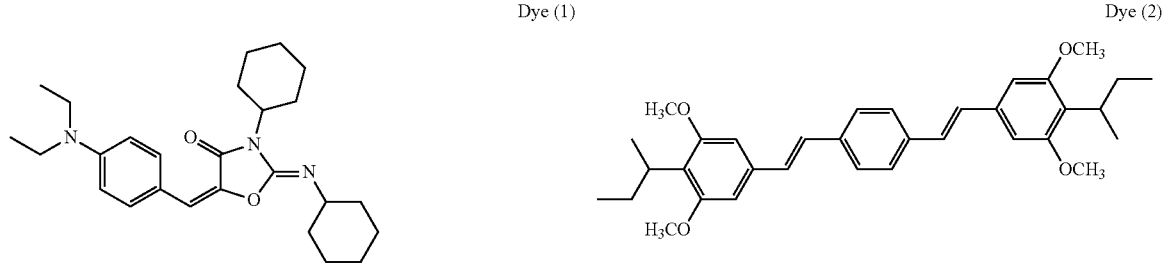

Dye (1)　　　　Dye (2)

-continued
Dye (3)
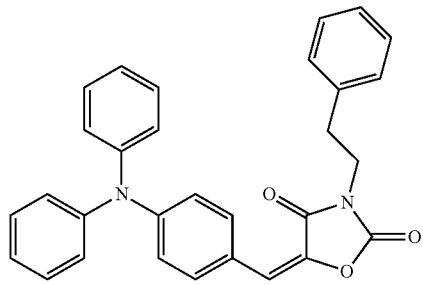
M-1
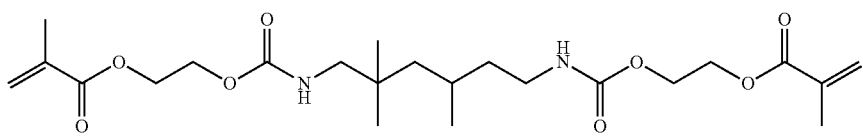
Mixture of
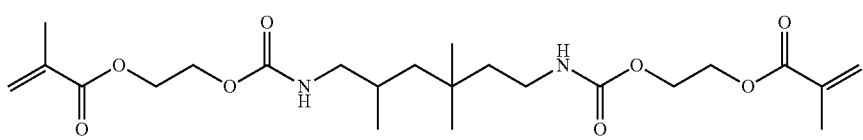
S-2
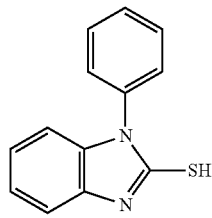
F-1
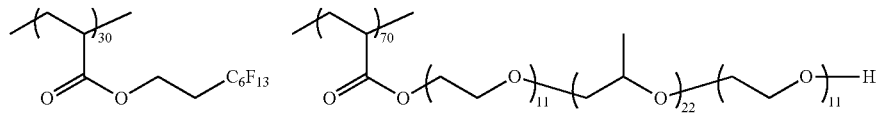
I-1
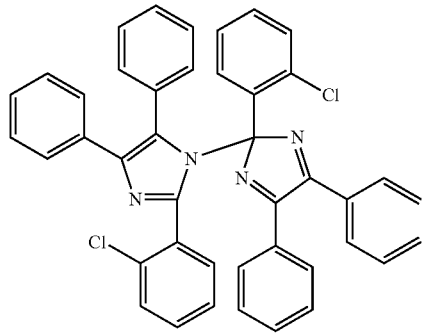
REF-3
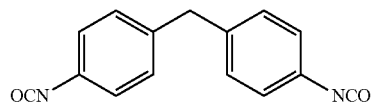
40 mol %
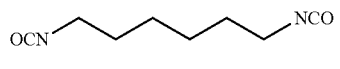
10 mol %
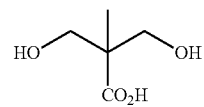
25 mol %

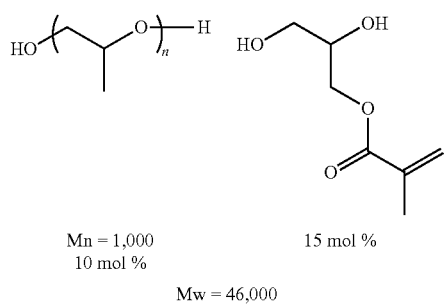

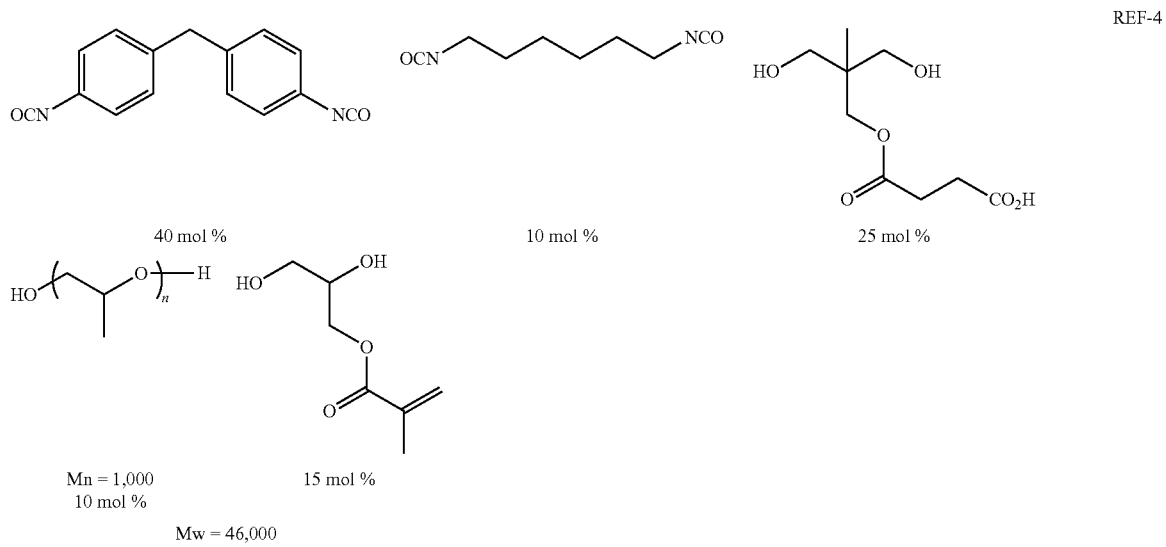

REF-4

[Formation of Protective Layer]

The negative type recording layer was bar-coated with a coating liquid for a protective layer having the following composition, and then the coating liquid was dried in an oven at 125° C. for 70 seconds to form a protective layer having a dry coating amount of 1.25 g/m².

| (Composition of coating liquid for protective layer) | |
|---|---|
| Mica dispersion liquid described below | 0.6 g |
| Sulfonic acid-modified polyvinyl alcohol (GOHSERAN CKS-50, manufactured by The Nippon Synthetic Chemical Industry Co., Ltd. (degree of saponification: 99 mol %, average degree of polymerization: 300, degree of modification: about 0.4 mol %)) poly(vinyl-pyrrolidone/vinyl acetate (1/1)) (molecular weight: 70,000) | 0.8 g 0.001 g |
| Surfactant (EMALEX 710, manufactured by Nihon Emulsion Co., Ltd.) | 0.002 g |
| Water | 13 g |

(Mica Dispersion Liquid)

32 g of synthetic mica (SOMASIF ME-100, manufactured by Co-op Chemical Co., Ltd., aspect ratio: 1000 or higher) was added to 368 g of water, and the mixture was dispersed using a homogenizer until the average particle diameter (laser scattering method) reached 0.5 μm to obtain a mica dispersion liquid.

The planographic printing plate precursor thus obtained was subjected to the following evaluations.

<Print Durability>

When the number of printed sheets is increased, the recording layer is gradually abraded, and ink-receiving property is decreased, as a result of which, the ink density of an image on the printing paper is decreased. Print durability on printing plates that had been exposed with the same exposure amount was evaluated with respect to the number of printed sheets when the ink density (reflection density) of an image formed was decreased by 0.1 compared to the ink density at the time of initiation of printing. In the evaluation of print durability, the print durability is expressed as a relative print durability which is defined on the basis of Comparative Example 1 as the reference (1.0), as follows. A higher number of the relative print durability represents higher print durability.

Relative print durability=(Print durability of target printing plate)/(print durability of reference printing plate)

<Developability>

Development was carried out at various conveyance speeds, and the cyan color density of a non-image part was measured using a Macbeth densitometer. The conveyance speed at which the cyan color density of a non-image part was equal to the cyan color density of an aluminum substrate was determined and was defined as developability. In the evaluation of developability, the developability is expressed as a relative developability which is defined on the basis of Comparative Example 1 as the reference (1.0), as follows. A higher value of relative developability represents higher developability and more favorable performance.

Relative developability=[(Conveyance speed of target precursor)/(conveyance speed of reference precursor)]

<Evaluation of Chemical Resistance>

The planographic printing plate precursors of Examples were subjected to exposure, development and printing in the same manner as in the evaluation of print durability described above. At this time, every time printing of 5,000 sheets was completed, a process of wiping the plate surfaces with a cleaner (manufactured by Fujifilm Corporation, MULTI CLEANER) was added, and chemical resistance was evaluated by a comparison with the case where the process of wiping plate surfaces with the cleaner was not carried out.

AA: The number of sheets durably printed in the case where a process of wiping a plate surface with a cleaner is performed is 95% to 100% with respect to the number of sheets durably in the case where a process of wiping a plate surface with a cleaner is not performed.

A: The number of sheets durably printed in the case where a process of wiping a plate surface with a cleaner is performed is more than or equal to 80% and less than 95% with respect to the number of sheets durably printed in the case where a process of wiping a plate surface with a cleaner is not performed.

B: The number of sheets durably printed in the case where a process of wiping a plate surface with a cleaner is performed is more than or equal to 60% and less than 80% with respect to the number of sheets durably printed in the case where a process of wiping a plate surface with a cleaner is not performed.

C: The number of sheets durably printed in the case where a process of wiping a plate surface with a cleaner is performed is less than 60% with respect to the number of sheets durably printed in the case where a process of wiping a plate surface with a cleaner is not performed.

Even in the case where a process of wiping a plate surface with a cleaner was added, it is evaluated that a smaller change in the number of sheets durably printed represents superior chemical resistance. The results are shown in the following Table 3.

<Model Experiment of Treatment Bath Scum>

0.1 g of the binder polymer used in each recording layer was weighed and dissolved in 10 mL of the developing liquid (amount of the binder polymer per 1 liter, which is soluble when a planographic printing plate precursor of 20 $m^2$ is subjected to a development treatment). The solution was stored for one week at 30° C., and the evaluation was carried out in the same manner as in Example 1.

TABLE 3

|  | Material in photosensitive liquid | | Print durability | Development | Chemical resistance | Treatment bath scum |
|---|---|---|---|---|---|---|
|  | Polyurethane | IR dye | | | | |
| Example 48 | PU-38 | Dye (1) | 1.1 | 1.2 | A | A |
| Example 49 | PU-39 | Dye (1) | 1.1 | 1.2 | A | A |
| Example 50 | PU-40 | Dye (1) | 1.1 | 1.3 | A | A |
| Example 51 | PU-41 | Dye (1) | 1.1 | 1.4 | AA | A |
| Example 52 | PU-42 | Dye (1) | 1.1 | 1.4 | AA | A |
| Example 53 | PU-43 | Dye (1) | 1.1 | 1.4 | AA | A |
| Example 54 | PU-44 | Dye (1) | 1.1 | 1.4 | AA | A |
| Example 55 | PU-45 | Dye (1) | 1.1 | 1.2 | A | A |
| Example 56 | PU-46 | Dye (1) | 1.1 | 1.2 | A | A |
| Example 57 | PU-47 | Dye (1) | 1.1 | 1.2 | A | A |
| Example 58 | PU-48 | Dye (1) | 1.1 | 1.2 | A | A |
| Example 59 | PU-49 | Dye (1) | 1.1 | 1.2 | A | A |
| Example 60 | PU-50 | Dye (1) | 1.1 | 1.2 | A | A |
| Example 61 | PU-51 | Dye (1) | 1.1 | 1.2 | A | A |
| Example 62 | PU-52 | Dye (1) | 1.3 | 1.1 | AA | A |
| Example 63 | PU-53 | Dye (1) | 1.3 | 1.1 | AA | A |
| Example 64 | PU-54 | Dye (1) | 1.3 | 1.1 | AA | A |
| Example 65 | PU-55 | Dye (1) | 1.3 | 1.1 | AA | A |
| Example 66 | PU-56 | Dye (1) | 1.3 | 1.1 | AA | A |
| Example 67 | PU-57 | Dye (1) | 1.3 | 1.1 | AA | A |
| Example 68 | PU-58 | Dye (1) | 1.2 | 1.1 | AA | A |
| Example 69 | PU-59 | Dye (1) | 1.1 | 1.1 | AA | A |
| Example 70 | PU-60 | Dye (1) | 1.2 | 1.1 | A | A |
| Example 71 | PU-61 | Dye (1) | 1.2 | 1.1 | AA | A |
| Example 72 | PU-39 | Dye (2) | 1.4 | 1.1 | A | A |
| Example 73 | PU-39 | Dye (3) | 1.2 | 1.1 | A | A |
| Comparative Example 5 | REF-3 | Dye (1) | 1.0 | 1.0 | C | A |
| Comparative Example 6 | REF-4 | Dye (1) | 0.7 | 1.1 | C | C |

As shown in Table 3, it is understood that the planographic printing plate precursors having a recording layer which contains the specific polyurethane according to the invention show improved print durability, developability and chemical resistance, as compared with the case of using a general polyurethane in Comparative Examples. Although it was unexpectedly found that print durability is improved, the reason for this is assumed that since an interaction between the polymer having phosphoric acid groups that is used in the undercoat layer and the specific polyurethane contained in the recording layer was formed, adhesiveness between the support and the recording layer was intensified. Also, it is clearly shown that the treatment bath scum is also reduced.

Examples 74 to 93 and Comparative Examples 7 and 8

Production of Support

A support was produced in the same manner as in Example 48, and subsequently, an undercoat intermediate layer was formed to obtain a support [B] having an undercoat layer.

[Production of Recording Layer]

The support [B] having an undercoat layer applied thereon was bar-coated with a photosensitive liquid VI having the following composition, and then the photosensitive liquid was dried in an oven at 100° C. for 60 seconds, whereby a negative type recording layer having a dry coating amount of 1.40 g/m² was formed.

| (Photosensitive liquid VI) | |
|---|---|
| Infrared absorber (IR-1) | 0.030 parts by mass |
| Polymerization initiator A (S-1) | 0.069 parts by mass |
| Polymerization initiator B (I-1) | 0.094 parts by mass |
| Mercapto compound (E-1) | 0.020 parts by mass |
| Ethylenically unsaturated compound (M-2) (trade name: A-BPE-4, Shin-Nakamura Chemical Co., Ltd.) | 0.425 parts by mass |
| Binder polymer shown in Table 4 | 0.623 parts by mass |
| Additive (T-1) | 0.080 parts by mass |
| Polymerization inhibitor (Q-1) | 0.0012 parts by mass |
| Ethyl Violet (EV-1) | 0.021 parts by mass |
| Fluorine-based surfactant (F-1) (MEGAFACE F-780-F, DIC Corporation; methyl isobutyl ketone (MIBK) 30 mass % solution) | 0.0081 parts by mass |
| Methyl ethyl ketone | 5.886 parts by mass |
| Methanol | 2.733 parts by mass |
| 1-Methoxy-2-propanol | 5.886 parts by mass |

The structures of the infrared absorber (IR-1), polymerization initiator A (S-1), polymerization inhibitor B (I-1), mercapto compound (E-1), polymerizable compound (M-1), additive (T-1), polymerization inhibitor (Q-1), and Ethyl Violet (EV-1) used in the photosensitive liquid VI are shown below.

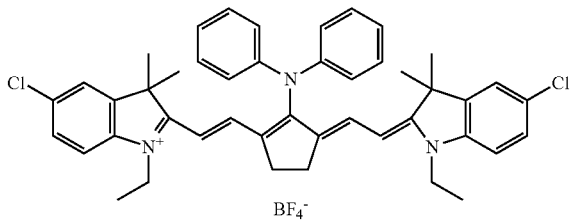

(IR-1)

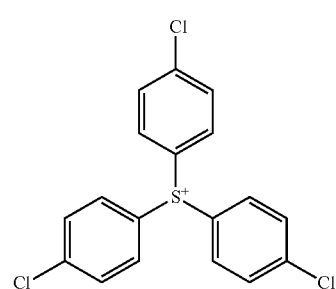

(S-1)

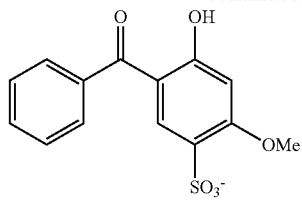

-continued (1-1)

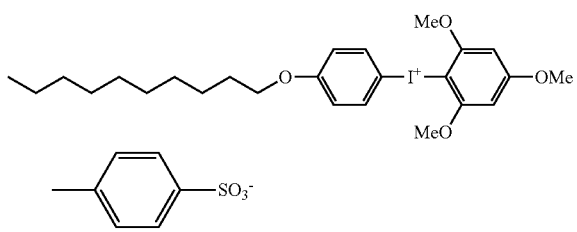

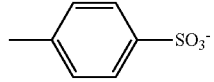

(E-1)

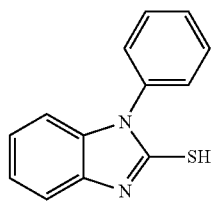

(T-1)

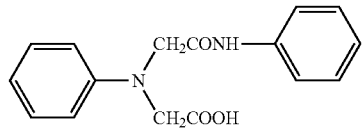

(Q-1)

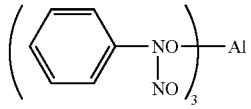

(EV-1)

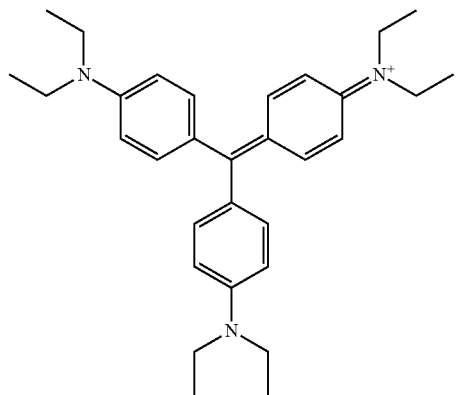

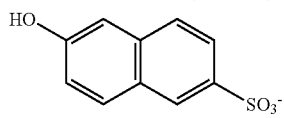

[Formation of Protective Layer]

A protective layer was formed on a surface of the negative type recording layer formed as described above, by the same method as in Example 48.

The results of performing evaluations under the same conditions as in Example 48 are shown in Table 4.

TABLE 4

|  | Material in photosensitive liquid | | Print durability | Development | Chemical resistance | Treatment bath scum |
|---|---|---|---|---|---|---|
|  | Polyurethane | IR dye | | | | |
| Example 74 | PU-38 | Dye (1) | 1.0 | 1.1 | A | A |
| Example 75 | PU-39 | Dye (1) | 1.0 | 1.1 | A | A |
| Example 76 | PU-40 | Dye (1) | 1.0 | 1.2 | A | A |
| Example 77 | PU-41 | Dye (1) | 1.0 | 1.3 | AA | A |
| Example 78 | PU-42 | Dye (1) | 1.0 | 1.3 | AA | A |
| Example 79 | PU-43 | Dye (1) | 1.0 | 1.3 | AA | A |
| Example 80 | PU-44 | Dye (1) | 1.0 | 1.3 | AA | A |
| Example 81 | PU-52 | Dye (1) | 1.2 | 1.0 | AA | A |
| Example 82 | PU-53 | Dye (1) | 1.2 | 1.0 | AA | A |
| Example 83 | PU-54 | Dye (1) | 1.2 | 1.0 | AA | A |
| Example 84 | PU-55 | Dye (1) | 1.2 | 1.0 | AA | A |
| Example 85 | PU-56 | Dye (1) | 1.2 | 1.0 | AA | A |
| Example 86 | PU-57 | Dye (1) | 1.2 | 1.0 | AA | A |
| Example 87 | PU-58 | Dye (1) | 1.1 | 1.0 | AA | A |
| Example 88 | PU-59 | Dye (1) | 1.0 | 1.0 | AA | A |
| Example 89 | PU-60 | Dye (1) | 1.1 | 1.0 | A | A |
| Example 90 | PU-61 | Dye (1) | 1.1 | 1.0 | AA | A |
| Example 91 | PU-39 | Dye (2) | 1.3 | 1.0 | A | A |
| Example 92 | PU-39 | Dye (3) | 1.1 | 1.0 | A | A |
| Example 93 | PE-1 | Dye (1) | 0.8 | 1.0 | AA | A |
| Comparative Example 7 | REF-3 | Dye (1) | 1.0 | 1.0 | C | A |
| Comparative Example 8 | REF-4 | Dye (1) | 0.7 | 1.0 | C | C |

As shown in Table 4, it is understood that the planographic printing plate precursors having a recording layer which contains the specific polyurethane according to the invention show improved print durability, developability and chemical resistance, as compared with the case of using a general polyurethane in Comparative Examples. Furthermore, it is understood that print durability is unexpectedly improved as well as Example 48 and the like. Also, it iss clearly shown that the treatment bath scum is also reduced.

The disclosure of Japanese Patent Application No. 2011-164778 is incorporated herein by reference. All publications, patent applications, and technical standards mentioned in this specification are incorporated herein by reference to the same extent as if each individual publication, patent application, or technical standard was specifically and individually indicated to be incorporated by reference.

The invention claimed is:

1. A photosensitive composition comprising at least one polymer compound selected from the group consisting of a polyurethane obtained by reacting a diol component including a compound represented by the following Formula (II) with a polyisocyanate component and a polyester obtained by reacting a diol component including a compound represented by the following Formula (II) with a polycarboxylic acid component:

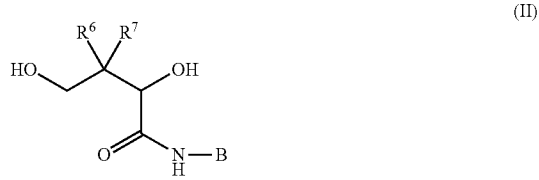

(II)

wherein, in Formula (II), B represents a monovalent organic group; and each of $R^6$ and $R^7$ independently represents a hydrogen atom or an alkyl group.

2. The photosensitive composition according to claim 1, wherein B in Formula (II) is a monovalent organic group including at least one functional group selected from the group consisting of a halogen atom, an amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group and a phosphonate group.

3. The photosensitive composition according to claim 1, further comprising at least one compound selected from the group consisting of a polymerizable compound and a crosslinkable compound, and at least one compound selected from the group consisting of a polymerization initiator and an acid generator, the photosensitive composition being a negative type photosensitive composition.

4. The photosensitive composition according to claim 1, further comprising an alkali-soluble resin, and a compound which forms an interaction with the alkali-soluble resin so as to enable suppression of alkali solubility of the alkali-soluble resin, the photosensitive composition being a positive type photosensitive composition.

5. A planographic printing plate precursor comprising a recording layer including the photosensitive composition according to claim 1, on a support.

* * * * *